United States Patent
Puzella et al.

(10) Patent No.: US 9,172,145 B2
(45) Date of Patent: Oct. 27, 2015

(54) TRANSMIT/RECEIVE DAUGHTER CARD WITH INTEGRAL CIRCULATOR

(71) Applicant: Raytheon Company, Waltham, MA (US)

(72) Inventors: Angelo M. Puzella, Marlborough, MA (US); Donald A. Bozza, Billerica, MA (US); James A. Robbins, Merrimac, MA (US); John B. Francis, Littleton, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 14/505,980

(22) Filed: Oct. 3, 2014

(65) Prior Publication Data

US 2015/0015453 A1  Jan. 15, 2015

Related U.S. Application Data

(60) Continuation-in-part of application No. 13/295,437, filed on Nov. 14, 2011, now Pat. No. 9,019,166, which is a continuation-in-part of application No. 12/484,626, filed on Jun. 15, 2009, now Pat. No.
(Continued)

(51) Int. Cl.
*H01Q 21/00* (2006.01)
*H01P 1/38* (2006.01)
*H05K 1/02* (2006.01)
(Continued)

(52) U.S. Cl.
CPC ............. *H01Q 21/0025* (2013.01); *H01P 1/38* (2013.01); *H01Q 1/02* (2013.01); *H01Q 9/0414* (2013.01); *H01Q 21/00* (2013.01); *H01Q 21/0087* (2013.01); *H01Q 21/065* (2013.01); *H05K 1/0206* (2013.01); *H05K 1/0207* (2013.01)

(58) Field of Classification Search
CPC .................................................. H01Q 21/0025
USPC .......................................... 343/700 MS, 853
See application file for complete search history.

(56) References Cited

U.S. PATENT DOCUMENTS 3,091,743 A  5/1963  Wilkinson
3,665,480 A  5/1972  Fassett
(Continued)

FOREIGN PATENT DOCUMENTS

EP  0 481 417 A  4/1992
EP  0 702 424  3/1996
(Continued)

OTHER PUBLICATIONS

Carter, "'Fuzz Button' interconnects and microwave and mm-wave frequencies;" IEEE Seminar, London, UK; Mar. 1-7, 2000; 7 pages.
(Continued)

*Primary Examiner* — Dieu H Duong
(74) *Attorney, Agent, or Firm* — Daly, Crowley, Mofford & Durkee, LLP

(57) ABSTRACT

A mixed-signal, multilayer printed wiring board fabricated in a single lamination step is described. The PWB includes one or more radio frequency (RF) interconnects between different circuit layers on different circuit boards which make up the PWB. The PWB includes a number of unit cells with radiating elements and an RF cage disposed around each unit cell to isolate the unit cell. A plurality of flip-chip circuits are disposed on an external surface of the PWB and a heat sink can be disposed over the flip chip components.

20 Claims, 29 Drawing Sheets

Related U.S. Application Data 8,279,131, application No. 14/505,980, which is a continuation-in-part of application No. 12/694,450, filed on Jan. 27, 2010, which is a division of application No. 11/558,126, filed on Nov. 9, 2006, now Pat. No. 7,671,696, which is a continuation of application No. 11/533,848, filed on Sep. 21, 2006, now Pat. No. 7,348,932.

(51) Int. Cl.
  *H01Q 1/02* (2006.01)
  *H01Q 9/04* (2006.01)
  *H01Q 21/06* (2006.01)

(56) References Cited

U.S. PATENT DOCUMENTS

| | | | |
|---|---|---|---|
| 4,489,363 A | 12/1984 | Goldberg |
| 4,527,165 A | 7/1985 | deRonde |
| 4,698,663 A | 10/1987 | Sugimoto et al. |
| 4,706,094 A | 11/1987 | Kubick |
| 4,751,513 A | 6/1988 | Daryoush et al. |
| 4,835,658 A | 5/1989 | Bonnefoy |
| 5,005,019 A | 4/1991 | Zaghloul et al. |
| 5,055,852 A | 10/1991 | Dusseux et al. |
| 5,099,254 A | 3/1992 | Tsukii et al. |
| 5,276,455 A | 1/1994 | Fitzsimmons et al. |
| 5,398,010 A | 3/1995 | Klebe |
| 5,400,040 A | 3/1995 | Lane et al. |
| 5,404,148 A | 4/1995 | Zwarts |
| 5,451,969 A | 9/1995 | Toth et al. |
| 5,459,474 A | 10/1995 | Mattioli et al. |
| 5,488,380 A | 1/1996 | Harvey et al. |
| 5,493,305 A | 2/1996 | Wooldridge et al. |
| 5,563,613 A | 10/1996 | Schroeder et al. |
| 5,592,363 A | 1/1997 | Atarashi et al. |
| 5,646,826 A | 7/1997 | Katchmar |
| 5,675,345 A | 10/1997 | Pozgay et al. |
| 5,724,048 A | 3/1998 | Remondiere |
| 5,786,792 A | 7/1998 | Bellus et al. |
| 5,796,582 A | 8/1998 | Katchmar |
| 5,854,607 A | 12/1998 | Kinghorn |
| 5,907,304 A | 5/1999 | Wilson et al. |
| 6,011,507 A | 1/2000 | Curran et al. |
| 6,034,633 A | 3/2000 | Cassen et al. |
| 6,037,903 A | 3/2000 | Lange et al. |
| 6,061,027 A | 5/2000 | Legay et al. |
| 6,078,289 A | 6/2000 | Manoogian et al. |
| 6,087,988 A | 7/2000 | Pozgay |
| 6,091,373 A | 7/2000 | Raguenet |
| 6,104,343 A | 8/2000 | Brookner et al. |
| 6,127,985 A | 10/2000 | Guler |
| 6,166,705 A | 12/2000 | Mast et al. |
| 6,181,280 B1 | 1/2001 | Kadambi et al. |
| 6,184,832 B1 | 2/2001 | Geyh et al. |
| 6,208,316 B1 | 3/2001 | Cahill |
| 6,211,824 B1 | 4/2001 | Holden et al. |
| 6,218,214 B1 | 4/2001 | Panchou et al. |
| 6,222,493 B1 | 4/2001 | Caille et al. |
| 6,225,695 B1 | 5/2001 | Chia et al. |
| 6,297,775 B1 | 10/2001 | Haws et al. |
| 6,388,620 B1 | 5/2002 | Bhattacharyya |
| 6,392,890 B1 | 5/2002 | Katchmar |
| 6,424,313 B1 | 7/2002 | Navarro et al. |
| 6,480,167 B2 | 11/2002 | Matthews |
| 6,483,705 B2 | 11/2002 | Snyder et al. |
| 6,580,402 B2 | 6/2003 | Navarro et al. |
| 6,611,180 B1 | 8/2003 | Puzella et al. |
| 6,621,470 B1 | 9/2003 | Boeringer et al. |
| 6,624,787 B2 | 9/2003 | Puzella et al. |
| 6,661,376 B2 | 12/2003 | Maceo et al. |
| 6,670,930 B2 | 12/2003 | Navarro |
| 6,686,885 B1 | 2/2004 | Barkdoll et al. |
| 6,703,976 B2 | 3/2004 | Jacomb-Hood et al. |
| 6,711,814 B2 | 3/2004 | Barr et al. |
| 6,731,189 B2 | 5/2004 | Puzella et al. |
| 6,756,684 B2 | 6/2004 | Huang |
| 6,856,210 B2 | 2/2005 | Zhu et al. |
| 6,900,765 B2 | 5/2005 | Navarro et al. |
| 6,943,330 B2 | 9/2005 | Ring |
| 6,961,248 B2 | 11/2005 | Vincent et al. |
| 6,995,322 B2 | 2/2006 | Chan et al. |
| 7,030,712 B2 | 4/2006 | Brunette et al. |
| 7,045,440 B2 | 5/2006 | Huff et al. |
| 7,061,446 B1 | 6/2006 | Short, Jr. et al. |
| 7,129,908 B2 | 10/2006 | Edward et al. |
| 7,132,990 B2 | 11/2006 | Stenger et al. |
| 7,180,745 B2 | 2/2007 | Mandel et al. |
| 7,187,342 B2 | 3/2007 | Heisen et al. |
| 7,298,235 B2 | 11/2007 | Hauhe et al. |
| 7,348,932 B1 | 3/2008 | Puzella et al. |
| 7,417,598 B2 | 8/2008 | Navarro et al. |
| 7,436,210 B2 | 10/2008 | Venkata et al. |
| 7,443,354 B2 | 10/2008 | Navarro et al. |
| 7,444,737 B2 | 11/2008 | Worl |
| 7,489,283 B2 | 2/2009 | Ingram et al. |
| 7,508,338 B2 | 3/2009 | Pluymers et al. |
| 7,579,997 B2 | 8/2009 | Navarro et al. |
| 7,597,534 B2 | 10/2009 | Hopkins |
| 7,671,696 B1 | 3/2010 | Puzella et al. |
| 7,884,768 B2 | 2/2011 | Navarro et al. |
| 7,893,867 B2 | 2/2011 | Navarro |
| 2002/0051342 A1 | 5/2002 | Kanada |
| 2003/0067410 A1 | 4/2003 | Puzella et al. |
| 2005/0110681 A1 | 5/2005 | Londre |
| 2005/0151215 A1 | 7/2005 | Hauhe et al. |
| 2005/0161753 A1 | 7/2005 | Huff et al. |
| 2006/0268518 A1 | 11/2006 | Edward et al. |
| 2007/0030681 A1 | 2/2007 | Farrell et al. |
| 2007/0152882 A1 | 7/2007 | Hash et al. |
| 2008/0074324 A1 | 3/2008 | Puzella et al. |
| 2008/0106467 A1 | 5/2008 | Navarro et al. |
| 2008/0106482 A1 | 5/2008 | Cherrette et al. |
| 2008/0150832 A1 | 6/2008 | Ingram et al. |
| 2008/0316139 A1 | 12/2008 | Blaser et al. |
| 2009/0315797 A1 | 12/2009 | Rofougaran |

FOREIGN PATENT DOCUMENTS

| | | |
|---|---|---|
| EP | 1 764 863 A1 | 3/2007 |
| EP | 1 436 859 B1 | 8/2007 |
| EP | 1 978 597 A1 | 10/2008 |
| JP | 61224504 | 10/1986 |
| JP | 4-122107 A | 4/1992 |
| JP | 2006-097710 | 4/1994 |
| JP | 2007-21215 | 8/1995 |
| JP | 8-97633 | 4/1996 |
| JP | 11-340724 | 12/1999 |
| JP | 2000-138525 A | 5/2000 |
| JP | 2001-044714 | 2/2001 |
| JP | 2002-335116 | 11/2002 |
| JP | 2003-179429 A | 6/2003 |
| JP | 2004-515610 A | 5/2004 |
| JP | 2005 505963 | 2/2005 |
| JP | 3798959 B2 | 7/2006 |
| JP | 2007-504749 | 3/2007 |
| JP | 2009-224380 A | 10/2009 |
| JP | 2010-507929 A | 3/2010 |
| KR | 1020010079872 A | 8/2001 |
| WO | WO 98/26642 | 6/1998 |
| WO | WO 99/66594 | 12/1999 |
| WO | WO 01/06821 A1 | 1/2001 |
| WO | WO 01/20720 A1 | 3/2001 |
| WO | WO 01/033927 A1 | 5/2001 |
| WO | WO 01/41257 A1 | 6/2001 |
| WO | WO 03/030301 A1 | 4/2003 |
| WO | WO 2005/025001 | 3/2005 |
| WO | WO 2007/136941 A2 | 11/2007 |
| WO | WO 2007/136941 A3 | 11/2007 |
| WO | WO 2008/010851 A2 | 1/2008 |

(56) References Cited

FOREIGN PATENT DOCUMENTS

| WO | WO 2008/010851 A3 | 1/2008 |
| --- | --- | --- |
| WO | WO 2008/036469 | 3/2008 |
| WO | WO 2008/036469 A1 | 3/2008 |

OTHER PUBLICATIONS

Decision of Rejection dated Jul. 30, 2008 from KR Pat. App. No. 10-2004-7003900.
Div. Application (with translation of amended claims) as filed on Dec. 1, 2008 and assigned App. No. 10-2008-7029396.
EP Search Report for 06021905.2; dated Feb. 9, 2007; 8 pages.
European Office Action dated Oct. 18, 2007 from EPO Pat. App. No. 06021905.2.
European Office Action dated Feb. 18, 2010 from EPO Pat. App. No. 06021905.2.
European Office Action dated Nov. 3, 2006 from EP Pat. App. No. 02800372.1.
International Preliminary Report on Patentability of the ISA for PCT/US2010/026861 dated Oct. 6, 2011.
Japanese Office Action dated Feb. 15, 2008 from JP Pat. App. No. 2003-533378.
Japanese Office Action dated Feb. 18, 2009 from JP Pat. App. No. 2003-533378.
Japanese Office Action dated Mar. 7, 2007 from JP Pat. App. No. 2003-533378.
Jerinic et al.; "X-Band "Tile" Array for Mobil Radar," Raytheon Company publication; Spring 2003; 4 pages.
Korean Office Action dated Oct. 31, 2007 from KR Pat. App. No. 10-2004-7003900.
Korean Office Action dated Nov. 27, 2009 from KR Pat. App. No. 10-2008-7029396.
Korean Office Action dated Feb. 25, 2009 from KR Pat. App. No. 10-2008-7029396.
Marsh et al.; "5.4 Watt GaAs MESFET MMIC for Phased Array Radar Systems;" 1997 Workshop on High Performance Electron Devices for Microwave and Optoelectronic Applications, Nov. 24-25, 1997; pp. 169-174.
Notice of Allowance dated Feb. 2, 2007 from EP Pat. App. No. 02800372.1.
Notice of Allowance dated Nov. 3, 2010 from U.S. Appl. No. 12/482,061.
Notice of Trial Decision dated dated Mar. 23, 2010 from KR Pat. App. No. 10-2004-7003900.
Office Action dated Jun. 11, 2010 from U.S. Appl. No. 12/694,450.
Office Action dated Mar. 23, 2011 from U.S. Appl. No. 12/694,450.
PCT International Preliminary Examination Report and Written Opinion of the ISA for PCT/US2002/30677 dated Nov. 27, 2003; 10 pages.
PCT International Preliminary Examination Report and Written Opinion of the ISA for PCT/US2007/074795 dated Apr. 2, 2009; 7 pages.
PCT Search Report of the ISA for PCT/US2007/074795 dated Dec. 19, 2007; 5 pages.
PCT Search Report of the ISA for PCT/US2010/026861 dated Jun. 18, 2010; 6 pages.
PCT Search Report of the ISA for PCT/US2010/049261 dated Feb. 7, 2011 Written Opinion of the ISA for PCT/US2010/049261 dated Feb. 7, 2011.
PCT Written Opinion of the ISA for PCT/US2007/074795 dated Dec. 19, 2007; 5 pages.
PCT Written Opinion of the ISA for PCT/US2010/026861 dated June 18, 2010; 5 pages.
Puzella et al.; "Digital Subarray for Large Apertures;" slide presentation; Raytheon Company publication; Spring 2003; pp. 1-22.
Puzella et al.; "Radio Frequency Interconnect Circuits and Techniques;" U.S. Appl. No. 11/558,126, filed Nov. 9, 2006; 57 pages.
Response to European Office Action dated Oct. 18, 2007 filed in the EPO on Aug. 11, 2008 from EP Pat. App. No. 06021905.2.
Response to European Office Action dated Mar. 19, 2009 filed in the EPO on Nov. 19, 2009 from EP Pat. App. No. 06021905.2.
Response to European Office Action filed Jan. 12, 2007 from EP Pat. App. No. 02800372.1.
Response to Japanese Office Action filed Jul. 5, 2007 from JP App. No. 2003-533378.
Response to Japanese Office Action filed Jun. 19, 2009 from App JP App. No. 2003-533378.
Response to Korean Office Action filed March. 26, 2008 from KR Pat. App. No. 10-2004-7003900.
Response to Office Action of Dec. 1, 2010 from U.S. Appl. No. 12/694,450 dated Jan. 25, 2011.
Response to Office Action of Jun. 11, 2010 from U.S. Appl. No. 12/694,450 dated Sep. 21, 2010.
Office Action dated Apr. 19, 2013; for JP Pat. Appl. No. 2012-502088, 5 pages.
PCT Notification of Transmittal of the International Search Report and the Written Opinion of the International Searching Authority, or the Declaration, PCT/US2012/062542, date of mailing Dec. 14, 2012, 4 pages.
PCT Written Opinion of the International Searching Authority, PCT/US2012/062542, date of mailing Dec. 14, 2012, 6 pages.
PCT Communication in Cases for Which No Other Form is Applicable, date of mailing Jan. 21, 2013, 1 page.
PCT Written Opinion of the International Searching Authority, PCT/US2012/062542, Jan. 21, 2013, 2 pages.
EP Response to the Communication pursuant to Rule 161(1) and 162 EPC, filed on May 24, 2012, 30 pages.
Response to Office Action from Japanese Patent Office dated Apr. 19, 2013 as filed on Jul. 19, 2013 for Application No. 2012-502088.
Examiner's Report dated Jul. 15, 2013 from Canadian Patent Office for Application No. 2,753,518.
Response to Examiner's Report dated Jul. 15, 2013 from Canadian Patent Office as filed on Dec. 20, 2013 for Application No. 2,753,518.
EPO Notice on Intention to Grant dated Feb. 28, 2013 for Application No. 10 713 384.5
EPO Response to Notice of Intention to Grant dated Feb. 28, 2013 as filed on Jun. 28, 2013 for Application No. 10 713 384.5.
Allowance Decision of Examination dated Dec. 16, 2013 from Taiwanese Patent Office for Application No. 099107808.
Allowance Report dated Aug. 12, 2013 from Japanese Patent Office for Application No. 2012-502088.
Office Action and Translation dated Aug. 12, 2013.
Response to Office Action filed on Oct. 18, 2013.
Office Action dated Jan. 9, 2014 for CA Pat. Appl. No. 2,663,800, 3 pages.
Rule 70 Communication dated Aug. 1, 2011 and Response thereto as filed on Oct. 26, 2011 for European Application No. 10188251.2
EPO Office Action dated Dec. 6, 2011 and Response thereto as filed on Feb. 23, 2012 for European Application No. 10188251.2
Notice of Allowance dated May 6, 2014 for European Application. No. 10188251.2
Allowance Report dated Mar. 30, 2012 for Japanese Application No. 2009-529288.
Office Action dated Dec. 6, 2011 for Japanese Application No. 2009-529288 and Response thereto as filed on Mar. 8, 2012.
Examination Report dated Aug. 25, 2010 for Australian Application No. 2007297507 and Response thereto as filed on Sep. 15, 2011.
Response to Examiner's Report dated Jan. 9, 2014 as filed on Jul. 8, 2014 for Canadian Application No. 2633800.
Examination Report dated Mar. 13, 2013 for Australian Application No. 2010229122 and Response thereto as filed on Dec. 19, 2013.
Notice of Allowance dated Dec. 5, 2014 corresponding to U.S. Appl. No. 12/694,450; 9 Pages.
Response to Canadian Examination Report dated Aug. 4, 2014 corresponding to Pat. Appl. No. 2,663,800; Response Filed on Jan. 16, 2015; 4 Pages.
Notice of Allowance dated Jan. 21, 2015 corresponding to U.S. Appl. No. 13/295,437; 11 Pages.
Australian Examination Report dated Jan. 12, 2015 corresponding to Pat. Appl. No. 2012340002; 3 Pages.
Appeal Brief dated Nov. 17, 2011 corresponding to U.S. Appl. No. 12/694,450; 112 Pages.

(56) References Cited

OTHER PUBLICATIONS

Examiner's Answer to Appeal Brief dated Jan. 20, 2012 corresponding to U.S. Appl. No. 12/694,450; 10 Pages.

Reply Brief in Response to the Examiner's Answer dated Jan. 20, 2012 corresponding to U.S. Appl. No. 12/694,450; Reply Brief filed Mar. 20, 2012; 3 Pages.

Decision on Appeal dated Sep. 3, 2014 corresponding to U.S. Appl. No. 12/694,450; 8 Pages.

Taiwan Office Action (w/English Translation) dated Feb. 11, 2015 corresponding to Taiwan Patent Appl. No. 101141364; 15 Pages.

Response to Examination Report dated Oct. 17, 2014 from the Patent Office of the Cooperation Council for the Arab States of the Gulf corresponding to GCC Patent Appl. No. GC 2010-15500; Response filed on Jan. 4, 2015; 2 Pages.

Israeli Office Action dated Apr. 1, 2015 with English Claims; for Israeli Pat. App. No. 214771; 6 pages.

Taiwanese Response with English Claims flied on May 6, 2015 to an Office Action dated Feb. 11, 2015; for Taiwanese Pat. App. No. 101141364; 7 pages.

Japanese Office Action (with English Translation) dated Jun. 30, 2015 corresponding to Japanese Patent Application No. 2014-541098; 9 Pages.

Taiwan Allowance Decision dated Jul. 21, 2015 corresponding to Taiwan Application No. 101141364; 5 Pages.

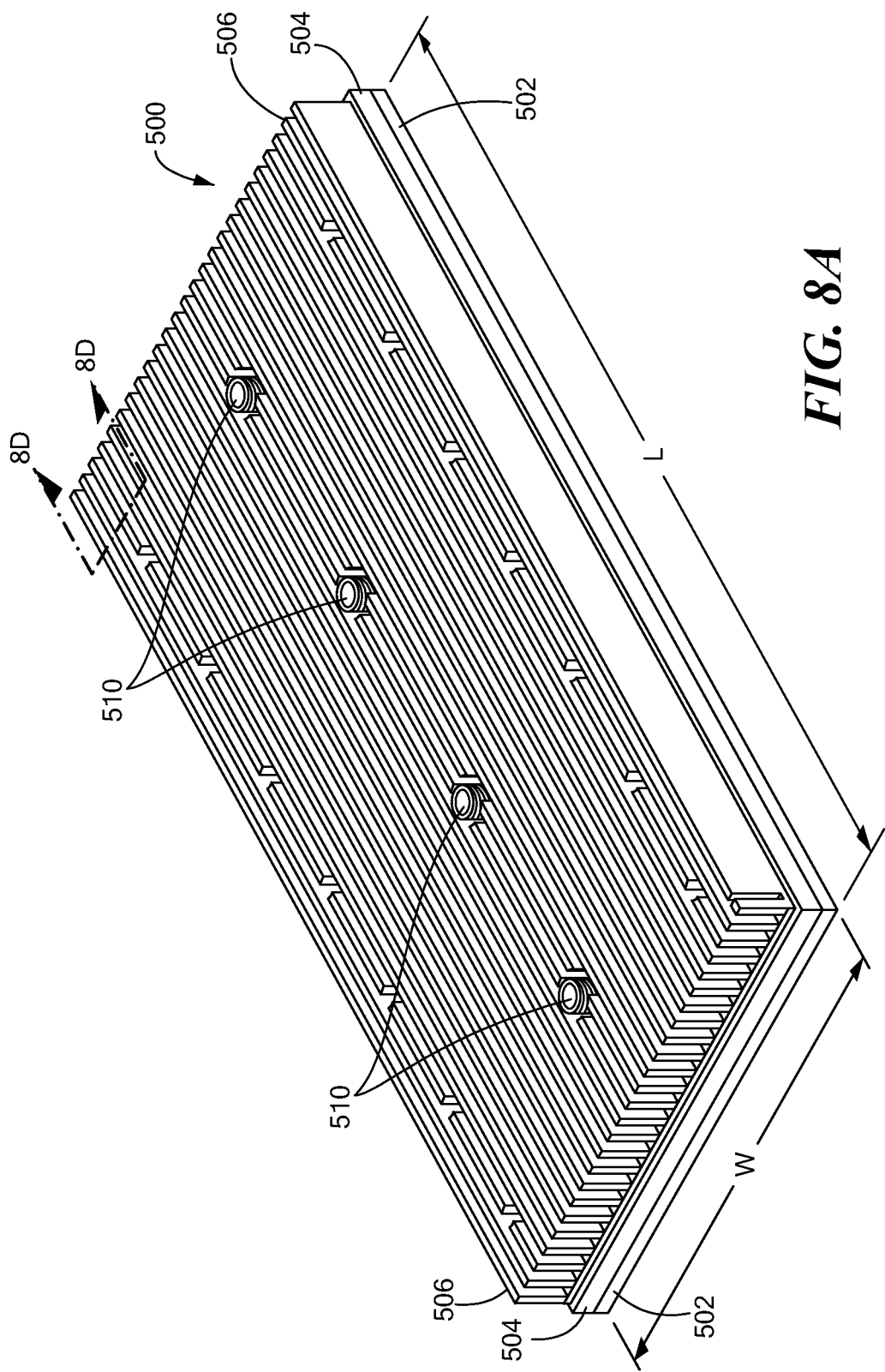

TRANSMIT/RECEIVE DAUGHTER CARD WITH INTEGRAL CIRCULATOR

CROSS-REFERENCE TO RELATED APPLICATIONS

This patent application is a continuation-in-part of co-pending application Ser. No. 13/295,437 filed Nov. 14, 2011 entitled: An Active Electronically Scanned Array (AESA) Card which is a continuation-in-part of application Ser. No. 12/484,626, filed Jun. 15, 2009 now U.S. Pat. No. 8,279,131 entitled "PANEL ARRAY," which application claims the benefit, under 35 U.S.C. §119 (e), of U.S. Provisional Application No. 61/163,002 filed Mar. 24, 2009.

This patent application is also a continuation-in-part of co-pending application Ser. No. 12/694,450 filed Jan. 27, 2010 entitled: "Radio Frequency Interconnect Circuits and Techniques" which is a divisional of U.S. patent application Ser. No. 11/558,126 filed on Nov. 9, 2006 now U.S. Pat. No. 7,671,696 entitled: "Radio Frequency Interconnect Circuits and Techniques" issued on Mar. 2, 2010 which is a continuation of U.S. patent application Ser. No. 11/533,848 filed on Sep. 21, 2006, now U.S. Pat. No. 7,348,932 entitled: "Tile Sub-Array And Related Circuits And Techniques" issued on Mar. 25, 2008. All of the above applications are all hereby incorporated herein by reference in their entireties.

FIELD OF THE INVENTION

This invention relates generally to phased array antennas adapted for volume production at a relatively low cost and having a relatively low profile and more particularly to radio frequency (RF) circuits and techniques utilized in phased array antennas.

BACKGROUND OF THE INVENTION

As is known in the art, there is a desire to lower acquisition and life cycle costs of radio frequency (RF) systems which utilize phased array antennas (or more simply "phased arrays"). At the same time, bandwidth, polarization diversity and reliability requirements of such systems become increasingly more difficult to meet.

As is also known, one way to reduce costs when fabricating RF systems is to utilize printed wiring boards (PWBs) (also sometimes referred to as printed circuit boards or PCBs) which allow use of so-called "mixed-signal circuits." Mixed-signal circuits typically refer to any circuit having two or more different types of circuits on the same circuit board (e.g. both analog and digital circuits integrated on a single circuit board).

As is also known, RF circuits are often provided from multi-layer PWBS. Such PWBS are often made from polytetrafluoroethene (PTFE) based materials since such materials have favorable RF characteristics (e.g. favorable insertion loss characteristics).

Mixed signal multilayer PWB laminates and often provided from sub-assemblies with each sub-assembly arranged for different types of circuits. For example, one sub-assembly may be for RF circuits and other sub-assembly for D.C. power and logic circuits. The two sub-assemblies are combined to provide the mixed signal, multi-layer PWB. Such PWBS are typically provided from PTFE based materials and thus require multiple process step-cycles for each sub-assembly which makes up the mixed signal multi-layer PWB. For example, it is necessary to image and etch the desired circuits the specified layers, then laminate the boards to provide a multilayer PWB. The drill and plate operations are sometime performed on individual boards. Finally, a last laminate and drill and plate cycle is performed to provide a finished PWB sub-assembly or final PWB assembly. Typically, each PWB sub-assembly and/or final assembly requires that each RF via hole extending beyond the transmission line junction (such regions referred to as "via stubs") be back-drilled and back-filled. This step improves RF performance of the PWB but increases cost and degrades RF performance due to back-drill tolerances, back-fill material dielectric properties and trapped air pockets. Thus, this approach results in high cost RF multilayer PWB laminates due to multiple fabrication operations and back-drill/backfill operations.

Mixed signal multilayer PWBs provided using low temperature co-fired ceramic (LTCC) based materials (rather than PTFE-based materials) present a different set of fabrication problems. Although a multilayer laminate can typically be made in one lamination step using LTCC, LTCC has a number of drawbacks. For example, processing can only be done on relatively small panel (or board) sizes (typically 6" square or less) due to shrinkage issues. Also, LTCC based materials use a conductive paste for transmission lines and ground planes and such conductive paste is lossy at RF frequencies compared to losses in RF signals propagating through pure copper transmission lines used in PTFE boards. Such increased insertion loss is unacceptable at many frequency ranges (e.g. at Ku-Band and above). Furthermore, LTCC materials tend to have a dielectric constant which is higher than the dielectric constant of PTFE based boards and this may not be suitable for both RF transmission lines and efficient RF radiators. Lastly, LTCC has a relatively small manufacturing base. In summary, at the present time, LTCC does not have high volume capability and LTCC material compromises RF performance and severely limits applications above the L-Band frequency range. Thus, both PTFE and LTCC approaches result in circuits which are relatively expensive, degrade RF performance and limit radar and/or communications applications.

As is known in the art, a phased array antenna includes a plurality of antenna elements spaced apart from each other by known distances coupled through a plurality of phase shifter circuits to either or both of a transmitter or receiver. In some cases, the phase shifter circuits are considered to be part of the transmitter and/or receiver.

As is also known, phased array antenna systems are adapted to produce a beam of radio frequency energy (RF) and direct such beam along a selected direction by controlling the phase (via the phase shifter circuitry) of the RF energy passing between the transmitter or receiver and the array of antenna elements. In an electronically scanned phased array, the phase of the phase shifter circuits (and thus the beam direction) is selected by sending a control signal (e.g. a series of digital bits or a digital control word) to each of the phase shifter sections. The control word is typically a digital signal representative of a desired phase shift, as well as a desired attenuation level and other control data.

Including phase shifter circuits and amplitude control circuits in a phased array antenna typically results in the antenna being relatively large, heavy and expensive. Size, weight and cost issues in phased array antennas are further exacerbated when the antenna is provided as a so-called "active aperture" (or more simply "active") phased array antenna since an active aperture antenna includes both transmit and receive circuits.

Phased array antennas are often used in both defense and commercial electronic systems. For example, Active Electronically Scanned Arrays (AESAs) are in demand for a wide range of defense and commercial electronic systems such as radar surveillance, terrestrial and satellite communications, mobile telephony, navigation, identification, and electronic counter measures. Such systems are often used in radar for National Missile Defense, Theater Missile Defense, Ship Self-Defense and Area Defense, ship and airborne radar systems and satellite communications systems. Thus, the systems are often deployed on a single structure such as a ship, aircraft, missile system, missile platform, satellite or building where a limited amount of space is available.

AESAs offer numerous performance benefits over passive scanned arrays as well as mechanically steered apertures. However, the costs that can be associated with deploying AESAs can limit their use to specialized military systems. An order of magnitude reduction in array cost could enable widespread AESA insertion into military and commercial systems for radar, communication, and electronic warfare (EW) applications. The performance and reliability benefits of AESA architectures could extend to a variety of platforms, including ships, aircraft, satellites, missiles, and submarines.

Many conventional phased array antennas use a so-called "brick" type architecture. In a brick architecture, radio frequency (RF) signals and power signals fed to active components in the phased array are generally distributed in a plane that is perpendicular to a plane coincident with (or defined by) the antenna aperture. The orthogonal arrangement of antenna aperture and RF signals of brick-type architecture can sometimes limit the antenna to a single polarization configuration. In addition, brick-type architectures can result in antennas that are quite large and heavy, thus making difficult transportability and deployment of such antennas.

Another architecture for phased array antennas is the so-called "panel" or "tile" architecture. With a tile architecture, the RF circuitry and signals are distributed in a plane that is parallel to a plane defined by the antenna aperture. The tile architecture uses basic building blocks in the form of "tiles" wherein each tile can be formed of a multi-layer printed circuit board structure including antenna elements and its associated RF circuitry encompassed in an assembly, and wherein each antenna tile can operate by itself as a substantially planar phased array or as a sub-array of a much larger array antenna.

For an illustrative phased array having a tile architecture, each tile can be a highly integrated assembly that incorporates a radiator, a transmit/receive (T/R) channel, RF and power manifolds and control circuitry, all of which can be combined into a low cost light-weight assembly for implementing AESA. Such an architecture can be particularly advantageous for applications where reduced weight and size of the antenna are important to perform the intended mission (e.g., airborne or space applications) or to transport and deploy a tactical antenna at a desired location.

It would, therefore, be desirable to provide an AESA having an order of magnitude reduction in the size, weight, and cost of a front end active array as compared to existing technology, while simultaneously demonstrating high performance.

SUMMARY OF THE INVENTION

In accordance with the techniques described herein, a method for fabricating a panel array using a multilayer printed wiring board (PWB) provided from a plurality of individual printed circuit boards (PCBs) includes (a) imaging all layers on each of the plurality of circuit boards comprising the PWB; (b) etching all layers on each of the plurality of circuit boards (including etching antenna elements and RF matching pads on at least some layers of the plurality of circuit boards); (c) laminating the circuit boards to provide a laminated circuit board assembly; (d) drilling holes in the laminated circuit board assembly with each of the holes extending from a top-most layer of the laminated circuit board assembly to a bottom-most layer of the laminated circuit board assembly; (e) plating each of the holes drilled in the laminated circuit board assembly; and (f) disposing a plurality of flip-chip circuits on an external surface of the laminated circuit board assembly.

With this particular technique, a single lamination step produces a panel array provided from a multilayer RF PWB. In one embodiment, the multi-layer PWB is provided as a mixed signal multi-layer PWB. This technique greatly simplifies fabrication and assembly processes and results in a panel array which combines excellent RF performance in a thin, lightweight package. In one embodiment, a panel array includes a 128 transmit/receive (T/R) channels in a panel which is on the order of 8.4 in×11.5 in (96.6 in$^2$), 0.120 inches thick and which weighs 2.16 lbs (0.19 lbs/in$^3$). The panel includes a multilayer PWB, two (2) monolithic microwave integrated circuits (MMIC's) per T/R channel, two (2) switches per T/R channel, RF and power/logic connectors, bypass capacitors and resistors. The single lamination and single drill and plate operations thus result in a low-cost, low profile (i.e. thin) panel.

In accordance with a further aspect of the inventive concepts described herein, a panel array provided from a multi-layer PWB comprises a plurality of radiating elements with each of the radiating elements being provided as part of a unit cell. The panel array further comprises a like plurality of "waveguide cages", each of the waveguide cages disposed about a corresponding one of the plurality of unit cells wherein each waveguide cage extends through the entire thickness of the multilayer PWB. The waveguide cages are formed from plated-through holes which extend from a first outermost layer of the PWB (e.g. a top layer of the PWB) to a second outermost layer of the PWB (e.g. a bottom layer of the PWB).

At RF frequencies, the waveguide cage electrically isolates each of the unit cells from other unit cells. Such isolation results in improved RF performance of the panel array. The waveguide cage functions to perform: (1) suppression of surface wave modes causing scan blindness (due to coupling between radiating elements on dielectric slab and a guided mode supported in the dielectric slab); (2) suppression of a parallel plate mode (due to an asymmetric RF stripline configuration); (3) RF isolation between unit cells; (4) electrical isolation of RF circuits from logic and power circuits (which consequently results in the ability of RF, power and logic circuits to be printed on the same layers thus reducing the total number of layers in the multi-layer panel); (5) vertical transitions for several RF via transitions for a feed layer and RF beamformer (this also saves space in a unit cell and allows tighter unit cell packing which is important when it is desirable for an array to operate over large scan volumes).

The single lamination technique allows all RF, power and logic vias to be drilled in one operation and makes use of RF via "stub" tuning (in which the RF via "stub" extending beyond the RF transmission line junction is RF tuned to provide a desired impedance match). This tuning approach uses shaped stubs near junctions of RF via-transmission lines. Also, disks (with a surrounding relief) are used in ground plane layers and/or blank layers through which the RF via passes to aid with impedance matching different portions of the circuits provided within the panel.

In one embodiment, the multilayer PWB which provides the panel array utilizes slot coupling between a feed circuit and the radiators. In the case where the radiators are provided as patch antenna elements, a slot coupled feed to the patch antenna elements saves two entire lamination and drill and plate cycles which would otherwise be required if a prior art probe-feed approach were used to feed the patch antenna element.

The multilayer PWB panel array also utilizes a balanced feed slot. In one embodiments of a dual linear polarized radiator, each slot pair corresponds to one of two orthogonal polarization directions (e.g. vertical and horizontal polarization), fed by a Wilkinson resistive-divider circuit. The benefit of this feed approach is improved cross-polarization performance with scan angle as the array is scanned off the principle axes of the array. In such a scanning mode, any imbalance in the amplitude and/or phase induced on the patch antenna element from the ideal odd mode (i.e. equal amplitude and 180 degrees phase shift between parallel edges of the patch), is attenuated in the resistor of the Wilkinson feed for that polarization.

In accordance with a further aspect of the inventive concepts described herein, the RF circuits and systems described herein also have the following beneficial features: the patch antenna elements are disposed inside the multi-layer laminate PWB and thus are internally isolated from adjacent patches in surrounding unit cells (e.g. both physically isolated and electrically isolated due to the waveguide cage around each unit cell). In one embodiment, the antenna elements form a dual linear polarized antenna. Left and/or right hand circular polarization are accomplished by inserting a quadrature hybrid circuit layer and coupling each hybrid circuit to an antenna feed circuit. In one embodiment, Wilkinson dividers are used in the antenna feed circuits and utilize resistors which may be provided as ink resistors (instead of omega-ply resistors) because of lower fabrication cost. The resistor value for the Wilkinson dividers used in a feed circuit for vertical and horizontal polarization feed and for Wilkinson dividers used in an RF beamformer are the same geometry and value in ohms/square. This facilitates ink resistor fabrication and also reduces fabrication costs. The multi-layer PWB panel array can also include a so-called active RF front-end which at least includes: radiators, an RF feed, an analog RF beamformer, T/R channels as well as power and logic distribution circuits. Accordingly, the above described features of the panel array can significantly reduce active RF front-end cost with an architecture that uses commercial processes and provides flexibility for a range of design requirements typical of phased array applications.

In summary, the panel array and panel architecture described herein enables the fabrication of a relatively low-cost phased array. In applications in which phased arrays requiring a relatively low power density can be used, the phased arrays can be air cooled and thus made lower cost compared with the cost of phased arrays requiring liquid cooling. Furthermore, advances over time in electronics and materials may be incorporated in a straight-forward manner with the design constraint that the system be air-cooled for an operating power level of a predetermined number of watts radiated RF power per channel. It should be appreciated that, although in preferred embodiments air cooling via a finned heat sink (or similar) is used, the panel array is also suitable for use with liquid cooling systems. In the liquid cooling case, thermal density dissipation capacity increases, but at an increased cost.

It should be appreciated that in one embodiment there are five basic steps in the fabrication and assembly of a panel array: (1) image and etch all layers on all circuit boards comprising the multilayer PWB; (2) laminate all of the circuit boards to provide a laminated PWB (a single lamination step eliminates sub-assembly alignment inherent with multiple lamination cycles, thus reducing production time and cost—each layer may be inspected prior to lamination to improve yield); (3) drill and plate between a top-most and bottom-most layer of the laminated PWB (all RF, logic and power interconnections made in a single drill operation and all holes are filled producing a solid, multi-layer laminate); (4) pick and place all active and passive components on an external surface of the PWB; and (5) solder re-flow to couple all active and passive components to the external surface of the PWB).

With this particular technique, a process for fabricating a panel array which reduces active RF front-end cost by reducing the number of fabrication process steps is provided. The technique produces a phased array panel which combines RF, logic and DC distribution with active electronics in one highly integrated printed wiring board (PWB). The active RF front-end at least includes: radiators, an RF feed, an analog RF beamformer, T/R channels, power and logic distribution circuits, semiconductor MMICs. The active RF front-end may also include bypass capacitors and resistors.

The fabrication technique can be used to provide a panel array having a power density characteristic which is relatively low compared with prior art phased arrays. The panel array described herein realizes the goal of widespread use of phased arrays for radar and communications applications by significantly reducing the cost of the so-called active RF front-end. The reduced cost is achieved by reducing the number of fabrication process steps required to produce a phased array that combines RF, logic and DC distribution with active electronics in one highly integrated multilayer laminate. In addition to providing a low cost panel array, the panel array fabrication techniques described herein also result in a mechanically robust, low profile and lightweight package enabling larger panel arrays to be constructed from a panel array "building block." In one embodiment, a panel array forms a basic "building block" for a modular/scalable phased array requiring peak RF output per channel of 10 W.

The panel array architecture described herein addresses a range of radar or communication system requirements and reduces overall system cost by: (1) enabling cost versus performance trade-offs with selection from a wide range of active electronics technology: RF CMOS, SiGe, GaAs, GaN, SiC; (2) eliminating individual packaging for each transmit/receive (T/R) channel; (3) applying an environmental conformal coating; (4) embedding "flex" circuits for DC and logic signals (thus eliminating the expense of DC, Logic connector material and assembly cost); (5) allowing air cooling of the array to be used (thereby eliminates more expensive approaches such as liquid cooling).

In accordance with the systems and techniques described herein, a phased array includes a panel array provided from a radio frequency (RF) multi-layer printing wiring board (PWB) having a plurality of mixed-signal circuits integrated therein. The PWB includes a plurality of antenna elements disposed to radiate in the direction of a first external surface of the PWB. A plurality of flip-chip circuits are disposed on a second external surface of the PWB. The flip-chip circuits are configured to electrically couple to at least a portion of the plurality of antenna elements. A heat sink is disposed over and configured to be in thermal contact with the plurality of flip-chip circuits.

With this particular arrangement, a panel array which can be air cooled is provided. In one embodiment, the phased array is provided from a single panel while in other embodiments, the phased array is provided from a plurality of panel arrays. The RF PWB is a mixed signal circuit which includes RF, logic and power circuits for the panel array. Thus, the panel and architecture described herein allows for air-cooling a panel suitable for use in an active, electronically scanned array (AESA). The active circuits are mounted as flip-chips on an external surface of the PWB. Coupling a heat sink directly to the flip-chip circuits disposed on the surface of the active panel (PWB) reduces the number of interfaces between the heat sink and the flip-chip circuits and thus reduces the thermal resistances between heat generating portions of the flip-chip circuits and the heat sink. By reducing the thermal resistance between the heat sink and the heat generating portions of the flip-chip circuits, it is possible to air cool the panel.

In one embodiment, direct mechanical contact is used between the flip-chip MMICs and a surface of a finned heat sink. In other embodiments, an intermediate "gap-pad" layer may be used between the flip-chip circuits (e.g. MMICs) and the surface of the heat sink.

The panel array described herein efficiently transfers heat (i.e. thermal energy) from a panel (and in particular from active circuits mounted on an external surface of the panel) to a heat sink. By reducing the number of thermal interface between the active circuits and the heat sink, a rapid transfer of thermal energy from the active circuits to the heat sink is achieved. In a preferred embodiment, the active circuits are mounted on the active panel as flip-chip circuits.

By using an air cooled approach (vs. using one of the prior art blower or liquid cooling approaches), an affordable approach to cooling a panel array is provided. Furthermore, by using a single heat sink to cool multiple flip-chip mounted active circuits (vs. the prior art multiple, individual "hat sink" approach), the cost (both part cost and assembly costs) of cooling a panel array is reduced since it is not necessary to mount individual heat sinks on each flip-chip circuit.

Furthermore, the panel array can act as a building block and be combined with other panel arrays to provide a modular, AESA (i.e. an array of such panels can be used to form an active phased array antenna which is air cooled). Thus, providing a panel array which can be air cooled allows manufacture of an AESA which is lower cost than prior art approaches.

In one embodiment, the flip-chip circuits are provided as monolithic microwave integrated circuits (MMICs) and the heat sink heat spreading elements are provided as fins or pins.

In one embodiment, the heat sink is provided as an aluminum finned heat sink having a mechanical interface between a surface thereof and a plurality of flip-chip MMICs disposed on an external surface of the panel. Air cooling of such a heat sink and panel eliminates the need for expensive materials (such as diamond or other graphite material) and elimination of heat pipes from the thermal management system. Thus, the system describe herein provides a low cost approach to cooling active phased array antennas having heat generating circuit components (e.g. active MMICs).

In one embodiment, the panel is provided from a multi-layer, mixed signal RF printed wiring board (PWB) with flip-chip attached MMICs. A single heat sink has a first surface mechanically attached to the PWB so as to make thermal contact with each flip-chip MMIC. Such a panel architecture can be used to provide panels appropriate for use across RF power levels ranging from mW per T/R channel to W per T/R channel, with a range of different duty cycles.

As a result of being able to use a common panel architecture in systems having multiple, different, power levels and physical sizes, it is also possible to use common fabrication, assembly and packaging approaches for each of the systems. For example, both low power and high power active, electronically-scanned arrays (AESAs) can utilize common fabrication, assembly and packaging approaches. This leads to cost savings in the manufacture of AESAs. Thus, the systems and techniques described herein can make the manufacture of AESAs more affordable.

The modular system described herein also provides performance flexibility. Desirable RF output power, noise figure, etc. of T/R channel electronics can be achieved by utilizing a wide range of surface mounted semiconductor electronics (i.e. flip-chips) on the external surface of the PWB. Since the active components are mounted on an external surface of the PWB, the same panel can be used in a wide range of applications by merely mounting (e.g. as flip-chips) active circuits having different characteristics (e.g. high power or low power circuits) to the panel. The panel architecture thus provides design flexibility in that it is configured to accept at least the following semiconductor electronics: RF CMOS based upon commercial silicon technology and selected to provide desirable RF characteristics (e.g. lowest output power and highest noise figure); silicon germanium (SiGe) selected to provide desirable RF output power and noise figure characteristics; gallium arsenide (GaAs) selected to provide desirable RF output power density of and low noise figure characteristics; as well as emerging technologies such as gallium nitride (GAN) which demonstrates relatively high power, efficiency, and power density (Watts/mm$^2$) characteristics compared with all existing semiconductor.

As mentioned above, the relatively high cost of phased arrays has precluded the use of phased arrays in all but the most specialized applications. Assembly and component costs, particularly for active transmit/receive channels, are major cost drivers. Phased array costs can be reduced by utilizing batch processing and minimizing touch labor of components and assemblies. It would be advantageous to provide a tile sub-array for an Active, Electronically Scanned Array (AESA) that is compact, which can be manufactured in a cost-effective manner, that can be assembled using an automated process, and that can be individually tested prior to assembly into the AESA. There is also a need to lower acquisition and life cycle costs of phased arrays, while at the same time improving bandwidth, polarization diversity and robust RF performance characteristics to meet increasingly more challenging antenna performance requirements.

At least some embodiments of a tile sub-array architecture described herein enable a cost effective phased array solution for a wide variety of phased array radar missions or communication missions for ground, sea and airborne platforms. In addition, in at least one embodiment, the tile sub-array provides a thin, lightweight construction that can also be applied to conformal arrays on an aircraft wing or fuselage or on a Unmanned Aerial Vehicle (UAV).

In one so-called "packageless T/R channel" embodiment, a tile sub-array simultaneously addresses cost and performance for next generation radar and communication systems. Many phased array designs are optimized for a single mission or platform. In contrast, the flexibility of the tile sub-array architecture described herein enables a solution for a larger set of missions. For example, in one embodiment, a so-called upper multi-layer assembly (UMLA) and a lower multi-layer assembly (LMLA), each described further herein, serve as common building blocks. The UMLA is a layered RF transmission line assembly which performs RF signal distribution, impedance matching and generation of polarization diverse signals. Fabrication is based on multi-layer printed wiring board (PWB) materials and processes. The LMLA integrates a package-less Transmit/Receive (T/R) channel and an embedded circulator layer sub-assembly. In a preferred embodiment, the LMLA is bonded to the UMLA using a ball grid array (BGA) interconnect approach. The package-less T/R channel eliminates expensive T/R module package components and associated assembly costs. The key building block of the package-less LMLA is a lower multi-layer board (LMLB). The LMLB integrates RF, DC and Logic signal distribution and an embedded circulator layer. All T/R channel monolithic microwave integrated circuits (MMIC's) and components, RF, DC/Logic connectors and thermal spreader interface plate can be assembled onto the LMLA using pick and place equipment.

In accordance with a further aspect of the present invention, a tile sub-array comprises at least one printed circuit board assembly comprising one or more RF interconnects between different circuit layers on different circuit board with each of the RF interconnects comprising one or more RF matching pads which provide a mechanism for matching impedance characteristics of RF stubs to provide the RF interconnects having desired insertion loss and impedance characteristics over a desired RF operating frequency band.

With this particular arrangement, a tile sub-array can be manufactured without the need to perform any back-drill and back-fill operations typically required to eliminate RF via stubs. The RF matching pad technique refers to a technique in which a conductor is provided on blank layers (i.e., layers with no copper) of a circuit board or in ground plane layers (with etched relief area) of a circuit board. The conductor and associated relief area provided the mechanism to adjust impedance characteristics of RF vias (also referred to as RF interconnect circuits) provided in a circuit board. Since the need to utilize back-drill and back-fill operations is eliminated, the RF matching pad approach enables a standard, low aspect ratio drill and plate manufacturing operation to produce an RF via that connects inner circuit layers and which also has a low insertion loss characteristic across a desired frequency band such as X-Band (8 GHz-12 GHz).

As is known, mode suppression vias help electrically isolate the RF interconnects from surrounding circuitry, thereby preventing signals from "leaking" between signal paths. In conventional systems, the mode suppression vias are also drilled and plated at the same time the interconnecting RF via is drilled and plated.

With the RF matching pad approach of the present invention, however, all RF and mode suppression vias can be drilled and plated through the entire assembly and there is no need to utilize and back drill and fill operations on the RF interconnects. Thus, manufacturing costs associated with back drill and back fill operations can be completely eliminated while simultaneously improving RF performance because channel to channel variations due to drill tolerances and backfill material tolerances are eliminated.

In one embodiment, the RF matching pad technique utilizes copper disks surrounded by an annular ring relief area in ground plane layers of RF interconnects and mode suppression circuits. The RF matching pad technique is a general technique which can be applied to any RF stub extending a quarter-wavelength, or less, beyond an RF junction between an RF interconnect and an RF signal path such as a center conductor of a stripline transmission line.

BRIEF DESCRIPTION OF THE DRAWINGS

The foregoing features of this invention, as well as the invention itself, may be more fully understood from the following description of the drawings in which:

FIG. 8A is an isometric view of a panel array;

Figure 1:
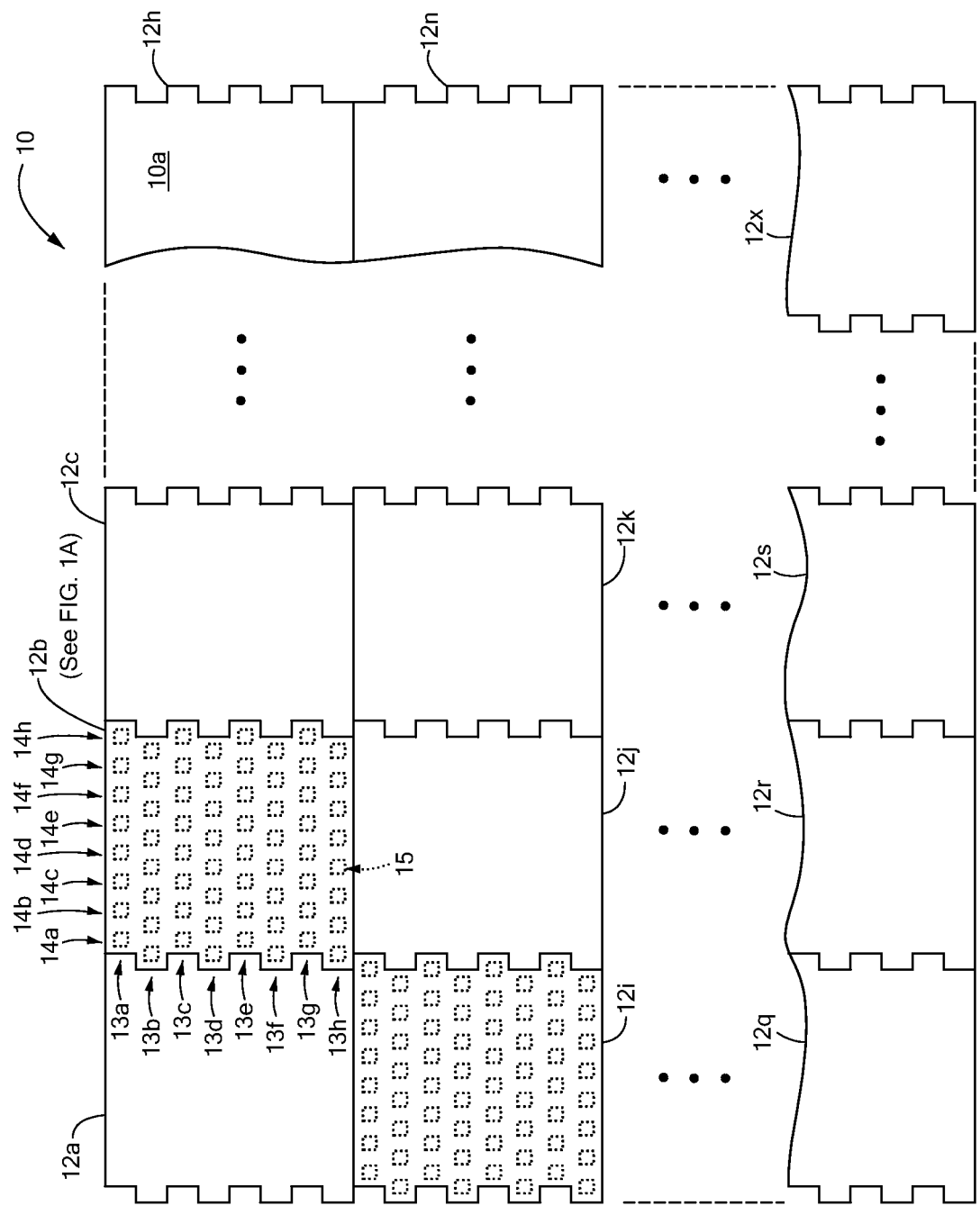
FIG. 1 is a plan view of an array antenna formed form a plurality of tile sub-arrays.

It should be understood that in an effort to promote clarity in the drawings and the text, the drawings are not necessarily to scale, emphasis instead is generally placed upon illustrating the principles of the invention.

DESCRIPTION OF THE PREFERRED EMBODIMENTS

Before describing the various embodiments of the invention, some introductory concepts and terminology are explained. A "panel array" (or more simply "panel") refers to a multilayer printed wiring board (PWB) which includes an array of antenna elements (or more simply "radiating elements" or "radiators"), as well as RF, logic and DC distribution circuits in one highly integrated PWB. A panel is also sometimes referred to herein as a tile array (or more simply, a "tile").

An array antenna may be provided from a single panel (or tile) or from a plurality of panels. In the case where an array antenna is provided from a plurality of panels, a single one of the plurality of panels is sometimes referred to herein as a "panel sub-array" (or a "tile sub-array").

Reference is sometimes made herein to an array antenna having a particular number of panels. It should of course, be appreciated that an array antenna may be comprised of any number of panels and that one of ordinary skill in the art will appreciate how to select the particular number of panels to use in any particular application.

It should also be noted that reference is sometimes made herein to a panel or an array antenna having a particular array shape and/or physical size or a particular number of antenna elements. One of ordinary skill in the art will appreciate that the techniques described herein are applicable to various sizes and shapes of panels and/or array antennas and that any number of antenna elements may be used.

Similarly, reference is sometimes made herein to panel or tile sub-arrays having a particular geometric shape (e.g. square, rectangular, round) and/or size (e.g., a particular number of antenna elements) or a particular lattice type or spacing of antenna elements. One of ordinary skill in the art will appreciate that the techniques described herein are applicable to various sizes and shapes of array antennas as well as to various sizes and shapes of panels (or tiles) and/or panel sub-arrays (or tile sub-arrays).

Thus, although the description provided herein below describes the inventive concepts in the context of an array antenna having a substantially square or rectangular shape and comprised of a plurality of tile sub-arrays having a substantially square or rectangular-shape, those of ordinary skill in the art will appreciate that the concepts equally apply to other sizes and shapes of array antennas and panels (or tile sub-arrays) having a variety of different sizes, shapes, and types of antenna elements. Also, the panels (or tiles) may be arranged in a variety of different lattice arrangements including, but not limited to, periodic lattice arrangements or configurations (e.g. rectangular, circular, equilateral or isosceles triangular and spiral configurations) as well as non-periodic or other geometric arrangements including arbitrarily shaped array geometries.

Reference is also sometimes made herein to the array antenna including an antenna element of a particular type, size and/or shape. For example, one type of radiating element is a so-called patch antenna element having a square shape and a size compatible with operation at a particular frequency (e.g. 10 GHz) or range of frequencies (e.g. the X-band frequency range). Reference is also sometimes made herein to a so-called "stacked patch" antenna element. Those of ordinary skill in the art will recognize, of course, that other shapes and types of antenna elements (e.g. an antenna element other than a stacked patch antenna element) may also be used and that the size of one or more antenna elements may be selected for operation at any frequency in the RF frequency range (e.g. any frequency in the range of about 1 GHz to about 100 GHz). The types of radiating elements which may be used in the antenna of the present invention include but are not limited to notch elements, dipoles, slots or any other antenna element (regardless of whether the element is a printed circuit element) known to those of ordinary skill in the art.

It should also be appreciated that the antenna elements in each panel or tile sub-array can be provided having any one of a plurality of different antenna element lattice arrangements including periodic lattice arrangements (or configurations) such as rectangular, square, triangular (e.g. equilateral or isosceles triangular), and spiral configurations as well as non-periodic or arbitrary lattice arrangements.

Applications of at least some embodiments of the panel array (a/k/a tile array) architectures described herein include, but are not limited to, radar, electronic warfare (EW) and communication systems for a wide variety of applications including ship based, airborne, missile and satellite applications. In at least one embodiment, panels (or tile sub-arrays) having a weight of less than one (1) ounce per transmit/receive (T/R) channel and a production cost of less than $100 per channel are desired. It should thus be appreciated that the panel (or tile sub-array) described herein can be used as part of a radar system or a communications system.

As will also be explained further herein, at least some embodiments of the invention are applicable, but not limited to, military, airborne, shipborne, communications, unmanned aerial vehicles (UAV) and/or commercial wireless applications.

The tile sub-arrays to be described hereinbelow can also utilize embedded circulators; a slot-coupled, polarized egg-crate radiator; a single integrated monolithic microwave integrated circuit (MMIC); and a passive radio frequency (RF) circuit architecture. For example, as described further herein, technology described in the following commonly assigned United States Patents can be used in whole or in part and/or adapted to be used with at least some embodiments of the tile subarrays described herein: U.S. Pat. No. 6,611,180, entitled "Embedded Planar Circulator"; U.S. Pat. No. 6,624,787, entitled "Slot Coupled, Polarized, Egg-Crate Radiator"; and/or U.S. Pat. No. 6,731,189, entitled "Multilayer stripline radio frequency circuits and interconnection methods." Each of the above patents is hereby incorporated herein by reference in their entireties.

Referring now to FIG. 1, an array antenna 10 is comprised of a plurality of tile sub-arrays 12a-12x. It should be appreciated that in this illustrative embodiment, x total tile sub-arrays 12 comprise the entire array antenna 10. In one embodiment, the total number of tile sub-arrays is sixteen tile sub-arrays (i.e. x=16). The particular number of tile sub-arrays 12 used to provide a complete array antenna can be selected in accordance with a variety of factors including, but not limited to, the frequency of operation, array gain, the space available for the array antenna and the particular application for which the array antenna 10 is intended to be used. Those of ordinary skill in the art will appreciate how to select the number of tile sub-arrays 12 to use in providing a complete array antenna.

As illustrated in tiles 12b and 12i, in the illustrative embodiment of FIG. 1, each tile sub-array 12a-12x comprises eight rows 13a-13h of antenna elements 15 with each row containing eight antenna elements 15 (or more simply, "elements 15"). Each of the tile sub-arrays 12a-12x is thus said to be an eight by eight (or 8×8) tile sub-array. It should be noted that each antenna element 15 is shown in phantom in FIG. 1 since the elements 15 are not directly visible on the exposed surface (or front face) of the array antenna 10. Thus, in this particular embodiment, each tile sub-array 12a-12x comprises sixty-four (64) antenna elements. In the case where the array 10 is comprised of sixteen (16) such tiles, the array 10 comprises a total of one-thousand and twenty-four (1,024) antenna elements 15.

In another embodiment, each of the tile sub-arrays 12a-12x comprise 16 elements. Thus, in the case where the array 10 is comprised of sixteen (16) such tiles and each tiles comprises sixteen (16) elements 15, the array 10 comprises a total of two-hundred and fifty-six (256) antenna elements 15.

In still another illustrative embodiment, each of the tile sub-arrays 12a-12x comprises one-thousand and twenty-four (1024) elements 15. Thus, in the case where the array 10 is comprised of sixteen (16) such tiles, the array 10 comprises a total of sixteen thousand three-hundred and eighty-four (16, 384) antenna elements 15.

In view of the above illustrative embodiments, it should thus be appreciated that each of the tile sub-arrays can include any desired number of elements. The particular number of elements to include in each of the tile sub-arrays 12a-12x can be selected in accordance with a variety of factors including but not limited to the desired frequency of operation, array gain, the space available for the antenna and the particular application for which the array antenna 10 is intended to be used and the size of each tile sub-array 12. For any given application, those of ordinary skill in the art will appreciate how to select an appropriate number of radiating elements to include in each tile sub-array. The total number of antenna elements 15 included in an antenna array such as antenna array 10 depends upon the number of tiles included in the antenna array and as well as the number of antenna elements included in each tile.

As will become apparent from the description hereinbelow, each tile sub-array is electrically autonomous (excepting of course any mutual coupling which occurs between elements 15 within a tile and on different tiles). Thus, the RF feed circuitry which couples RF energy to and from each radiator on a tile is incorporated entirely within that tile (i.e. all of the RF feed and beamforming circuitry which couples RF signals to and from elements 15 in tile 12b are contained within tile 12b). As will be described in conjunction with FIGS. 1B and 1C below, each tile includes one or more RF connectors and the RF signals are provided to the tile through the RF connector(s) provided on each tile sub-array.

Also, signal paths for logic signals and signal paths for power signals which couple signals to and from transmit/receive (T/R) circuits are contained within the tile in which the T/R circuits exist. As will be described in conjunction with FIGS. 1B and 1C below, RF signals are provided to the tile through one or more power/logic connectors provided on the tile sub-array.

The RF beam for the entire array 10 is formed by an external beamformer (i.e. external to each of the tile subarrays 12) that combines the RF outputs from each of the tile sub-arrays 12a-12x. As is known to those of ordinary skill in the art, the beamformer may be conventionally implemented as a printed wiring board stripline circuit that combines N subarrays into one RF signal port (and hence the beamformer may be referred to as a 1:N beamformer).

The tile sub-arrays are mechanically fastened or otherwise secured to a mounting structure using conventional techniques such that the array lattice pattern is continuous across each tile which comprises the array antenna. In one embodiment, the mounting structure may be provided as a "picture frame" to which the tile-subarrays are secured using fasteners (such as #10-32 size screws, for example). The tolerance between interlocking sections of the tile is preferably in the range of about +/−0.005 in. although larger tolerances may also be acceptable based upon a variety of factors including but not limited to the frequency of operation. Preferably, the tile sub-arrays 12a-12x are mechanically mounted such that the array lattice pattern (which is shown as a triangular lattice pattern in illustrative embodiment of FIG. 1) appears electrically continuous across the entire surface 10a (or "face") of the array 10.

It should be appreciated that the embodiments of the tile sub-arrays described herein (e.g. tile sub-arrays 12a-12x) differ from conventional so-called "brick" array architectures in that the microwave circuits of the tile sub-arrays are contained in circuit layers which are disposed in planes that are parallel to a plane defined by a face (or surface) of an array antenna (e.g. surface 10a of array antenna 10) made up from the tiles. In the illustrative embodiment of FIG. 1, for example, the circuits provided on the layers of circuit boards from which the tiles 12a-12x are provided are all parallel to the surface 10a of array antenna 10. By utilizing circuit layers that are parallel to a plane defined by a face of an array antenna, the tile architecture approach results in an array antenna having a reduced profile (i.e. a thickness which is reduced compared with the thickness of conventional array antennas).

Advantageously, the tile sub-array embodiments described herein can be manufactured using standard printed wiring board (PWB) manufacturing processes to produce highly integrated, passive RF circuits, using commercial, off-the-shelf (COTS) microwave materials, and highly integrated, active monolithic microwave integrated circuits (MMIC's). This results in reduced manufacturing costs. Array antenna manufacturing costs can also be reduced since the tile sub-arrays can be provided from relatively large panels or sheets of PWBs using conventional PWB manufacturing techniques.

In one illustrative embodiment, an array antenna (also sometimes referred to as a panel array) having dimensions of 0.5 meter×0.5 meter and comprising 1024 dual circular polarized antenna elements was manufactured on one sheet (or one multilayer PWB). The techniques described herein allow standard printed wiring board processes to be used to fabricate panels having dimensions up to and including 1 m×1 m with up to 4096 antenna elements from one sheet of multi-layer printed wiring boards (PWBs). Fabrication of array antennas utilizing large panels reduces cost by integrating many antenna elements with the associated RF feed and beamforming circuitry since a "batch processing" approach can be used throughout the manufacturing process including fabrication of T/R channels in the array. Batch processing refers to the use of large volume fabrication and/or assembly of materials and components using automated equipment. The ability to use a batch processing approach for fabrication of a particular antenna design is desirable since it generally results in relatively low fabrication costs. Use of the tile architecture results in an array antenna having a reduced profile and weight compared with prior art arrays of the same size (i.e. having substantially the same physical dimensions).

Figure 1A:
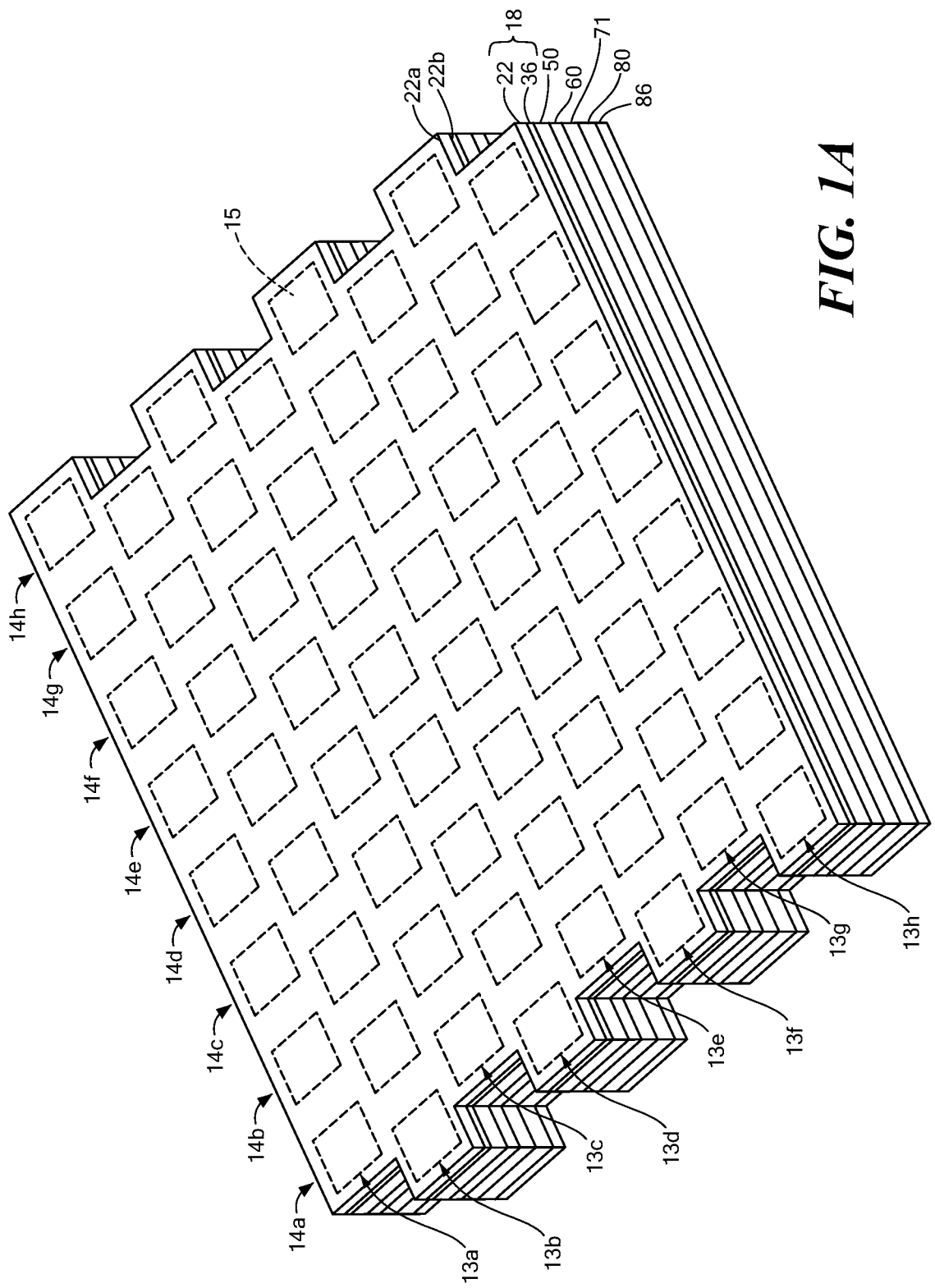
FIG. 1A is a perspective view of a tile sub-array of the type used in the array antenna shown in FIG. 1.

Referring now to FIG. 1A in which like elements of FIG. 1 are provided having like reference designations, and taking tile sub-array 12b as representative of tile sub-arrays 12a and 12c-12x, the tile sub-array 12b includes an upper multi-layer assembly (UMLA) 18. The UMLA 18 includes a radiator subassembly 22 which, in this illustrative embodiment, is provided as a so-called "dual circular polarized stacked patch egg-crate radiator" assembly which may be the same as or similar to the type described in U.S. Pat. No. 6,624,787 B2 entitled "Slot Coupled, Polarized, Egg-Crate Radiator" assigned to the assignee of the present invention and hereby incorporated herein by reference in its entirety. It should, of course, be appreciated that a specific type of radiator sub assembly is herein described only to promote clarity in the description provided by the drawings and text. The description of a particular type of radiator is not intended to be, and should not be construed as, limiting in any way. Thus, antenna elements other than stacked patch antenna elements may be used in the tile sub-array.

The radiator subassembly 22 is provided having a first surface 22a which can act as a radome and having a second opposing surface 22b. As will be described in detail below in conjunction with FIGS. 1B and 1C, the radiator assembly 22 is comprised of a plurality of microwave circuit boards (also referred to as PWBs) (not visible in FIG. 1A). Radiator elements 15 are shown in phantom in FIG. 1A since they are disposed below the surface 22a and thus are not directly visible in the view of FIG. 1A.

The radiator subassembly 22 is disposed over an upper multi-layer (UML) board 36 (or UMLB 36). As will be described in detail in conjunction with FIGS. 1B, 1C below, in the illustrative embodiment described herein, the UML board 36 is comprised of eight individual printed circuit boards (PCBs) which are joined together to form the UML board 36. It should, of course, be appreciated that in other embodiments, UML board 36 may be comprised of fewer or more that eight PCBs. The UML board 36 includes RF feed circuits which couple RF signals to and from the antenna elements 15 provided as part of the radiator subassembly 22.

Figure 1B:
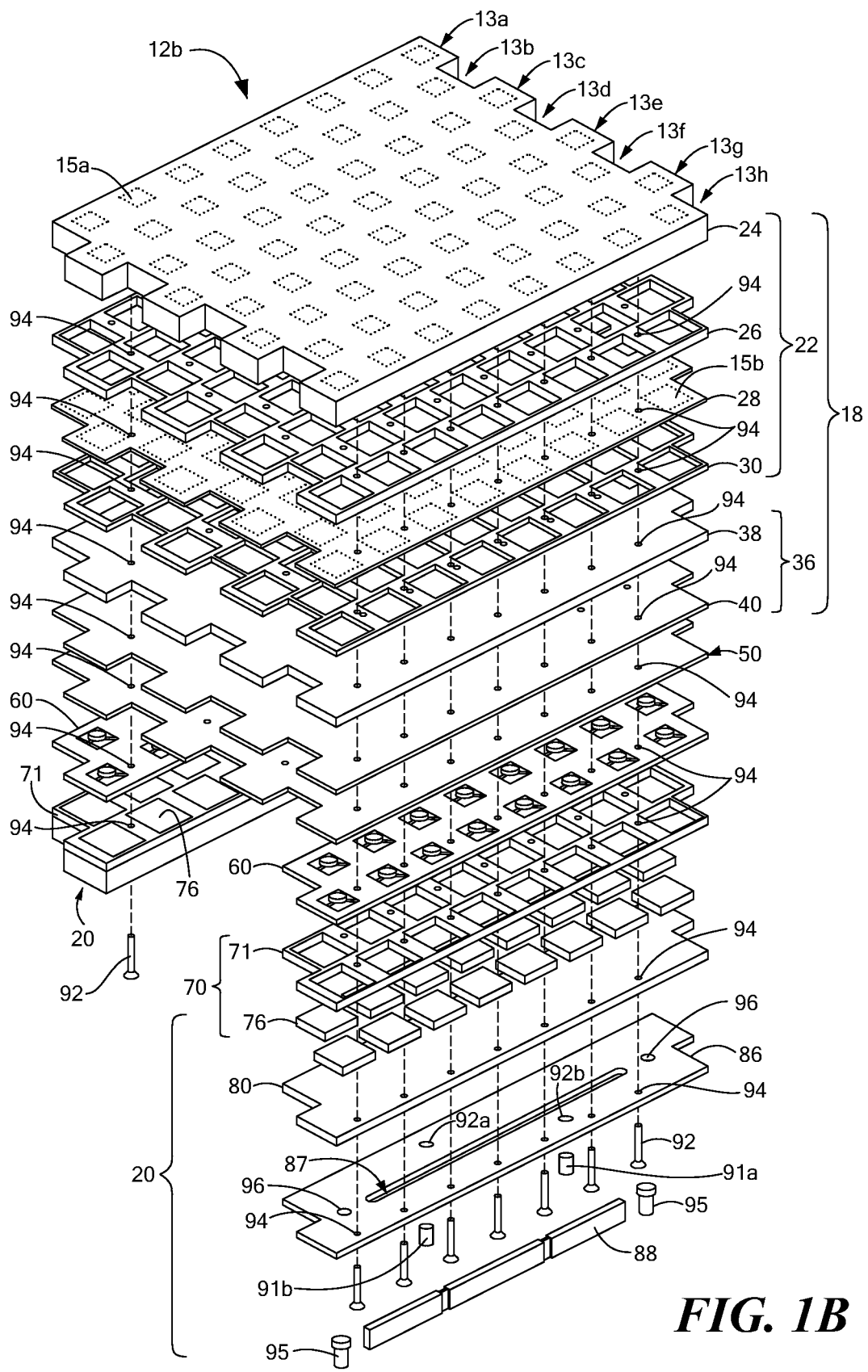
FIG. 1B is an exploded perspective view of a portion of the tile sub-array shown in FIG. 1A.

The UML board 36 is disposed over a first interconnect board 50 which in this particular embodiment is provided as a so-called "Fuzz Button" board 50. The interconnect board 50 is disposed over a circulator board 60 which in turn is disposed over a second interconnect board 71. As will be described in conjunction with FIG. 1B, the second interconnect board 71 may be provided as a so-called Fuzz Button, egg-crate board disposed over a plurality of T/R modules 76 (FIG. 1B). The Fuzz Button egg-crate board 71 is disposed over a lower multi-layer (LML) board 80 and the LML board 80 is disposed over a thermal spreader plate 86. The LML board 80 and thermal spreader plate 86 together with T/R modules 76 (not visible in FIG. 1A) comprise a lower multi-layer assembly 20 (LMLA 20).

The "fuzz-button" board 50 provides RF signal paths between circuits and signals on the UML board 36 and circulator board 60. Similarly, the "Fuzz-Button" egg-crate board 71 provides RF signal paths between the circulator board 60 and LML board 80. As will become apparent from the description hereinbelow in conjunction with FIG. 1B, the Fuzz-Button egg-crate board 71 is disposed over a plurality of T/R modules (not visible in FIG. 1A) provided on a surface of the LML board 80. The Fuzz Button board 50 as well as the Fuzz-Button egg-crate board 71 are each comprised of a number of coaxial RF transmission lines where each coaxial RF transmission line is comprised of a beryllium-copper wire spun in cylindrical shape and capable of being compressed (which forms a so-called fuzz button) and captured in a dielectric sleeve; the fuzz-button/dielectric sleeve assembly is then assembled into a metal board (e.g. as in board 50) or metal egg-crate. The fuzz-button board 50 and fuzz-button egg-crate 71 allow mechanical assembly of the UML board 36, circulator board 60, and the LML board 80. This is important for relatively large array antennas (e.g. array antennas having an array face larger than about one square meter (1 m²) in area for ground based radar arrays) where relatively high yields are achieved by integrating "known good sub-assemblies" (i.e. subassemblies that have been tested and found to perform acceptably in the tests). However, for smaller arrays (e.g. array antennas having an array face smaller than about 1 m² in area for mobile radar arrays), the UML board 36, circulator board 60, and the LML board 80 can be mechanically and electrically integrated using a ball grid array interconnect method as described in U.S. Pat. No. 6,731,189, entitled "Multilayer Stripline Radio Frequency Circuits and Interconnection Methods" assigned to the assignee of the present invention and incorporated herein by reference in its entirety. Thus, this approach allows flexibility in assembly for the application and platform.

As mentioned above, the fuzz button board 50 is disposed over the circulator board 60. In this particular embodiment the circulator board 60 is provided as a so-called "RF-on-Flex circulator" board 60. The circulator board 60 may be the same as, or similar to, the type described in U.S. Pat. No. 6,611,180, entitled "Embedded Planar Circulator" assigned to the assignee of the present invention and hereby incorporated herein by reference in its entirety.

Circulator board 60 has provided therein a plurality of embedded circulator circuits which are disposed to impede the coupling of RF signals between a transmit signal path and a receive signal path provided in the tile sub array. That is, circulator board 60 functions to isolate a transmit signal path from a receive signal path.

The circulator board 60 is disposed over the second interconnect board 71 (aka fuzz button egg crate board 71) in which is disposed a plurality of transmit/receive (T/R) modules (not visible in FIG. 1A). The fuzz button egg crate board 71 is disposed to couple RF signals between the T/R modules (which are soldered or otherwise electrically coupled to circuits on the LML board 80) and the circulator board 60.

As mentioned above, the fuzz button egg crate layer 71 is disposed over the lower multi-layer (LML) board 80 and the LML board 80 is disposed over the thermal spreader plate 86 and the T/R modules 76, the lower multi-layer (LML) board 80 and the thermal spreader plate 86 together comprise the lower multi-layer assembly (LMLA) 20. It should be appreciated that in the particular illustrative embodiment shown in FIG. 1A, the fuzz button egg crate layer 71 is not included as part of the LMLA 20.

Figure 1C:
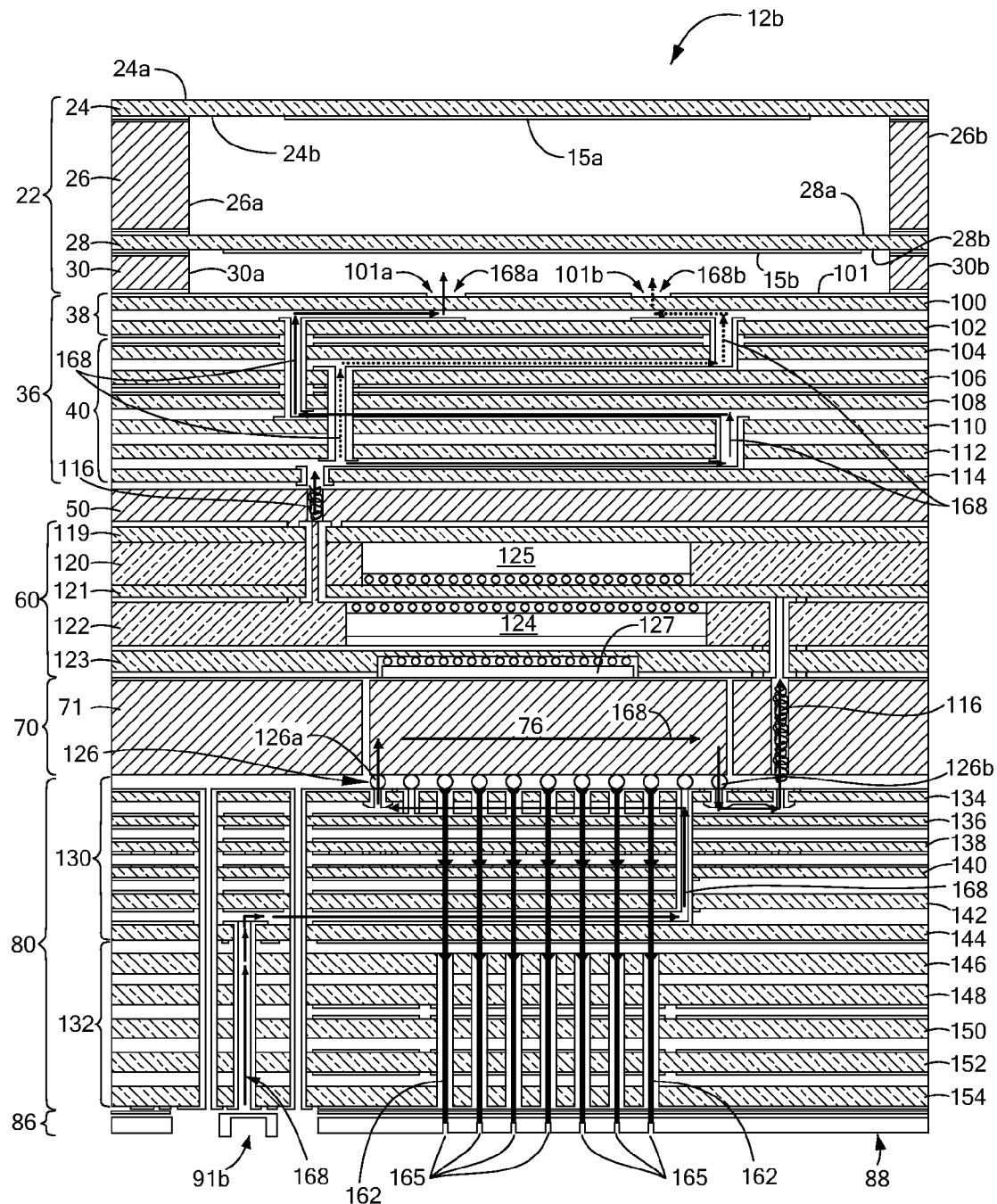
FIG. 1C is a cross-sectional view of a portion of the tile sub-array shown in FIGS. 1A and 1B.

Referring now to FIG. 1B in which like elements of FIGS. 1 and 1A are provided having like reference designations, the radiator subassembly 22 is comprised of a first radiator substrate 24, a first so-called "egg crate" substrate 26 (with egg crate walls 26a, 26b visible in FIG. 1C), a second radiator substrate 28 and a second egg crate substrate 30 (with egg crate walls 30a, 30b visible in FIG. 1C). The first substrate 24 includes a first plurality of radiating antenna elements 15a (the first plurality radiating elements 15a most clearly visible in FIG. 1C). The substrate 24 is disposed over the first so-called "egg-crate" substrate 26 with each of the radiating elements arranged such that they align with openings in the egg crate substrate 26.

The egg crate substrate 26 is disposed over a first surface 28a of a second substrate 28. A second opposing surface of the substrate 28b has a second plurality of radiating antenna elements 15b disposed thereon. The second plurality of radiating elements 15b are not directly visible in this view and thus are shown in phantom in FIG. 1B. The radiating elements 15a, 15b are clearly visible in the view of FIG. 1C. The first and second elements 15a, 15b taken together are generally denoted 15 in FIGS. 1 and 1A. The second substrate 28 is disposed over the second "egg-crate" substrate 30. The first and second egg crate substrates 26, 30 are aligned such that the openings in the second egg crate substrate 30 align with the openings in the first egg crate substrate 26. The set of antenna elements 15b on the second substrate 28 are arranged to align with openings in the second egg crate substrate 30.

The radiator sub-assembly 22 is disposed over a UML board 36 comprised of a plurality of boards 38, 40 which comprise RF feed circuits which couple RF signals between the antenna elements of the radiator sub-assembly 22 and RF transmitter and receiver circuitry to be described below. It should be appreciated that the RF feed circuit boards 38, 40 may themselves be comprised of multiple individual circuit boards which are bonded or otherwise coupled together to provide the UML board 36.

It should also be appreciated that the radiator sub-assembly 22 and the UML board 36 together form the UMLA 18. The UMLA 18 is disposed over and coupled to the LMLA 20. Specifically, the UML board 36 is disposed over a fuzz-button board 50, a circulator board 60 and a fuzz button egg crate board 71. Thus, in this particular embodiment, the fuzz-button board 50, circulator board 60 and fuzz button egg crate board 71 are disposed between the UMLA 18 and the LMLA 20. The fuzz-button board 50 facilitates RF connections between multiple vias of the circuit boards in the UMLA 18 and the circulator board 60; the fuzz-button egg-crate board 71 facilitates RF connections between the circulator board 60 and LMLA 20.

The fuzz button egg crate board 71 is disposed over T/R modules and a surface of the LMLB 80. It should be appreciated that in the exploded view of FIG. 1B, T/R modules 76 are shown separated from the LML board 80 but in practice, the T/R modules 76 are coupled to the LML board 80 using conventional techniques. The LML board 80 is disposed over a heat spreader plate 86 having a slot 87 formed along a portion of a centerline thereof.

The heat spreader plate 86, LML board 80 and T/R modules 76, together comprise the LMLA 20. A plurality of DC and logic connectors 88, 90 are disposed through the slot 87 and openings provided in the thermal spreader plate 86 and provide electrical input/output connections to the LMLA 20. A pair of RF connectors 91a, 91b are also disposed through holes 93a, 93b in the thermal spreader plate 86 to thus electrically connect with the LML board 80 and provide RF connection ports for the tile 12b.

The UMLA 18, the fuzz button board 50, the circulator board 60, the fuzz button egg crate board 71 and the LMLA 20 are each provided having a plurality of holes 94 therein. To promote clarity in the Figs., not every hole 94 has been shown and not every hole which has been shown has been labeled. At least portions of each of the holes 94 are threaded. A corresponding plurality of screws generally denoted 92 pass through holes 94 and the threads on screws 92 mate with the corresponding threads in the holes 94. Thus, screws 92 fasten together and secure the UMLA 18 to the LMLA 20 (as well as securing boards 50, 60 and 71 there between) to thus provide an assembled tile 12b. In the illustrative embodiment of FIG. 1B, the portions of the holes 94 in the radiator assembly 22 are threaded and the screws are inserted through the heat spreader plate 86 and the LMLA 20 and mate with the threaded portions of the holes 94 in the radiator assembly 22. Again to promote clarity in the Figs., not every screw 92 has been shown and not every screw which has been shown has been labeled.

It should be appreciated that to allow the screws 92 to pass through the holes 94, in each of the boards which comprise the UMLA 18 and the LMLA 20, the holes 94 in each of the boards must be aligned. Also, significantly, the holes 94 must be located in the boards so as to avoid any circuitry or circuit components provided in the boards which provide the tile 12b.

A pair of bosses 95 are coupled to the heat spreader plate at points 96 to provide points for mechanically interfacing with the tile 12b. In one embodiment the bosses 95 are threaded and are made available to accept either a liquid cold plate assembly or (as in this instance) a heat exchanger assembly (e.g. thermal spreader plate 86 to be described below) for thermal management by air cooling.

It should be appreciated that only two LMLAs 20 are shown in FIG. 1B and that a plurality of LMLAs 20 would be attached to the UMLA 18 to form a complete tile sub-array 12. In the illustrative embodiment of FIG. 1B, there would be four LMLAs 20 for one UMLA 22. In general, however, the number of LMLAs 20 required depends, at least in part, upon the number of radiating elements included the tile sub-array.

In this particular example, each tile sub-array 12 includes sixty-four radiating antenna elements which are uniformly distributed in a predetermined pattern (here a triangular lattice pattern) among eight rows of the sub-array (that is to say, each row of the tile sub-array includes the same number of antenna elements). In the illustrative design of FIGS. 1-1C, each LMLA 20 is adapted to couple to two rows of antenna elements 15 which constitutes sixteen (16) total antenna elements 15 (keeping in mind, of course that in FIG. 1B, each element 15 corresponds to a stacked patch element and that each stacked patch element 15 is comprised of two patch elements 15a, 15b). Stated differently, each LMLA 20 feeds a two-by-eight (2×8) portion of the sub-array 12b. Thus, since there are eight (8) rows of antenna elements in the tile sub-array 12b, and each LMLA feeds two rows, then four (4) LMLAs 20 are required to feed the entire sub-array 12b. Since, in this illustrative embodiment, each of the tile sub-arrays 12a-12x comprise eight (8) rows of antenna elements, then each of the tile sub-arrays 12a-12x requires four (4) LMLAs 20.

It should be understood that, in an effort to promote clarity in the description and the drawings, only two LMLAs 20 are shown in the illustrative embodiment of FIG. 1B. As explained above, however, in practice four LMLAs 20a-20d would be fastened to appropriate regions of the UMLA 18 to provide the complete tile 12b.

It should also be understood that although in this example each LMLA 20 feeds two (2) rows of antenna elements, it is possible to make an embodiment in which each LMLA feeds a number of antenna rows which is greater than or less than two. For example, assuming the tile sub-array contains eight rows as shown in FIGS. 1-1C, an LMLA configuration could be made to couple to one (1) row of antenna elements (in which case eight LMLAs per tile sub-array would be needed). Or alternatively, an LMLA configuration could be made to couple to four (4) rows of antenna elements (in which case two LMLAs per tile sub-array would be needed), or eight rows of antenna elements (in which case only one LMLA per tile sub-array would be needed). The particular number of LMLAs (i.e. the particular LMLA configuration) to use in any particular tile sub-array depends upon a variety of factors including but not limited to, the number of radiating elements in the tile sub-array, the cost of each LMLA, the particular application in which the tile sub-array will be used, the ease (or difficulty) of changing an LMLA in the sub-array (e.g. should an LMLA fail) and the cost of repairing, replacing or otherwise changing an LMLA in a tile sub-array should one fail. Those of ordinary skill in the art will understand how to select a particular LMLA configuration for a particular application.

Each LMLA may be associated with one or more T/R channels. For example, in the embodiment of FIGS. 1-1C, each LMLA 20 includes sixteen T/R channels arranged in a 2×8 layout coupled to a 2×8 array of antenna elements provided as part of the tile sub-array 12b. Thus, four such LMLAs 20 are used in a complete tile sub-array.

Referring now to FIG. 1C, in which like elements of FIGS. 1-1B are provided having like reference designations, the radiator assembly 22 is shown provided as a so-called "stacked patch" egg crate radiator sub-assembly 22 which comprises upper and lower patch radiators 15a, 15b with the first antenna element 15a disposed on a surface 24b of the board 24 and the second antenna element 15b disposed on a surface 28b of the board 28. The two boards 24, 28 are spaced apart by the egg-crate board 26. Details of a stacked patch radiator assembly which may be the same as or similar to radiator assembly 22 are described in U.S. Pat. No. 6,624,787 B2 entitled "Slot Coupled, Polarized, Egg-Crate Radiator" assigned to the assignee of the present invention The dual stacked-patch, egg-crate radiator assembly 22 is disposed over the UML board 36 which is provided from polarization and feed circuit boards 40, 38. The polarization and feed circuit boards 40, 38 are provided from a plurality of RF printed circuit boards 100-114. Circuit boards 100, 102 comprise antenna element feed circuits, circuit boards 104-110 comprise power divider circuits and circuit boards 112, 114 comprise the polarizing circuit. In this illustrative embodiment, the polarization, feed and power divider circuits are all implemented as printed circuits but any technique for implementing low cost, low profile, functionally equivalent circuits may also be used.

In this embodiment, circuit board 100 has a conductor disposed on a surface thereof. A pair of openings or slots 101a, 101b are formed or otherwise provided in the conductor 101 and RF signals are coupled to antenna elements 15a, 15b through the slots 101a, 101b. The tile sub-array thus utilizes a balanced feed circuit (not visible in FIG. 1C) which utilizes non-resonant slot coupling. The use of non-resonant slot coupling provides two benefits: first, use of slots (e.g. slots 101a, 101b) helps isolate the feed network from the antenna element (e.g. antenna elements 15a, 15b) which can substantially help prevent spurious radiation; and second, a non-resonant slot can substantially help eliminate strong back-lobe radiation (characteristic of a resonant slot) which can substantially reduce the gain of the radiator. In one embodiment in which the feed circuits are implemented as stripline feed circuits, the feed circuits and slots are isolated by plated through-holes (which act as mode suppression posts) provided in appropriate portions of the UML board 36.

UML board 36 (comprised of the polarization and feed circuit boards 40, 38) is disposed over the fuzz button board 50. Fuzz button board 50 includes one or more electrical signal paths 116 (only one electrical signal path 116 being shown in FIG. 1C). The electrical signal path 116 provides an electrical connection between circuits included as part of the UML board 36 (e.g. polarization and feed circuits) and circuits included on the circulator board 60.

The circulator board 60 is comprised of five circuit boards 119-123 a magnet 125 (which is provided as a samarium cobalt magnet in one embodiment) and a ferrite disk 124 (which is provided as a Garnett ferrite in one embodiment) and a pole piece 127 (which, in one embodiment, is provided as magnetizable stainless steel but which can be provided from any magnetizable material). Printed circuits provided on the circuit board 121 complete the circulator circuit and provide signal paths for RF signals propagating through the circulator. In one embodiment, the circulator may be implemented as the type described in U.S. Pat. No. 6,611,180 entitled Embedded Planar Circulator and assigned to the assignee of the present invention and incorporated herein by reference in its entirety. The circulator board 60 is disposed over the "Fuzz Button" egg crate board 70.

It should be appreciated that in an array antenna having a brick style architecture, circulators such as the RF circulator shown in FIG. 1C, are typically incorporated into substrates included with each T/R channel.

In the present embodiment of the invention described herein, however, the design of the tile sub-array 12b removes the circulator from the T/R module and embeds it into a separate circulator board 60. For example, in the embodiment shown in FIG. 1C, the RF circulator components (e.g. the ferrite 124 the magnet 125 and the pole piece 127) can be "buried" or "embedded" in a layer of commercially available material such as a low loss and low dielectric constant polytetrafluoroethane (PTFE) based materials. Thus, circuit boards 119-123 may be provided as PTFE based circuit boards.

By providing the circulator as an embedded circulator (rather than as part of the T/R module), a significant reduction in T/R channel size is provided. By reducing the size of the T/R channel, a tighter lattice spacing in the antenna elements of the tile sub-array can be achieved. Tight lattice spacing is desirable since it is important in wideband phased array applications for achieving grating-lobe free scan volumes. Moreover, the embedded circulator can be provided utilizing commercial batch processing techniques and commercially available materials which results in a lower cost phased array.

The Fuzz-Button, egg-crate board 70 is provided from an egg crate board 71. A T/R module 76 is disposed in openings provided in the board 70. The T/R module is provided having a ball grid array (BGA) 126 provided thereon. The T/R module 76 includes a first signal port which is electrically coupled to ball 126a and a second signal port which is electrically coupled to ball 126b. The BGA 126 is electrically coupled (e.g. via soldering or any other technique for making electrical connections well known to those of ordinary skill in the art) to electrical circuits and signal paths provided in the LML board 80 over which the T/R module 76 is disposed. The board 71 also has a fuzz button signal path 116 provided therein through which RF signals may propagate from the second port of the T/R module 76 through ball 126b and an electrical signal path on the LML board 80 to the circulator board 60.

In this illustrative embodiment, the LML board 80 is comprised of two sets of printed circuit boards 130, 132 with each of the two sets 130, 132 themselves being comprised of a plurality of printed circuit boards 134-144 and 146-154. It should be noted, as will be understood by those of ordinary skill in the art, bonding adhesive layer are not shown as part of PCBs 130, 132 but are shown with PCBs 38 and 40 in the UMLB 36. In this embodiment, the circuit boards 130 (and hence circuit boards 134-144) correspond to the RF portion of the LML board 80 while the circuit boards 132 (and hence circuit boards 146-154) correspond to the DC and logic signal portion of the LML board 80 with board 154 being disposed on the thermal spreader plate 86.

A plurality of thermal paths designated by reference number 162 facilitate the transfer of heat from the T/R module 76 through the LML board 80 and to the thermal spreader plate 86 which in preferred embodiments is provided as a cooled thermal plate. In this embodiment, the heat spreader plate 86 is coupled to board 154 of the LML board 80 via a thermally conductive epoxy. Once boards 130, 132 are assembled (e.g. bonded or otherwise coupled together) to form the LML board 80, thermal pins 162 (only two of which are labeled in FIG. 1C) are shaken into holes in the LML board 80 until the barbed first end of the pins 162 are seated in the holes to ensure proper contact with the BGA 126. The second end of the pins 162 extend a short distance through the LML board 80 such that the second end of the pins 162 are disposed in holes 165 in the thermal spreader plate 86. The holes 165 are then filled with a thermally conductive epoxy. Thus, the BGAs 126 provide a means to accomplish the coupling of RF signals, DC and logic signals and thermal transfer from the T/R modules 76.

It should also be appreciated that other techniques, may of course, also be used to couple the spreader plate 86 to the LMLA 20. Also, it should be appreciated that regardless of the precise location of the spreader plate on the tile 12b and regardless of how the spreader plate is coupled to the tile 12b (e.g. thermally conductive epoxy, solder, thermal grease, etc. . . . ), it is preferred that thermal paths (such as thermal paths 162) couple heat generating devices such as T/R modules 76 to the heat sink such as spreader plate 86.

RF connector 91b is coupled to an RF signal path 168 in the LMLA 20. In this particular embodiment, the RF connector is provided as a GPPO connector but any RF connector having electrical and mechanical characteristics appropriately suited for a particular application may be used.

As indicated by the dashed line labeled with reference number 168, an RF signal fed into port 91b is coupled through the LML board 80 and is coupled through the BGA 126a to the T/R module 76. The RF signal propagates though the T/R module 76 and is coupled through the BGA 126b along a signal path between boards 134, 136 and to the signal path 116 in the fuzz button egg-crate board 70. The signal path 116 leads to the circulator board 60, through signal path 116 in board 50 and through a series of RF signal paths provided from circuits on the UML board 36. RF circuitry on the UML board 36 splits the signal 168 into two portions 168a, 168b which are coupled to the radiator layer 22. It should be appreciated the circulator board 60 and the T/R module 76 operate to make the system bi-directional. That is, port 91b may act as either an input port or an output port. In this manner, signals 168 are coupled to a column of antenna elements in the tile sub-array (e.g. column 14a of tile sub-array 12b shown in FIG. 1B).

As those skilled in the art will appreciate, the layers of the UMLA (and the LMLA as well) can be fabricated from virtually any PTFE based material having the desired microwave properties. For example, the present embodiment, the printed circuit boards included in the UMLA and LMLA are fabricated with material reinforced with woven glass cloth.

Figure 7:
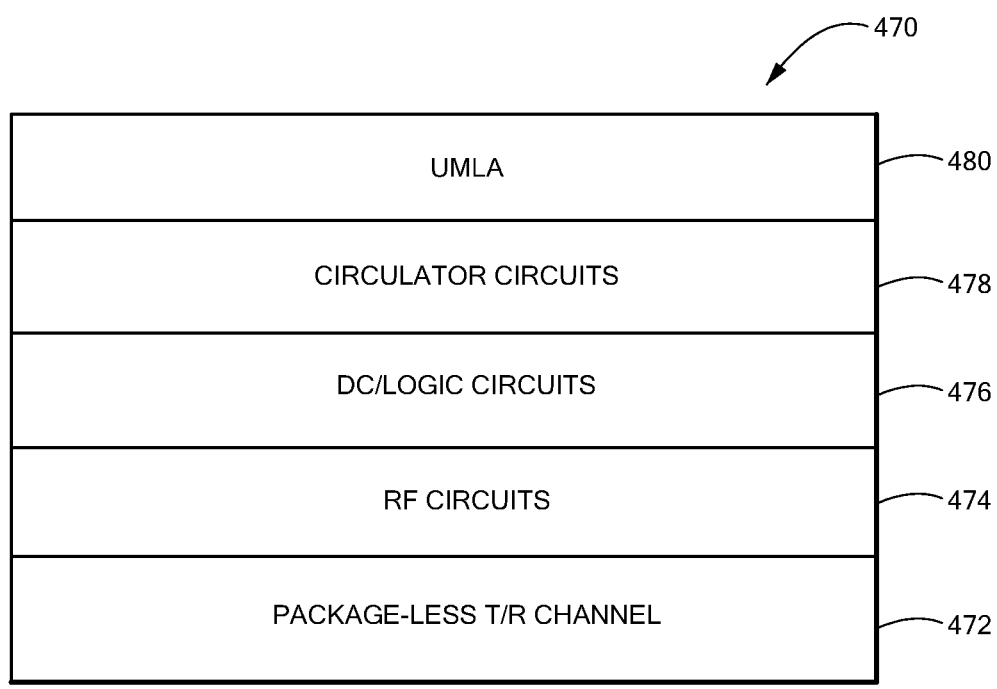
FIG. 7 is a block diagram of an alternate embodiment of a lower multi-layer assembly (LMLA) coupled to an upper multi-layer assembly (UMLA)

It should be appreciated that the LMLA integrates the package-less T/R channel and the embedded circulator layer sub-assembly. As mentioned above, in preferred embodiments, the LMLA is bonded to the UMLA using the ball grid array (BGA) interconnect approach. The package-less T/R channel eliminates expensive T/R module package components and associated assembly costs. One key building block of the package-Less LMLA is the Lower Multi-Layer Board (LMLB). The LMLB integrates RF, DC and logic signal distribution and an embedded circulator layer. All T/R channel MMIC's and components, RF, DC/Logic connectors and thermal spreader interface plate can be assembled onto the LMLA using pick and place equipment. FIG. 7 below illustrates a direct MMIC chip-attach embodiment in which MMIC chips are directly attached to a bottom layer of the LMLB for those applications in which it is desirable to have a relatively high peak transmit power per T/R channel.

Figure 2:
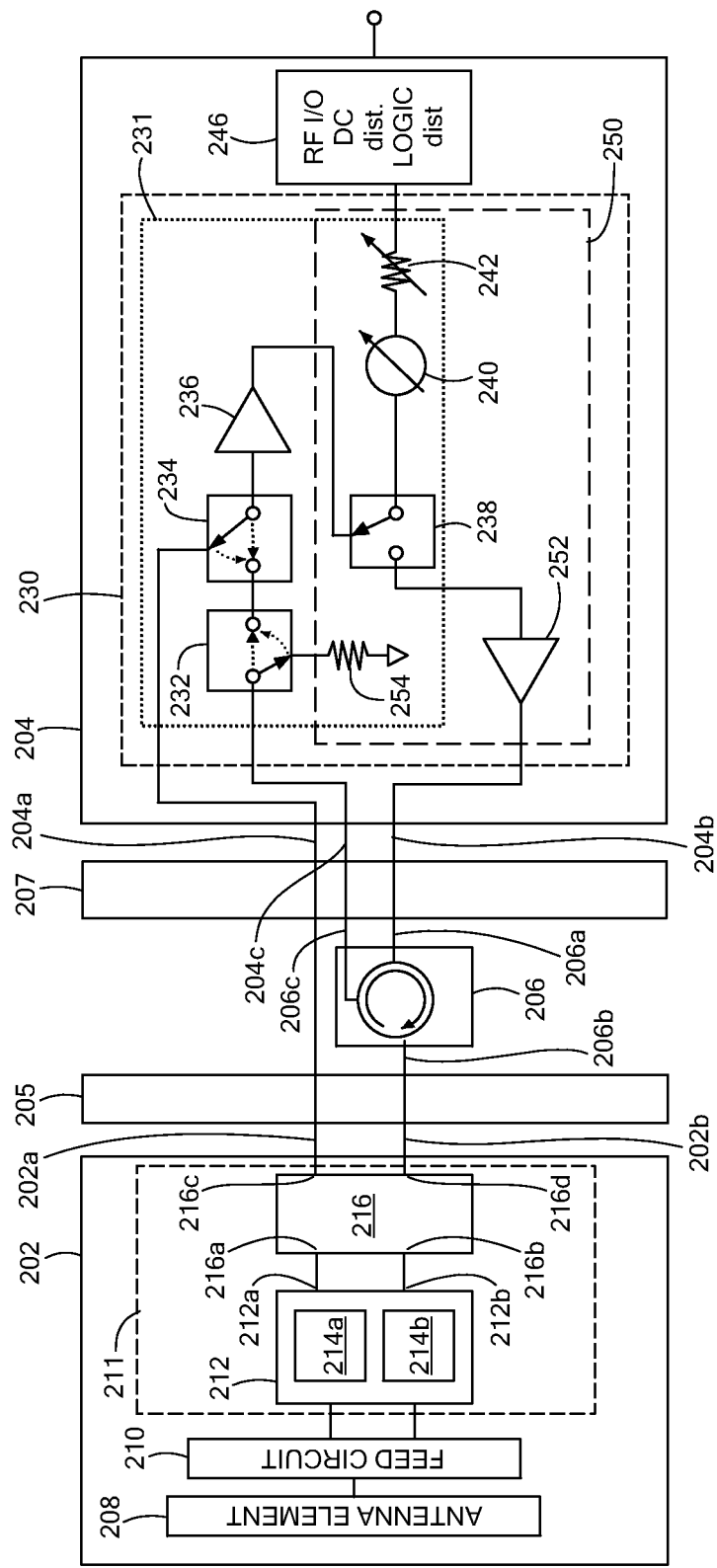
FIG. 2 is a block diagram of a portion of a dual circular polarized (CP) tile sub-array having a single transmit/receive (T/R) channel.

Referring now to FIG. 2, a portion of an illustrative tile sub-array 200 includes an upper multi-layer assembly (UMLA) 202 coupled to a lower multi-layer assembly (LMLA) 204 through a first interface 205, a circulator 206 and a second interface 207. Interface 205 may, for example, be provided as a type similar to Fuzz-button, interface 50 described above in conjunction with FIGS. 1A-1C; circulator 206 may be provided as a type similar to circulator board 60 described above in conjunction with FIGS. 1A-1C and interface 207 be provided as a type similar to fuzz-button, egg-crate interface 71 described above in conjunction with FIGS. 1A-1C.

The UMLA 202 illustrates the type of circuitry which may included in a UMLA such as the UMLA 18 described above in conjunction with FIGS. 1A-1C. The UMLA 202 includes antenna elements 208 electrically coupled to a feed circuit 210. In a preferred embodiment, the feed circuit 210 is provided as a balanced feed circuit. In this particular embodiment, the feed circuit 210 is shown as having a pair of ports coupled to an input of a polarization control circuit 211. In this particular embodiment, the polarization control circuit is provided from a power divider circuit 212 coupled to a quadrature hybrid circuit 216. Those of ordinary skill in the art will appreciate, however, that circuitry other than power divider circuits and hybrid circuits may be used to implement a polarization control circuit.

In the illustrative embodiment of FIG. 2, the divider circuit 212 is provided from a pair of Wilkinson power dividers 214a, 214b. In other embodiments, power dividers other than Wilkinson-type power dividers may also be used. Power divider circuit 212 has a pair of ports 212a, 212b coupled to respective ones of ports 216a, 216b of the quadrature hybrid circuit 216. A second pair of ports of 216c, 216d of the hybrid circuit 216 lead to UMLA ports 202a, 202b.

As mentioned above, UMLA 202 is intended to illustrate some of the circuitry included in a UMLA such as UMLA 18 described above in conjunction with FIGS. 1A-1C. It should thus be appreciated that to promote clarity in the figure and in the corresponding description, antenna elements 208 represents only those antenna elements which are coupled to the LMLA via the UMLA 202. Thus, element 208 in FIG. 2 may represent all of the antenna elements in a tile sub-array (e.g. in an embodiment in which the tile sub-array only includes a single LMLA) or alternatively, element 208 in FIG. 2 may represent only a portion of the total number antenna elements in a tile sub-array (e.g. in an embodiment in which the tile sub-array includes multiple LMLAs).

Stated differently, antenna elements 208 represent the portion of the antenna elements in a full tile sub-array which are coupled to the LMLA via the UMLA 202. As described above in conjunction with FIG. 1C, a tile sub-array (e.g. tile sub-array 12b in FIGS. 1-1C) may be provided from a single UMLA (e.g. UMLA 18 in FIGS. 1A-1C) and have multiple LMLAs coupled thereto. Alternatively, a tile sub-array (e.g. tile sub-array 12b in FIGS. 1-1C) may be provided from a single UMLA (e.g. UMLA 18 in FIGS. 1A-1B) and a single LMLA coupled thereto where the single LMLA includes the number of T/R modules needed to process all signals provided thereto from the UMLA.

It should be appreciated that LMLA 204 shown in FIG. 2 includes only a single transmit/receive (T/R) channel coupled to the antenna element 208 through the feed network 210. Thus, a single TR channel is coupled to a single antenna element. In other embodiments, however, a single TR channel may be coupled to a plurality of antenna elements. Also, although the LMLA is shown to include only a single T/R channel, in other embodiments, each LMLA may be provided having multiple T/R channels.

In practical systems a full tile sub-array will include a plurality of T/R channels and it should be appreciated that, in an effort to promote clarity in the description and the drawings, only a single channel is used in the illustrative embodiment of FIG. 2. Thus, illustration of the LMLA as including only a single T/R channel is not intended to be and should not be construed as limiting.

It should also be appreciated that FIG. 2 shows the elements of a single T/R channel which may be of the type included in one of the tile sub-arrays 12a-12x described above in conjunction with FIGS. 1-1C. Those of ordinary skill in the art will appreciate, of course, that each of the tile sub-arrays 12a-12x (FIG. 1) provided in accordance with various embodiments of the invention can, (and in general will), include a plurality of such T/R channels.

UMLA Ports 202a, 202b are coupled through interface circuit 205, circulator circuit 206 and interface 207 to ports 204a, 204b of the LMLA 204. In particular, interface circuit 206 includes signal paths through which RF signals can propagate from the UMLA to the LMLA. At least portions of the signal paths may be provided from so-called fuzz-button circuits as described hereinabove in conjunction with FIGS. 1A-1C.

The LMLA 204 includes a T/R module 230. The T/R module includes a receive signal path 231 and a transmit signal path 250. Signals from UMLA ports 202a, 202b are coupled to the receive signal path 231 at ports 204a, 204c. Signals having a first polarization are coupled from the UMLA 202 to port 204a and signals having a second different polarization are coupled from the UMLA 202 through circulator board 206 to port 204c.

The receive signal path includes a pair of single pole double throw (SPDT) switches 232, 234. The switches 232, 234 cooperate to couple a desired one of the two signals (each having different polarizations) from ports 204a, 204c to an input port of an amplifier 236 which in preferred embodiments is provided as a low noise amplifier (LNA) 236. With the switches 232, 234 positioned as shown in FIG. 2, signals at port 204a are fed to the input port of the LNA 236. With the switch arms of switches 232, 234 positioned as shown in dashed in FIG. 2, signals at port 204c are fed to the input port of the LNA.

Signals fed to the LNA 236 are appropriately amplified and coupled to a SPDT switch 238. The switch arm of the SPDT switch 238 can be placed in either a receive position or a transmit position. In a receive position (as shown in FIG. 2), the SPDT switch 238 provides a signal path from the output of the LNA 236 to an input of a phase shifter 240. Signals are coupled though the phase shifter to an amplitude control circuit 242 (e.g. an attenuator 242) to and RF I/O circuit 246. The circuit 246 couples RF, DC, and logic signals into an out of the T/R module 230.

The SPDT switch 238, the phase shifter 240 and the amplitude control circuit 242 are all also part of the transmit signal path 250. When the TR module is in a transmit mode of operation, the switch arm of the SPDT switch 238 is placed in the transmit position (i.e. so as to provide a low loss signal path between the phase shifter 240 and the input to the amplifier 252). With the arm of the switch 238 so positioned, signals from a transmit signal source (not shown in FIG. 2) are coupled through the RF portion of distribution circuit 246 through the attenuator 242, the phase shifter 240, the switch 238 to the amplifier which is preferably provided as a power amplifier 252.

The power amplifier provides an appropriately amplified signal (also referred to as a transmit signal) through interface 207 to port 206a of the circulator 206. A second port 206b of the circulator 206 is coupled through interface 205 to UMLA port 202b and a third port 206b of the circulator is coupled to the termination 254 through the switch 232.

The transmit signal is then coupled through the polarization control circuit 211 to the feed circuit 210 and finally to the antenna elements 208 which emit an RF transmit signal.

It should be appreciated that the T/R module 76 contains substantially all of the active circuitry in the tile sub-array 12. As described above in conjunction with FIGS. 1-1C, the T/R module 76 includes transmit and receive signal paths and each path is coupled to the beamformer in the LMLA 20.

In one embodiment, the LNA 236 may be provided as a compact Gallium Arsenide (GaAs) Low Noise Amplifier and the power amplifier 252 may be provided as a compact GaAs Power Amplifier. Although not shown in FIG. 2, in some embodiments, the TR module may also include a Silicon Germanium (SiGe) control monolithic microwave integrated circuit (MMIC) to control some or all of switches 232, 234, 238, phase shifter 240 or amplitude control circuit 242.

Figure 3:
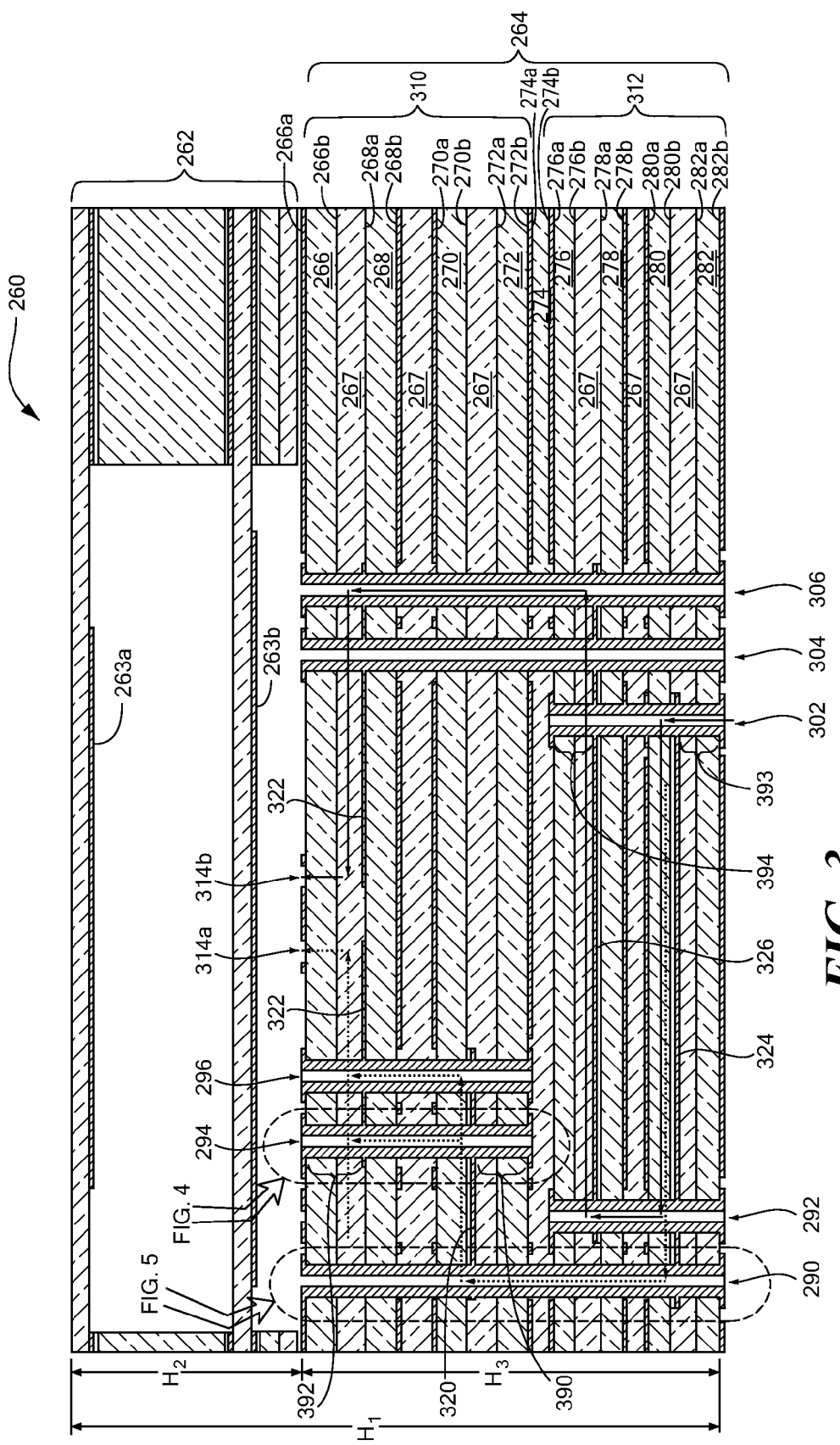
FIG. 3 is a cross-sectional view of an upper multi-layer assembly (UMLA) of the type shown in FIG. 1C.

Referring now to FIG. 3, a UMLA 260 is comprised of an egg-crate radiator assembly 262 (which may be the same as or similar to assembly 22 described above in conjunction with FIGS. 1-1C) disposed over a UMLB 264. UMLB 264 is comprised of two subassemblies 310, 312. Each of the subassemblies 310, 312 are fabricated and then coupled via layer 274 to provide the UMLB 264. In preferred embodiments, the layer 274 corresponds to a bonding layer 274. In one particular embodiment, the layer 274 corresponds to a bonding layer 274 provided as a Cyanate Ester resin B-stage (e.g. the type manufactured by W. L. Gore & Associates and sold under the trade name Speedboard-C®). The egg-crate radiator and UMLB subassemblies 262, 264 are then bonded or otherwise secured together to provide the UMLA 260. The Egg-Crate Radiator 262 and UMLA 264 may be secured together accomplished via a conductive epoxy bond film. Those of ordinary skill in the art will appreciate, of course, that any other bonding or fastening technique well known to those of ordinary skill in art and appropriate for securing together microwave circuit subassemblies may also be used. It should be appreciated that in preferred embodiments, the UMLA 260 is provided as a bonded assembly. However, in accordance with the present invention, the final bonded UMLA assembly is the result of multiple lamination, bonding and assembly processes.

The multi-step lamination, fabrication and assembly process for the UMLA results in several advantages: (a) each subassembly 262, 310, 312 may be separately tested and any subassembly 262, 310, 312 which does not meet or exceed desired electrical and/or mechanical performance characteristics may be identified and either repaired or not used to form a UMLA; (b) each subassembly 310, 312 may be separately tested and any subassembly 310, 312 which does not meet or exceed desired electrical and mechanical performance characteristics may be identified and either repaired or not used to form a UMLB; (c) separate fabrication of sub-assemblies 262, 310, 312 allows the fabrication process for each subassembly to be separately optimized for maximum yield of that subassembly; (d) since only known "good" subassemblies 310, 312 are used to fabricate UMLBs, this results in a high-yield UMLB fabrication process; (e) since only known "good" subassemblies 262, 310, 312 are used to fabricate UMLAs, this results in a high-yield UMLA fabrication process; and (f) separate fabrication of sub-assemblies 262, 310, 312 which are then secured together via bonding layers results in a wider choice of bonding adhesives and bonding temperatures for each subassembly 262, 310, 312 which leads to improved mechanical performance for each subassembly 262, 310, 312. Thus, the fabrication and assembly approach developed for the UMLA 260 produces a robust mechanical design that significantly improves manufacturing yield.

In one particular embodiment, the egg-crate radiator 262 and UMLB 264 sub-assemblies are both 0.5 m×0.5 m and thus the UMLA is 0.5 meters (m) long by 0.5 m wide (19.7 in.×19.7 in). The UMLA 260 is provided having a thickness or height $H_1$ typically of about 0.25 inches and comprises 1024 dual circular polarized RF channels with each RF channel weighing about 0.16 ounces (4.65 gr.). Furthermore, with the above-described multi-step lamination and fabrication process, each circuit layer of the UMLA can be fabricated using PWB industry standard processes and fabrication tolerances and commercially available materials.

In one embodiment, the two subassemblies 310, 312 are comprised of laminated layers of ten-mil thick Taconic RF-30 dielectric circuit boards 266, 268, 270, 272, 276, 278, 280, 282 separated by 2 mil thick layers of FEP bonding adhesive 267. As mentioned above, the bond between the egg-crate radiator 262 and UMLB 264 can be accomplished via a conductive epoxy film. In a preferred approach, the subassemblies 310, 312 are first secured together to form the UMLB 264 (i.e. boards 310, 312 are bonded using Speedboard-C® bonding adhesive between ground planes separating the subassemblies 310, 312) and the UMLB 264 is then secured to the egg-crate radiator 262 to form the UMLA 260.

It should be appreciated that UMLB 264 includes a plurality of vertical interconnects 290-306. The vertical interconnects 290-306 are also sometimes referred to herein as "RF vias." The RF vias 290-306 provide RF signal paths between circuits or signal paths provided on the different layers of the circuit boards 266-282 which comprise the UMLB 264.

For example, in subassembly 310, circuit board 270 is provided having a 50 ohm input port to 25 ohm output port Wilkinson resistive divider disposed on layer 270b thereof (only a portion 320 of the resistive divider is visible in the cross-sectional view of FIG. 3). The portion 320 of the resistive divider is coupled through RF vias 294, 296 to a stripline feed circuit 322 on layer 268a of circuit board 268 (only a portion only a portion of the feed circuit 322 being visible in the cross-sectional view of FIG. 3). The feed circuit 322 then provides RF signals to one or more slot radiators 314a. The slot radiators excite a pair of stacked patch radiators provided as part of the egg-crate radiator sub-assembly 262.

Similarly, subassembly 312 includes a 50 ohm input port to 50 ohm output port three branch quadrature hybrid circuit 324 on layer 280b of circuit board 280 and a 50 ohm input port to 25 ohm output port Wilkinson resistive divider 326 on layer 278a of circuit board 278 (only portions of the circuits 324, 326 being visible in FIG. 3). The quadrature hybrid 324 splits an input signal fed thereto and provides a ±90° phase relationship necessary to provide polarization control in the antenna (e.g. in a polarization control circuit such as that described above in conjunction with FIG. 2). In particular, the ±90° phase relationship is necessary to achieve left hand and right hand circular polarization in the antenna. The Wilkinson resistive dividers 320 and 326 split the signal again to provide spatially orthogonal signals that feed the radiators 263a, 263b in the subassembly 262. The resistors improve axial ratio performance as the array is scanned off bore sight by terminating odd-mode excitation at the Wilkinson ports feeding 294, 296 and 304, 306. The resistors can be provided, for example, as part of the copper film such as Omega-ply® or could be applied as an ink or chip resistor directly to the copper circuit on the dielectric material of the circuit board. The RF interconnects 290, 302 electrically couple together the quadrature hybrid circuits 324 and the Wilkinson divider circuits 320 and 326 provided on layers 270b, 278a.

It should be appreciated that RF interconnects 294, 296 interconnect circuits provided on layers within a single subassembly of the UMLB 264 (i.e. subassembly 310). Similarly, RF interconnects 292, 302 interconnect circuits provided on different layers within subassembly 312 (i.e. a single subassembly of the UMLB 264).

RF interconnects 290, 304 and 306, however, interconnect circuits provided on different layers within different subassemblies of the UMLB 264. For example, the RF interconnects 304, 306 electrically couple together Wilkinson divider circuits 326 provided on layers 278a and feed circuits 322 provided on layer 268a while RF interconnect 290, electrically couples together quadrature hybrid circuits 324 provided on layers 280b and divider circuits 320 provided on layer 270b. Since RF interconnect 290, as well as RF interconnects 304, 306, extend from the bottom-most layer of the UMLB 264 (i.e. layer 282b) to the top-most layer of the UMLB 264 (i.e. layer 266a), the RF interconnect 290, 304, 306 can couple circuits on any layer on the UMLB 264.

As mentioned above, for reasons including, but not limited to the cost of manufacturing the UMLA 260, it is desirable to use standard PWB manufacturing processes to fabricate subassemblies 310, 312 of the UMLB 264.

When using such manufacturing techniques, however, an RF "stub" is produced from the standard drilling and plating process to produce an RF via (as well as mode suppression vias which can be provided surrounding the RF via as is generally known). The RF stub is that part of the RF via extending above and/or below an intersection (or junction) between the RF via and a transmission line conductor (e.g. the center conductor of a stripline RF transmission line). RF stubs are produced when two (or more) RF transmission lines are connected.

In the UMLA of FIG. 3, there are four distinct RF stubs produced in the UMLB from drilling and plating an RF via to connect two inner circuit layers. First, in subassembly 310, stubs 390, 392 occur in the connection between the upper Wilkinson divider circuit layer (e.g. circuit 320 on layer 270b) and the feed circuit layer (e.g. circuit 322 on layer 268a). Second, in subassembly 312, stubs 393, 394 occur in the connection between the quadrature hybrid circuit layer (e.g. circuit 324 on layer 280b) to the lower Wilkinson divider circuit layer (e.g. circuit 326 on layer 278a). Third, the stubs 420 (FIG. 5) and 422 occur in the connection between the quadrature hybrid circuit layer (e.g. circuit 324 on layer 280b) and the upper Wilkinson divider circuit layer (e.g. circuit 320 on layer 270b). Fourth, although not shown in FIG. 3, stubs can occur as a result of connections between the lower Wilkinson circuit layer (i.e. layer 278a) and the feed circuit layer (i.e. layer 268a). It should be appreciated that the third and fourth situations occur when subassembly 310 is bonded or otherwise secured to subassembly 312. Thus, the stubs can occur as a result of the connections between circuits on different layers within in a single subassembly or as a result of the connections between circuits on different layers in multiple subassemblies.

In conventional microwave assemblies having multiple circuit boards and circuit layers, the RF stubs are removed by a separate so-called "back-drill operation" in which the stub portion of the RF via is physically removed by drilling the RF via using a drill diameter larger than the diameter of the RF via. The resulting hole remaining after the drilling operation is back-filled with a non-conductive epoxy.

his added manufacturing step (i.e. the back-drill operation) has two consequences. First, RF performance is degraded by the dielectric "stub" extending beyond the RF junction. The epoxy filling typically does not match the surrounding microwave laminate electrical properties of dielectric constant and loss and mechanical properties such as the coefficient of thermal expansion in the x, y and z directions are not matched between the epoxy and microwave laminate. Thus, the operating bandwidth of the RF interconnect is reduced and channel to channel tracking of RF performance (return loss, insertion loss) is degraded. Second, the process adds significant cost and lead time. These two consequences are a result of at least manufacturing tolerances and variations between the electrical and mechanical characteristics of the fill material and the circuit boards and reduce the system performance capabilities.

The tile sub-array of the present invention, however, eliminates back-drill and back-fill of all RF via stubs by utilizing an "RF matching pad" whereby the RF via stubs are electrically "matched" over the RF operating frequency band. The RF matching pad technique is a technique in which conductive material is provided on the blank layers (i.e., layers with no copper) or in ground plane layers (with relief areas) enabling a standard, low aspect ratio drill and plate manufacturing operation to produce an RF via that connects inner circuit layers and produces a low insertion loss RF transition across X-Band (8 GHz-12 GHz). With the RF Matching Pad approach, all RF and mode suppression vias can be are drilled and plated through the entire assembly at the same time. Manufacturing costs associated with back drill and back fill operations are completely eliminated. Moreover, RF performance has been improved because channel to channel variations due to drill tolerances and backfill material tolerances have been eliminated.

In the embodiment of FIG. 3, RF matching pads are provided from conductive disks (surrounded by an annular ring relief area) in ground plane circuit layers (i.e. layers 266*a*, 268*b*, 270*a*, 272*b*, 274*a*, 278*b*, 280*a*, and 282*b*). The RF matching pad technique is a general approach which can be applied to any RF stub extending a quarter-wavelength, or less, beyond an RF junction formed by an intersection of an RF interconnect and an RF transmission line.

Figure 4:
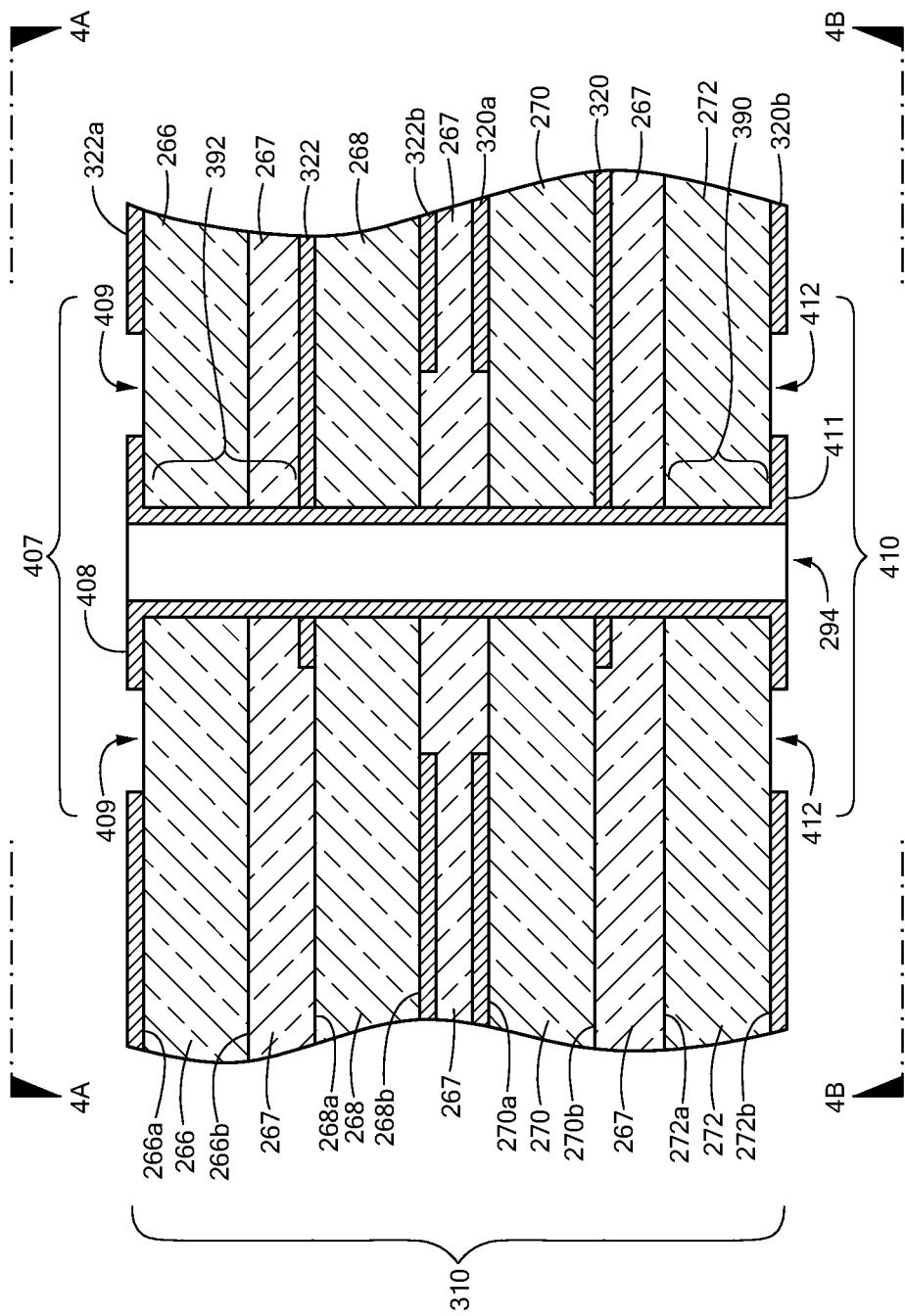
FIG. 4 is an enlarged cross-sectional view of the transition shown in FIG. 3.
Figure 4A:
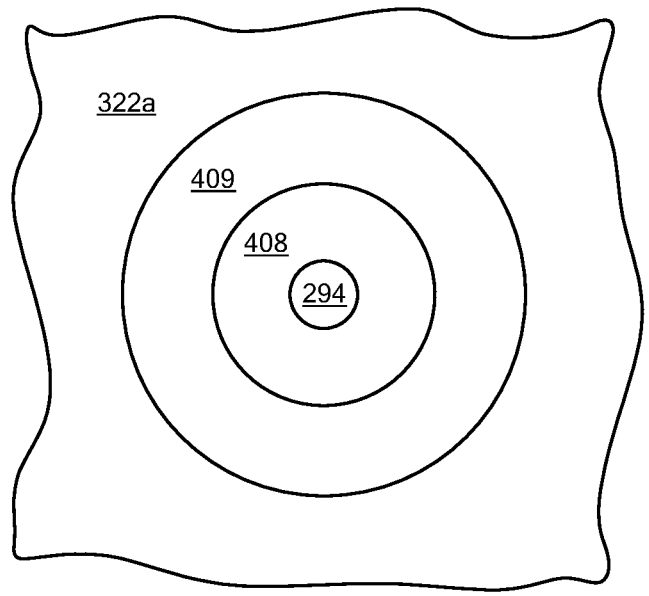
FIG. 4A is a top view of the cross-section in FIG. 4
Figure 4B:
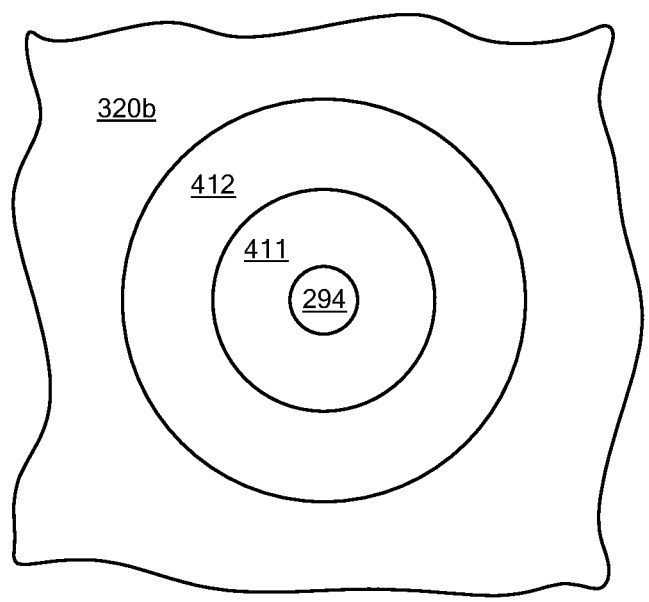
FIG. 4B is a bottom view of the cross-section in FIG. 4
Figure 4C:
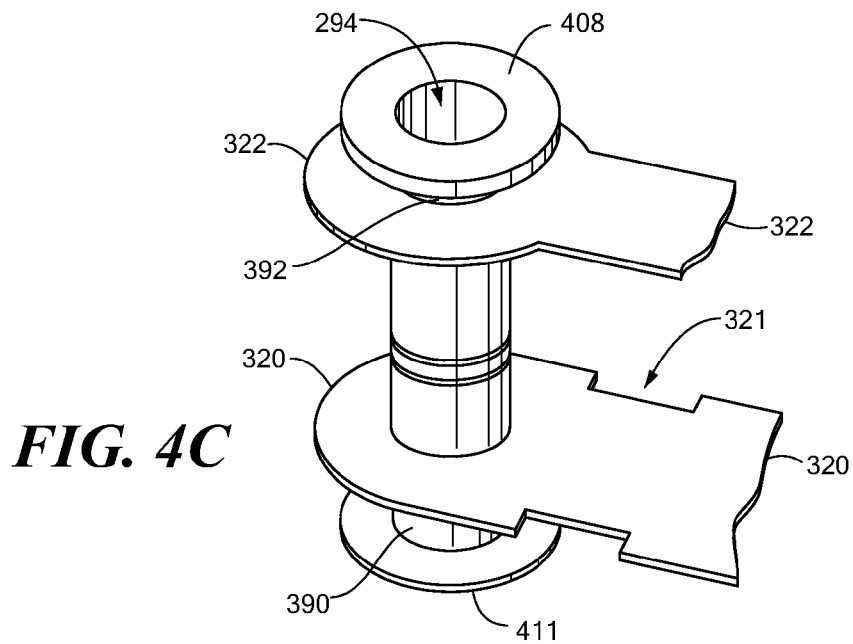
FIG. 4C is an enlarged perspective view of the RF transition shown in FIG. 3.

Referring now to FIGS. 4-4C in which like elements of FIG. 3 are provided having like reference designations, RF interconnect 294 can be clearly seen to extend from a first end on layer 266*a* of circuit board 266 to a second end on layer 272*b* of circuit board 272. As discussed above in conjunction with FIG. 3, RF interconnect 294 couples transmission line 320 on circuit layer 270*b* to transmission line 322 on circuit layer 268*a*. It should be appreciated that in the embodiment shown in FIGS. 3 and 4, the RF transmission lines 320, 322 each correspond to center conductors of a stripline transmission line with conductors 320*a*, 320*b* and 322*a*, 322*b*, respectively, corresponding to the ground planes of the stripline configuration.

A first RF stub 390 occurs as a result of the junction (or intersection) between transmission line 320 and RF interconnect 294 and a second RF stub 392 occurs as a result of the junction (or intersection) between transmission line 322 and RF interconnect 294. The first end of RF interconnect 294 is provided having an RF matching pad 407 provided from a first conductive region 408 coupled to RF interconnections 294. In this illustrative embodiment, the first conductive region of the RF matching pad is provided as a disk-shaped conductor 408. The first conductive region (e.g. disk-shaped conductor 408) is surrounded by a non-conductive relief area 409 which electrically isolates conductor 408 from the ground plane 322*a*. In this illustrative embodiment, the relief area 409 is provided as an annular ring defined by an a first inner diameter and a second or outer diameter.

Similarly, the second end of RF interconnect 294 is provided having an RF matching pad 410 provided from a first conductive region 411 surrounded by a non-conductive relief area 412 which separates ground plane 320*b* from the conductor 411.

The size and shape of the RF matching pads 407, 410 are selected to "tune" (or "match") any impedance and/or transmission characteristics of the respective RF stubs 392, 390. It should be appreciated that RF matching pad 407 need not be the same size or shape as the RF matching pad 410. That is, the diameters of the disks 408, 411 need not be the same. Also, the inner and outer diameters of the annular rings 409, 412 need not be the same. Rather, each RF matching pad 407, 410 is provided having a shape and dimensions (i.e. a size) which most effectively provides RF interconnect 294 having desired mechanical and electrical performance characteristics.

Also, as illustrated in conjunction with FIGS. 6 and 6A below, the shape of the first conductive region of the RF matching pad need not be a disk. Rather the first conductive region of the RF matching pad may be provided having any regular or irregular geometric shape. Likewise, the relief regions (e.g. regions 409, 412) need not be provided having an annular shape. Rather the relief regions may be provided having any regular or irregular geometric shape as long as the relief regions substantially electrically isolate the first conductive region of the RF matching pad (e.g. regions 408, 411) from the ground planes on the layer on which the first conductive regions occur. For example, as shown in FIG. 4, ground plane 322*a* is on the same circuit layer as conductive region 408. Thus, relief region 409 (regardless of its size and/or shape and/or the size and/or shape of the conductive region 408) should electrically isolate conductive region 408 from the ground plane conductor 322*a*.

It should also be appreciated that RF matching pads may be utilized with impedance matching sections of transmission line as illustrated by transmission line section 321 in FIG. 4C. The effect of the impedance characteristics of the matching section 321 should be taken into account when designing (i.e. selecting the shape and dimensions) of the RF matching pad 410.

Figure 4D:
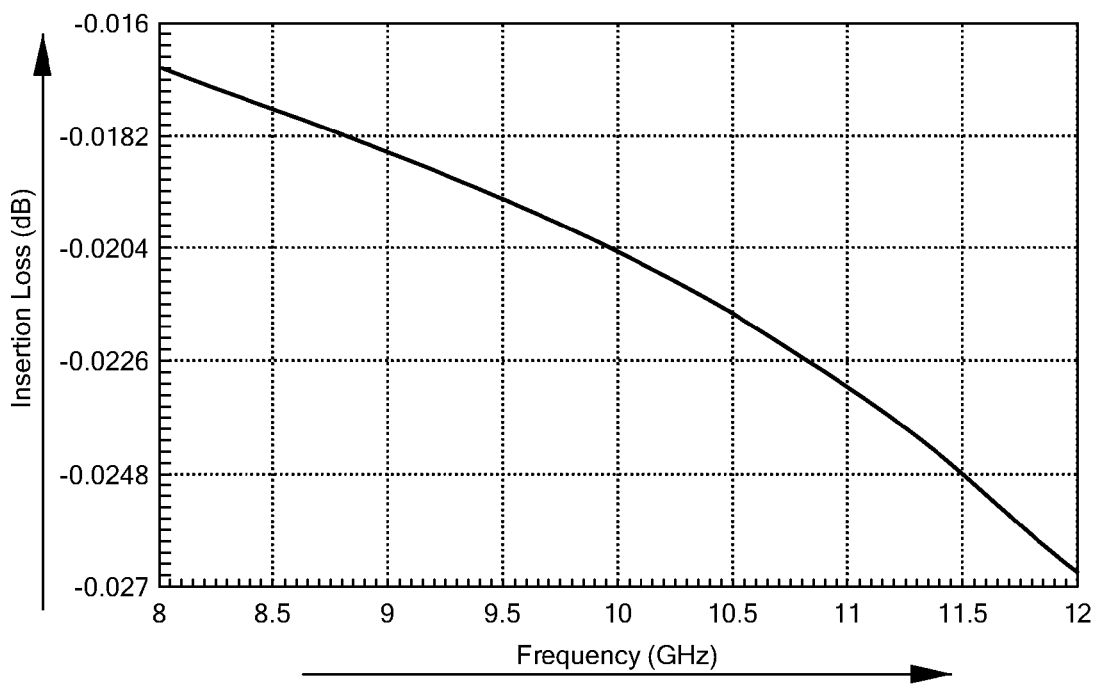
FIG. 4D is a plot of predicted insertion loss vs. frequency for the transition shown in FIGS. 3 and 4.

Referring now to FIG. 4D, a plot of insertion loss vs. frequency for the RF interconnect 294 is shown.

Figure 5:
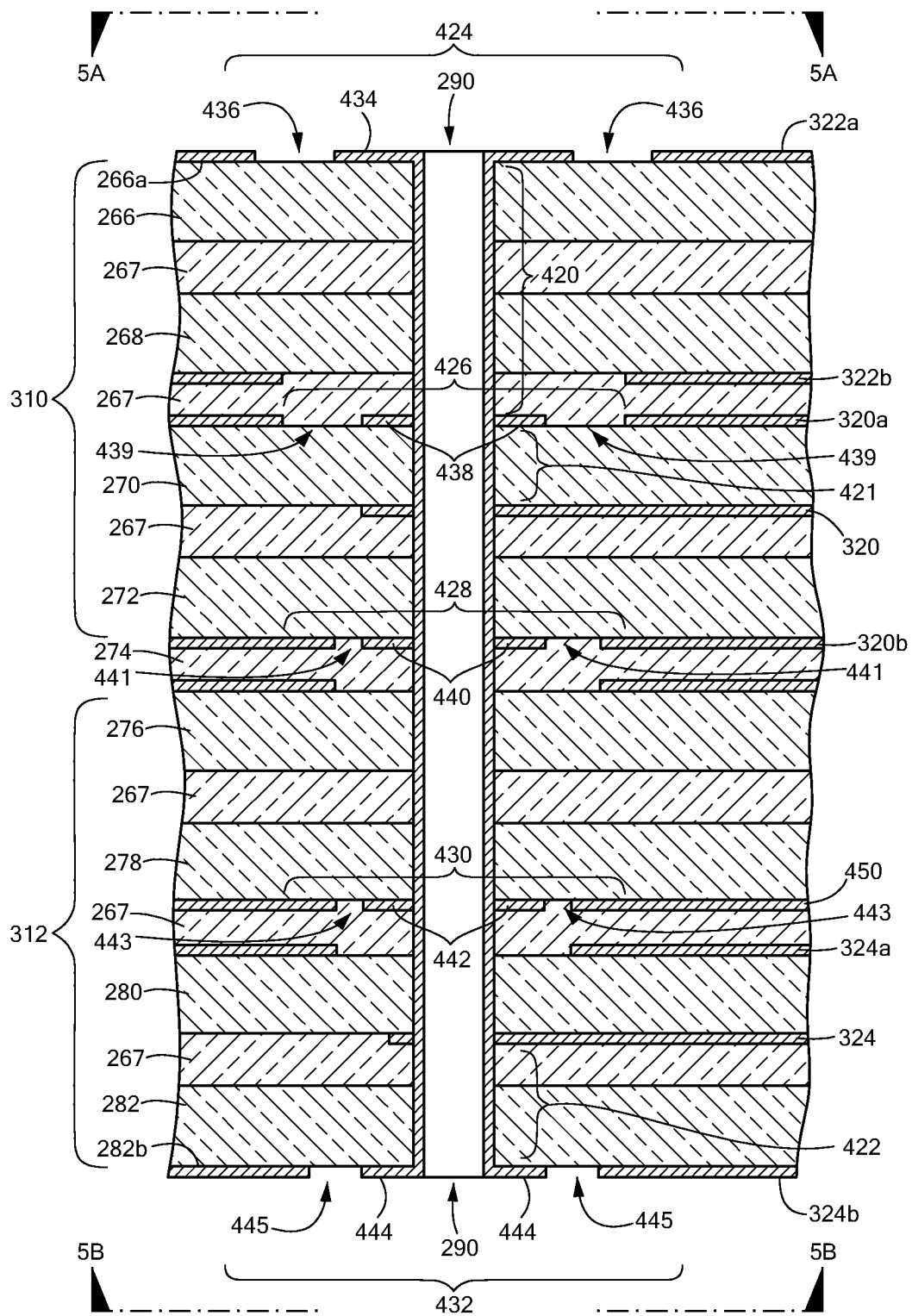
FIG. 5 is an enlarged cross-sectional view of the transition shown in FIG. 3.
Figure 5A:
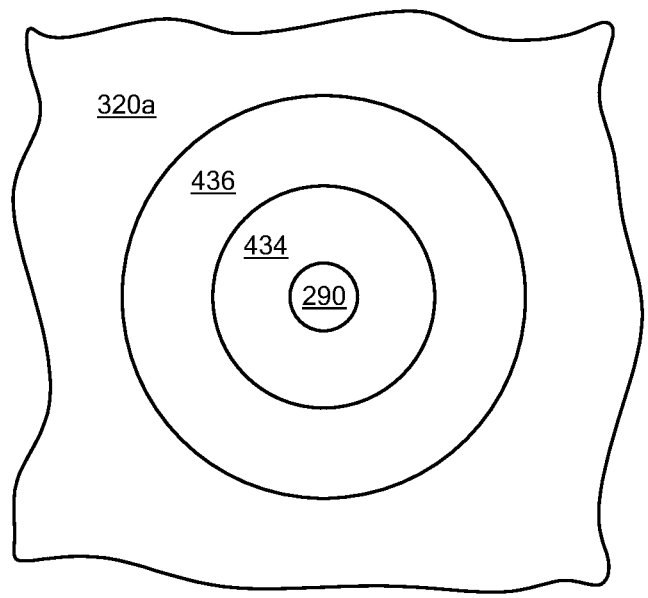
FIG. 5A is a top view of the cross-section in FIG. 5
Figure 5B:
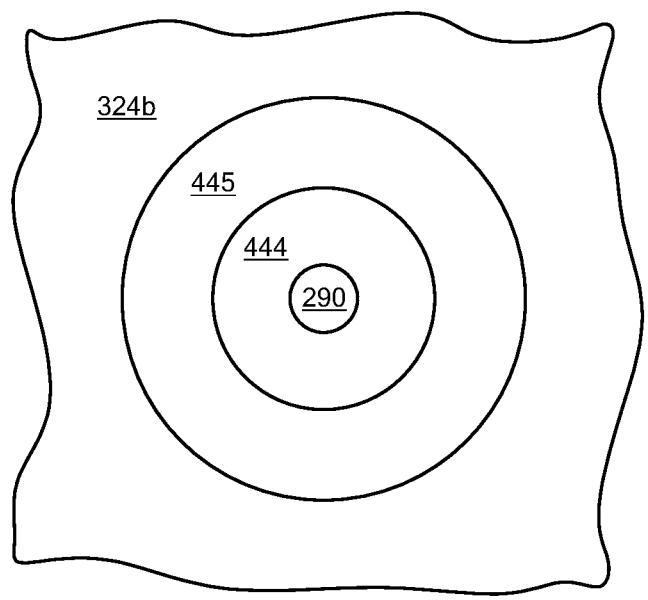
FIG. 5B is a bottom view of the cross-section in FIG. 5
Figure 5C:
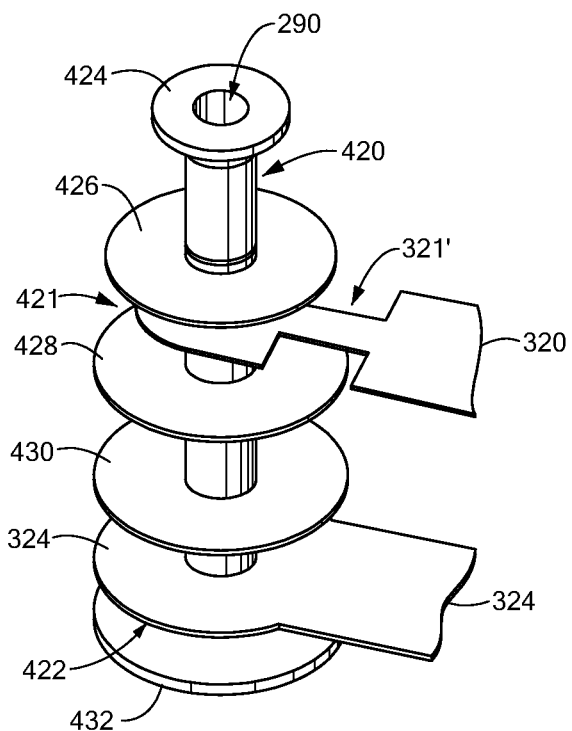
FIG. 5C is an enlarged perspective view of the transition shown in FIG. 3.

Referring now to FIGS. 5-5C in which like elements of FIG. 3 are provided having like reference designations, RF interconnect 290 can be clearly seen to extend from a first end on layer 266*a* of circuit board 266 to a second end on layer 282*b* of circuit board 282. As discussed above in conjunction with FIG. 3, RF interconnect 290 couples transmission line 320 on circuit layer 270*b* to transmission line 324 on circuit layer 280*b*. It should be noted that transmission line 320 is located in subassembly 310 and transmission line 324 is located in subassembly 312. Thus RF interconnect 290 passes through both subassembly 310 and subassembly 312.

It should be appreciated that in the embodiment shown in FIGS. 3 and 4A, the RF transmission lines 320, 324 each correspond to center conductors of a stripline transmission line with conductors 320*a*, 320*b* and 324*a*, 324*b*, respectively, corresponding to the ground planes of the stripline configuration.

RF stubs 420, 422 occur as a result of the junctions (or intersections) between the transmission line 320 and the RF interconnect 290. An additional RF stub 422 occurs as a result of the junction (or intersection) between the transmission line 324 and the RF interconnect 290.

To reduce the effect on the RF interconnect 290 due to the stubs 420-422, the RF interconnect 290 is provided having a plurality of RF matching pads 424, 426, 428, 430, 432. The RF matching pad 424 is provided from a first conductive region 434 coupled to the RF interconnect 290. In this illustrative embodiment, the first conductive region of the RF matching pad is provided as a disk-shaped conductor 434. The first conductive region 434 is surrounded by a non-conductive relief area 436 which electrically isolates conductor 434 from the ground plane 322a. In this illustrative embodiment, the relief area 436 is provided as an annular ring defined by a first (or inner) diameter and a second (or outer) diameter.

Similarly, RF matching pads 426, 428, 430, 432 each include respective ones of first conductive region 438, 440, 442, 444 surrounded by respective ones of non-conductive relief areas 439, 441, 443, 445. The relief areas 439, 441, 443, 445 each electrically isolate the conductive regions 438, 440, 442, 444 from the ground planes 320a, 320b, 450, 324b, respectively.

The size and shape of the RF matching pads 424-432 are selected to "tune" (or "match") any impedance and/or transmission characteristics of the respective RF stubs 420, 421, 422. It should be appreciated that RF matching pads need not be the same size or shape as each other. That is, the diameters of the disks 434, 438, 440, 442, 444 need not be the same. Also, the inner and outer diameters of the annular rings 436, 439, 441, 443, 445 need not be the same. Rather, each RF matching pad 424-432 is provided having a shape and dimensions (i.e. a size) which most effectively provides RF interconnect 290 having desired mechanical and electrical performance characteristics.

Also, as illustrated in conjunction with FIGS. 6 and 6A below, the shape of the first conductive region of the RF matching pads 424-432 need not be a disk. Rather the first conductive region of the RF matching pad may be provided having any regular or irregular geometric shape. Likewise, the relief regions need not be provided having an annular shape. Rather the relief regions may be provided having any regular or irregular geometric shape as long as the relief regions substantially electrically isolate the first conductive region of the RF matching pad from the ground planes on the layer on which the first conductive regions occur. For example, as shown in FIG. 5, ground plane 320a is on the same layer as conductive region 438. Thus, relief region 439 (regardless of its size and/or shape and/or the size and/or shape of the conductive region 426) should electrically isolate conductive region 438 from the ground plane conductor 320a.

It should also be appreciated that RF matching pads may be utilized with impedance matching sections of transmission line as illustrated by transmission line section 321' in FIG. 5C. The effect of the impedance characteristics of the matching section 321' should be taken into account when designing (i.e. selecting the shape and dimensions) of the RF matching pads.

Figure 5D:
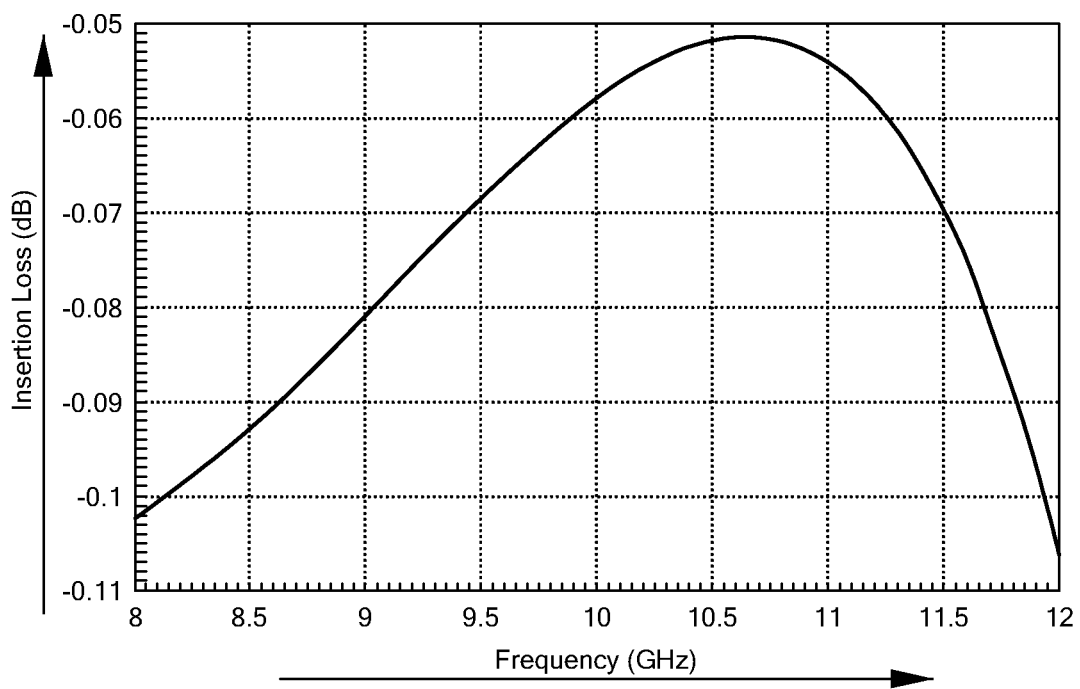
FIG. 5D is a plot of predicted insertion loss vs. frequency for the transition shown in FIGS. 3 and 4.

Referring now to FIG. 5D, a plot of insertion loss vs. frequency for the RF interconnect 290 is shown.

Figure 6:
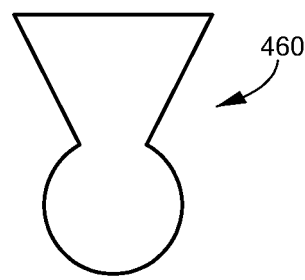
FIG. 6 is a plan view of an illustrative geometry for a conductive region or a relief area of an RF matching pad.
Figure 6A:
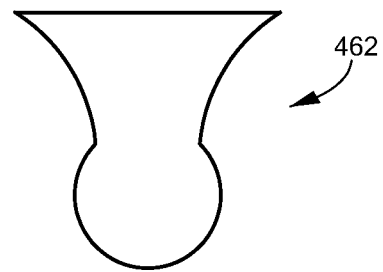
FIG. 6A is a plan view of an illustrative geometry for a conductive region or a relief area of an RF matching pad.

Referring now to FIGS. 6 and 6A, a pair of geometric shapes 460, 462 are illustrative of the shapes in which the first conductive region and/or the relief areas of the RF matching pads may be provided. As mentioned above, the first conductive region of the RF matching pad (e.g. regions 408, 411 in FIGS. 4A, 4B or regions 434, 438, 440, 442, 444 in FIG. 5) may be provided having any regular or irregular geometric shape. Likewise, the relief regions (e.g. regions 409, 412 in FIGS. 4A, 4B or regions 436, 439, 441, 443, 445 in FIG. 5) need not be provided having an annular shape. Rather, the relief regions may be provided having any regular or irregular geometric shape as long as the relief regions substantially electrically isolate the first conductive region of the RF matching pad from the ground planes on the layer on which the first conductive regions occur. Thus, regardless of their size and/or shape, the relief regions should electrically isolate the conductive regions from the ground plane conductor.

The conductive regions and relief regions of the RF matching pads may be provided having any shape including but not limited to rectangular, square, circular, triangular, rhomboid and arc shapes. Also, the conductive regions and relief regions of the RF matching pads may be provided from combinations of any of the above shapes. Also, the conductive regions and relief regions of the RF matching pads may be provided from combinations of any of regular and irregular shape.

Referring now to FIG. 7, a tile subarray 470 includes a T/R module circuit board 472 having disposed thereover an RF circuit board 474. Disposed over the RF circuit board is a DC/Logic circuit board 476. Disposed over the DC/Logic circuit board is a circulator circuit board 478. Each of the T/R module circuit board, RF circuit board, DC/Logic circuit board and a circulator circuit perform substantially the same functions as the T/R module circuits RF circuits, DC/Logic circuits and circulator circuits described above in conjunction with FIGS. 1A-2.

Lastly, disposed over the circulator circuit board is a UMLA 480. The UMLA may be the same as or similar to the UMLAs described above in conjunction with FIGS. 1A-5.

The illustrative embodiment of FIG. 7 illustrates that the T/R modules 472 may be directly attached to a bottom layer of an LMLB. That is, direct MMIC chip-attach approach (MMIC chips not shown) to a bottom layer of the LMLB may be used. This approach may be advantageous in those applications in which relatively high peak transmit power per T/R channel is desired.

Figure 8:
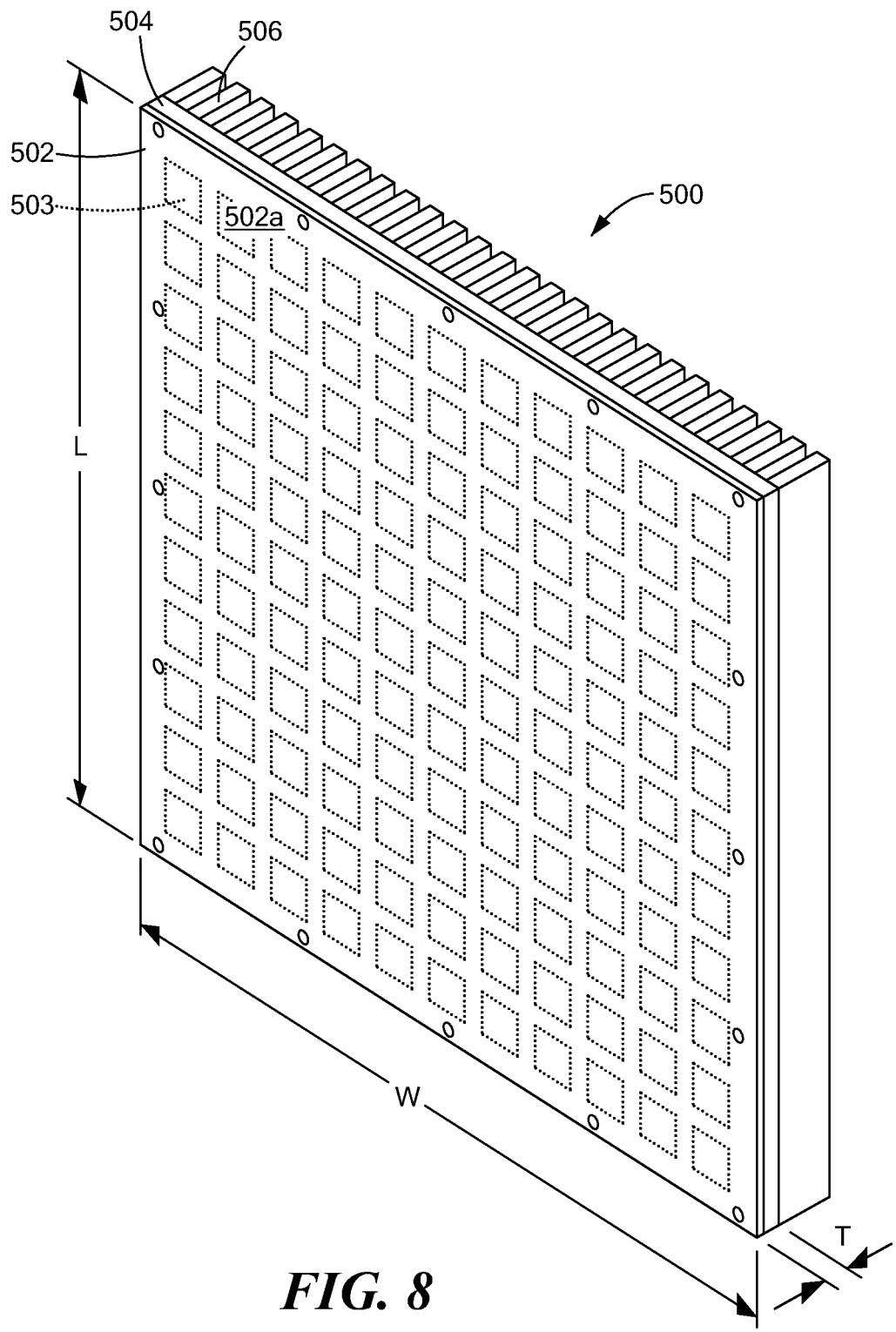
FIG. 8 is an isometric view of a panel array.
Figure 8B:
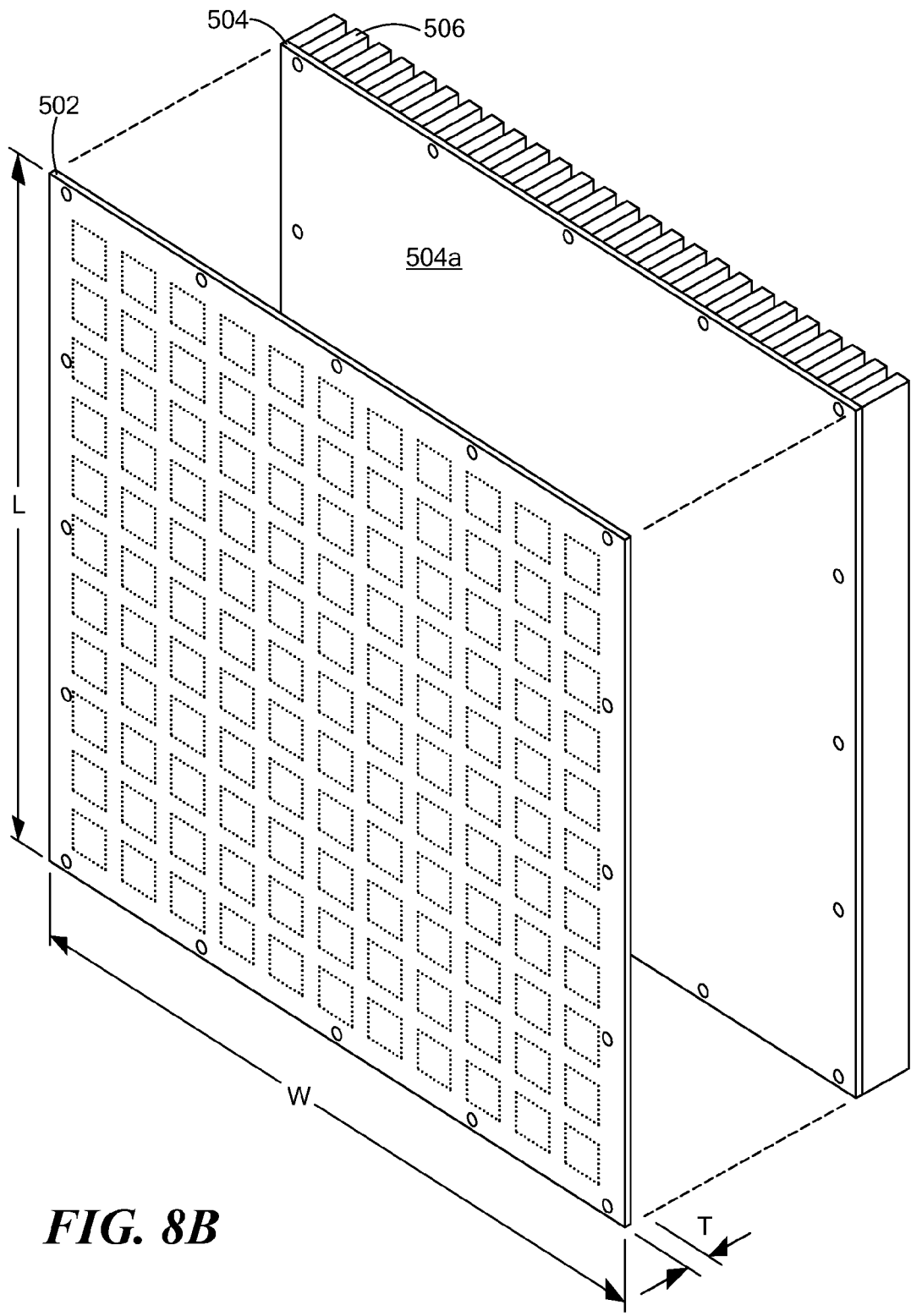
FIG. 8B is an exploded isometric view of a panel array.
Figure 8C:
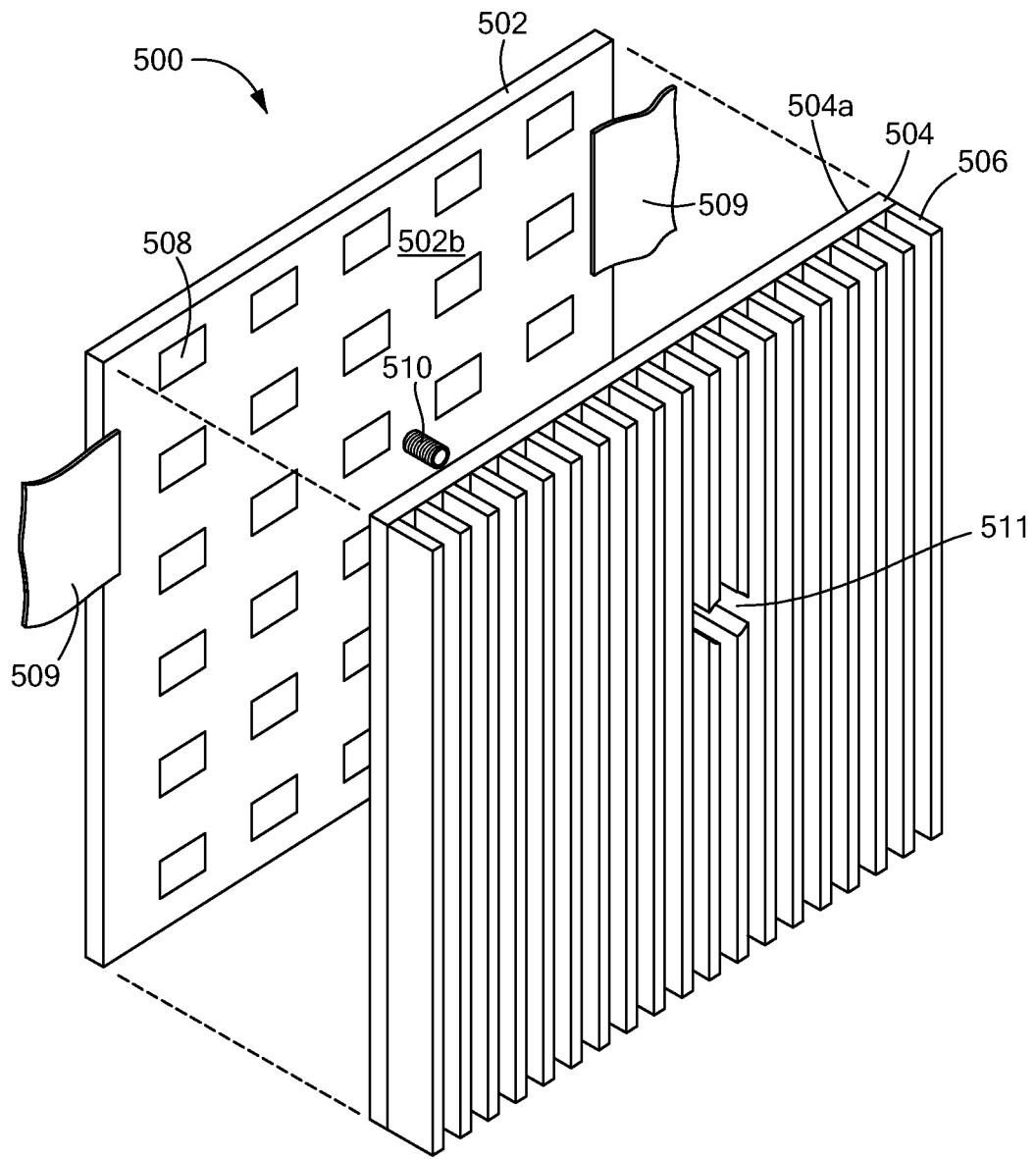
FIG. 8C is an exploded isometric view of a panel array.
Figure 8D:
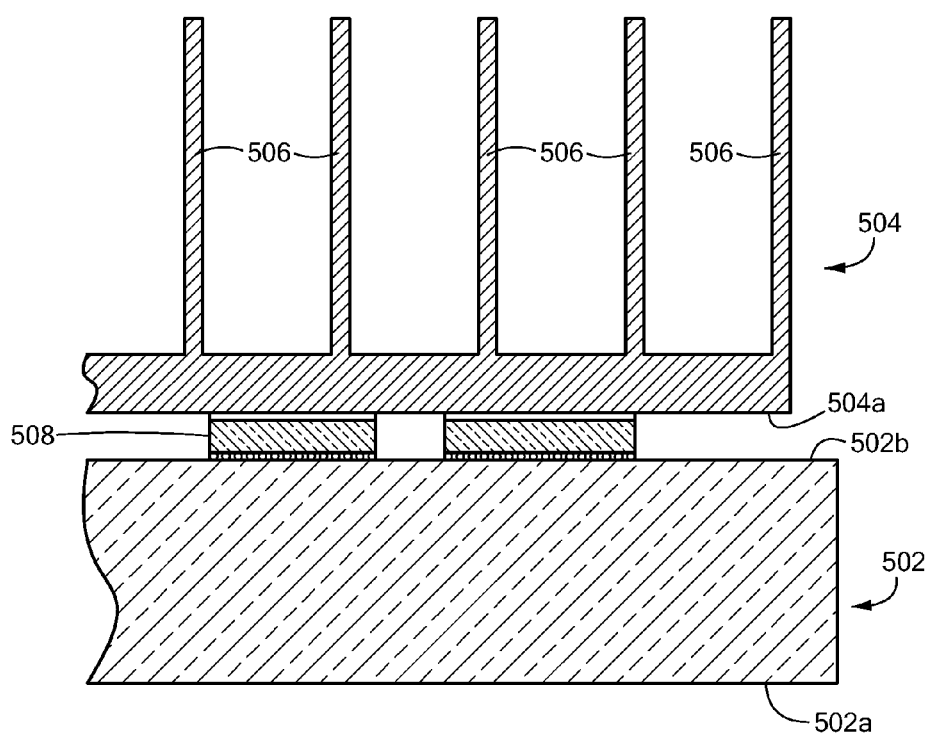
FIG. 8D is a cross-sectional view taken across lines 8D-8D of the panel array shown in FIG. 8A.

Referring now to FIGS. 8-8D in which like elements are provided having like reference designations throughout the several view, an illustrative active, electronically scanned array (AESA) having a panel architecture includes an integrated heatsink-panel assembly denoted 500. Panel assembly 500 includes a panel array 502 (or more simply, panel 502) having a heatsink 504 coupled thereto.

As will be described in detail in conjunction with FIG. 9 below, panel 502 is provided from a PTFE multilayer PWB comprised of a plurality of circuit boards. Panel 502 has a thickness T and is generally planar and has a plurality of antenna elements 503 (shown in phantom since they are not directly visible in FIG. 8) disposed to radiate through a first surface 502a thereof. The multilayer PWB includes RF, power and logic circuits and is provided from a single lamination and single drill and plate operations. The single lamination and single drill and plate operations result in a low-cost, low profile (i.e. thin) panel. Thus the PWB from which panel 502 is provided is a low cost mixed signal PWB (i.e. mixing RF, digital and power signals in a single PWB).

All active and passive electronics 508 (FIG. 8C) are disposed on a second surface 502b (FIG. 8C) of panel 502. In one embodiment, the electronics 508 are provided as MMIC flip-chip circuits. Utilizing panel-level packaging of T/R channels eliminates the need for individual T/R channel packaging. It should be appreciated that in one embodiment, the active and passive components 508 are provided as surface mount components and that a metal cover (not shown) is bonded over the components 508 and an environmental conformal coating is then applied. One or more "flex" circuits 509 (FIG. 8C) are coupled to the panel. Use of embedded "flex" circuits 509 for DC and logic signals eliminates the expense of DC, logic connector material and assembly cost. Also coupled to the panel are one or more RF connectors 510 (only one RF connector being shown in FIG. 8C to promote clarity in the drawing and description).

A first surface 504*a* (FIGS. 8B, 8C) of heat sink 504 is coupled to a second surface 502*b* (FIG. 8C) of the PWB 502. The heat sink has an opening 511 provided therein through which RF connect or 510 is disposed (see FIG. 8A). In a preferred embodiment, heat sink 504 is directly bonded to the flip chips 508. Thus, a surface of the heat sink is disposed over and configured to be in thermal contact with a plurality of electronics 508 (i.e. both passive and active circuits) disposed on an external surface of a multilayer mixed signal PWB—e.g. panel 502. A second surface 504*b* (FIG. 8D) of the heat sink is provided having a plurality of heat spreading elements 506 projecting therefrom. In the illustrative embodiment of FIG. 8C, the heat spreading elements 506 are provided as fins.

Coupling a heat sink directly to the flip chip circuits disposed on the external surface of the panel (PWB) reduces the number of thermal interfaces between the heat sink 504 and the flip chip circuits 508 and thus reduces the thermal resistances between heat generating portions of the flip chip circuits and the heat sink. By reducing the thermal resistance between the heat sink and the heat generating portions of the flip chip circuits, it is possible to air cool the panel.

This is in contrast to prior art approaches where liquid cooling or large air blowers or movers are used.

By using an air cooled approach (vs. using one of the prior art blower or liquid cooling approaches), an affordable approach to cooling an active panel is provided. Furthermore, by using a single heat sink to cool multiple flip chip mounted circuits (vs. the prior art multiple, individual "hat sink" approach), the cost (both part cost and assembly costs) of cooling a panel is reduced since it is not necessary to mount individual heat sinks on each flip chip circuit.

As mentioned above, in one embodiment, the flip chip circuits are provided as monolithic microwave integrated circuits (MMICs) and the heat sink heat spreading elements are provided as fins or pins.

In one embodiment, the heat sink may be provided as an aluminum finned heat sink having a mechanical interface between a surface thereof and a plurality of flip-chip MMICs disposed on a surface of the panel 502. Air cooling of such a heat sink and active panel eliminates the need for expensive materials (such as diamond or other graphite material) and elimination of heat pipes from the thermal management system.

In one embodiment, the active panel 502 is provided as a multilayer, mixed signal printed wiring board (PWB) with flip-chip attached MMICs. A single heat sink has a first surface mechanically attached to the PWB so as to make thermal contact with the back of each flip-chip MMIC. Such an active panel architecture can be used to provide active panels appropriate for use across RF power levels ranging from mW per T/R channel to W per T/R channel, with a duty cycle in the range of about a twenty-five percent (25%).

As a result of being able to use a common panel architecture and thermal management architecture in systems having multiple, different, power levels and physical sizes, it is also possible to use common fabrication, assembly and packaging approaches for each of the systems. For example, both low power and high power active, electronically-scanned arrays (AESAs) can utilize common fabrication, assembly and packaging approaches. This leads to large cost savings in the manufacture of AESAs. Thus, the systems and techniques described herein can make the manufacture of AESAs more affordable.

It is desirable to minimize the number of thermal interfaces between the flip chip circuit and the heat sink. Thus, in one embodiment, direct mechanical contact is used between the flip-chip MMICs and a surface of a finned heat sink. In other embodiments, an intermediate "gap-pad" layer may be used between the flip-chip circuits (e.g. MMICs) and the surface of the heat sink. In some embodiments, use of such a gap-pad layer facilitates mechanical assembly of the array as well as disassembly of the array in the event certain circuits or circuit boards must be re-worked (i.e. in the event a refinishing operation or repair of an electronic assembly must be performed).

In one embodiment, PWB 502 includes a stacked patch antenna panel configured for operation in the X-band frequency range and having a thickness (T) in the range of about 0.1 inch to about 0.4 inch with 0.2 in being preferred and having a width (W) of 5 inches (in) a length (L) of 10 in with 128 patch elements (not visible in FIG. 8).

The panel-heat sink arrangement described herein efficiently transfers heat (i.e. thermal energy) from an active panel (and in particular from active circuits mounted on the active panel) to the heat sink. By reducing the number of thermal interface between the active circuits and the heat sink, a rapid transfer of thermal energy from the active circuits to the heat sink is achieved.

Figure 9:
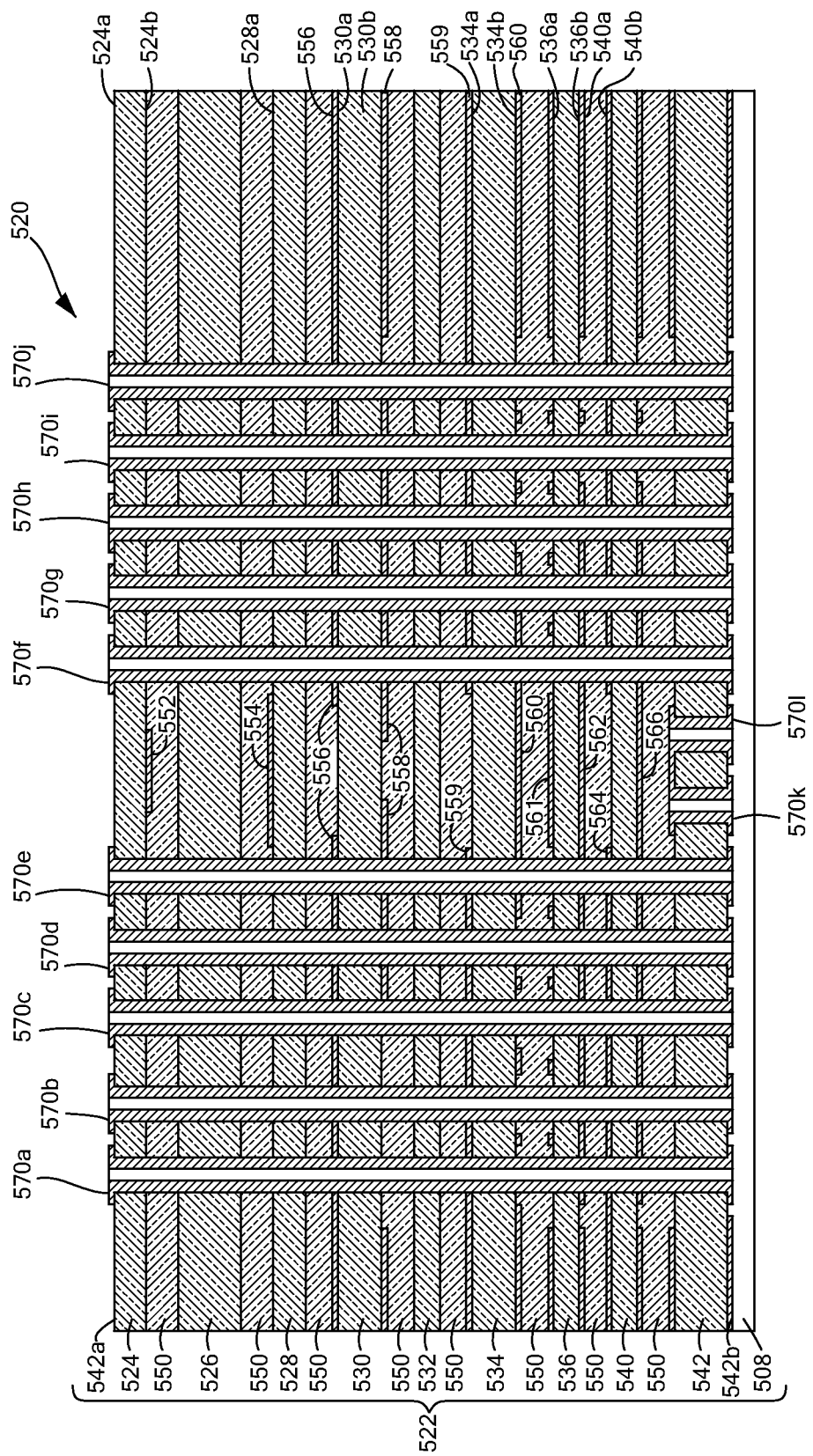
FIG. 9 is a cross sectional view of a multi-layer printed wiring board (PWB).

Referring now to FIG. 9, a portion of panel array 520 which may be the same as or similar to panel array 502 in FIG. 8 is shown. Panel array 520 is provided from a multilayer PWB 522 comprised of nine circuit boards 524-542 with each board having first and second opposing layers. Thus, PWB 522 has eighteen layers some of which correspond to circuit layers, some of which correspond to ground plane layers and some of which are blank layers (i.e. no conductive material which exists for an electrical circuit purpose). Disposed between each circuit board is a bond material 550 (a so-called "pre-preg" bonding epoxy).

Circuit board 524 has a first or upper patch antenna element 552 disposed on surface 524*b* and circuit board 528 has a second or lower patch antenna element 554 disposed on surface 528*a*. Circuit board 526 acts as a spacer between antenna elements 552, 554 such that antenna elements 552, 554 thus form a so-called stacked path antenna element. Conductors 556 on layer 530*a* of circuit board 530 forms a slot feed for the stacked patch antenna elements 552, 554 while conductors 558 on layer 530*b* of circuit board 530 form RF Wilkinson power divider and RF beamformer circuits. Conductors 559 on layer 534*a* correspond to a ground plane while conductors 560 on layer 534*b* of circuit board 534 form a second set of RF Wilkinson power divider and RF beamformer circuits. Conductors 561 on layer 536*a* and conductors 562 on layer 536*b* correspond to digital signal circuit paths which lead to digital circuits and electronics. Conductors 564 on layer 540*a* correspond to an RF ground plane and conductors 566 on layer 540*b* correspond to power circuit paths which lead to power circuits and electronics, digital signal circuit paths which lead to digital circuits and electronics and RF ground planes. Circuit board 542 supports a co-planar waveguide circuit as well as RF ground circuits and RF circuit pads.

PWB 522 also includes a plurality of plated through holes 570*a*-570*l*, generally denoted 570. Each of the plated through holes 570*a*-570*j* extend from layer 524*a* (i.e. the top most layer of PWB 522) to layer 542*b* (i.e. the bottom most layer of PWB 522). Plated-through holes 570*k*, 570*l* extend through only a single circuit board (i.e. circuit board 542). Certain ones of plated-through holes 570 form a waveguide cage around the stacked patch antenna elements 552, 554. Thus, the radiating elements are provided as part of a unit cell with plated-through holes 570 effectively forming a waveguide cage about each unit cell. It should be appreciated that only a portion of a waveguide cage is shown in FIG. 9.

As noted above, waveguide cages are formed from plated-through holes 570 which extend from a first outermost layer of the PWB (e.g. a top layer of the PWB) to a second outermost layer of the PWB (e.g. a bottom layer of the PWB). Thus, the waveguide cages extend through the entire thickness of the multilayer PWB 522.

At RF frequencies, the waveguide cage electrically isolates each of the unit cells from other unit cells. Such isolation results in improved RF performance of the panel array. The waveguide cage functions to perform: (1) suppression of surface wave modes (which can cause scan blindness due to coupling between radiating elements on dielectric slab and a guided mode supported in the dielectric slab); (2) suppression of a parallel plate mode (due to an asymmetric RF stripline configuration); (3) RF isolation between unit cells; (4) isolation of RF circuits from logic and power circuits (which consequently results in the ability of RF, power and logic circuits to be printed on the same layers thus reducing the total number of layers in the multi-layer panel); (5) vertical transitions for several RF via transitions for a feed layer and RF beamformer (this also saves space in a unit cell and allows tighter unit cell packing which is crucial when it is desirable for an array to operate over large scan volumes). In one illustrative embodiment, the waveguide cage serves as the vertical transition for RF signal distribution for the Wilkinson Feed transition between layers 534b and 530b and an RF beamformer transition between layers 534b and 542b.

Lastly, active electronics and passive components 508 (FIG. 8C) are disposed over layer 542b. The panel array thus combines RF, logic and DC distribution in a highly integrated PWB 522. The top PWB layer (i.e. layer 524a) is the RF radiator side and the bottom layer (i.e. layer 542b) is the side to which are assembled (and electrically coupled) active electronics and passive components.

In general overview, there are five basic steps in the fabrication and assembly of the panel array PWB 522. First, image and etch all layers on circuit boards 524-542 which comprise PWB 522. It should be appreciated that each circuit board 524-542 may be provided having a different thickness. Also, circuit boards 524-542 may each be provided from different materials. The particular material and thickness for each board 524-542 is selected based upon a variety of factors including the types of circuitry disposed on the circuit board. In addition, large or oversized circuit pad diameters are formed and electrically tuned (e.g. using the above-described matching disc technique) to improve mechanical alignment between the plated through holes 570 and the associated internal pads found on layers needing RF, power and/or logic circuits. It should be appreciated that it is necessary to align RF pads, DC power pads and logic pads disposed on predetermined ones of the layers so that a single drill and plate operation may be used. That is, RF pads on each of the plurality of layers are aligned as much as possible so that each drill operation intersects RF pads on a plurality of the different layers. Likewise, power pads on each of the plurality of layers are aligned as much as possible so that each drill operation intersects power pads on a plurality of the layers. Likewise, logic pads on each of the plurality of layers are aligned as much as possible so that each drill operation intersects logic pads on a plurality of the layers. Thus, it is desirable to align RF, power and logic pads as much as possible for the single drill and plate operation (i.e. RF pads are aligned with RF pads, power pads are aligned with power pads and logic pads are aligned with logic pads).

Each layer is inspected prior to lamination to improve yield. Next, all circuit boards which comprise the PWB are laminated. A single lamination step eliminates sub-assembly alignment risk, thus reducing production time and cost. The drill and plate operation are then performed. All RF, logic and power interconnections are made in a single drill operation and subsequent plate operation and all holes are filled producing a solid, multi-layer laminate. Since the RF, power and logic pads are all aligned, this technique provided separate vias for RF, power and logic signals (i.e. some vias are RF signal vias, some vias are power signal vias and some vias are logic signal vias). Lastly, active and passive components are disposed on a bottom side of the panel (e.g. via a pick-and-place operation) and then a solder re-flow operation is performed.

In one particular embodiment for a panel array operating in the X-band frequency range, the panel is provided having a length (L) of approximately 11.2 in., a width (W) of about 8.5 in. and a thickness (T) of about 0.209 in. The panel array includes 128 unit cells arranged in 8 rows and 16 columns. Circuit boards 524, 530, 534, 542 are provided as woven glass reinforced laminates with boards 524, 530, 534 having a thickness of about 0.0100 in. and board 542 having a thickness of about 0.0200 in. The circuit boards 524, 530, 534, 542 may each be provided as ceramic loaded/PTFE boards manufactured by Taconic and identified as RF-60A. Those of ordinary skill in the art will appreciate, of course, that other materials having the same or substantially similar mechanical and electrical characteristics may also be used.

Circuit boards 526, 532, 536 and 540 are provided as woven glass reinforcement laminates with boards 532, 536, 540 having a thickness of about 0.0100 in. and board 526 having a thickness of about 0.0300 in. The circuit boards 526, 532, 536, 540 may each be provided as a BT/Epoxy/PTFE woven glass reinforced laminate manufactured by Taconic and identified as TLG-29. Those of ordinary skill in the art will appreciate, of course, that other materials having the same or substantially similar mechanical and electrical characteristics may also be used.

Circuit board 528 is provided as a woven glass reinforced laminate having a thickness of about 0.0110. Board 528 may be provided as a ceramic loaded/PTFE woven glass reinforced laminate manufactured by Taconic and identified as RF60A. In some embodiments, other materials such as $CE_r$-10 may also be used. Those of ordinary skill in the art will appreciate, of course, that other materials having the same or substantially similar mechanical and electrical characteristics may also be used.

Bonding layers 550 may each be provided as Taconic BT/Epoxy prepeg identified as TPG-30. Other bonding materials having similar mechanical and electrical properties may, of course, also be used. The TPG-30 material has a bonding temperature of about 392° F. (200° C.) and a bonding force of about 450 psi. In one embodiment, two bond layers 550 may be used between boards 540 and 542.

The copper deposited or otherwise provided on the various dielectric layers is provided as ½ oz copper having a nominal pre-plating thickness of about 0.0007 in.

Each via hole 570 is provided having a diameter of about 0.020 in. which are then plated over during the plating step. It should be noted that vias 570K, 570L may be provided having a diameter of about 0.020 in and may be filled with TPG-30 resin during lamination and thus may not be plated due to the existence of such resin. Each unit cell has approximately 74 via holes 570 surrounding it. Thus, in a panel having 128 unit cells, there are approximately 9472 via holes per board. Other diameters may, of course, also be used. The particular diameter to use in any application will be selected in accordance with the needs of that particular application. It should, of course, be understood that plated through holes 570*k*, 570*l* can be drilled and plated with a controlled drill operation after the single lamination process because the aspect ratio is within a range which allows such a controlled drill operation (only going through one board). The high aspect ratio of the other plated through holes 570 do not allow this.

In more detail, the fabrication of a panel array provided from a multilayer printed wiring board (PWB) begins by imaging all layers on each circuit board comprising the PWB (e.g. each of boards 524-542) and then etching all layers on each circuit board comprising the PWB including etching RF matching pads. In a preferred embodiment, an inspection is performed on each etched layer. Next, each of the plurality of circuit boards (including the pre-preg material between each of the circuit boards) are aligned. Once the circuit boards and pre-preg materials are aligned, the circuit boards are laminated in a single lamination step to provide a laminated circuit board assembly. Laminating comprises heating the circuit boards to a predetermine temperature and applying a predetermined amount of pressure to the circuit boards for a predetermined amount of time. After the lamination is complete, a drilling operation is performed in which holes are drilled in the laminated circuit board assembly. Significantly, each of the holes are drilled through the entire laminated circuit board assembly (i.e. from the top most layer to the bottom most layer of the laminated circuit board assembly). Once the holes are drilled, the holes are plated to make then electrically conductive. The holes can also be filled to provide a solid multi-layer laminated circuit board assembly. Thus, a single lamination technique allows all RF, power and logic vias to be drilled in one operation and makes use of RF via "stub" tuning (in which the RF via "stub" extending beyond the RF transmission line junction is RF tuned to provide a desired impedance match). This tuning approach uses shaped conductors near junctions of RF via-transmission lines. Also, disks (with a surrounding relief) are used in ground plane layers and/or blank layers through which the RF via passes to aid with impedance matching different portions of the circuits provided within the panel (e.g. as described above in conjunction with FIGS. 4-6A). It should be appreciated that the single lamination fabrication technique described herein allows, RF, power and logic signals to propagate on the same layer. Thus, a mixed signal, multilayer RF PWB is provided in a single lamination operation.

In view of the above description, it should now be appreciated that there exists a need to lower acquisition and life cycle costs of phased arrays while at the same time requirements for bandwidth, polarization diversity and reliability become increasingly more challenging. The panel array architecture and fabrication technique described herein offers a cost effective solution for fabrication of phased arrays and in particular for manufacture of phased arrays which operate in the low to medium RF power density range. Such phased arrays can be used in a wide variety for a wide variety of phased array radar missions or communication missions for ground, sea and airborne platforms. In one embodiment, a 128 T/R channel low power density panel array designed at X-Band is 8.4 in×11.5 in (93.66 in$^2$), 0.210 inches thick and weighs 2.16 lbs (which corresponds to a unit weight by volume of 0.11 lbs/in$^3$ which includes the printed wiring board, 2 MMICs per T/R channel, 2 switches per T/R channel, RF and power/logic connectors, bypass capacitors, resistors). In this embodiment, patch antenna elements are provided on layers 524*b* and 528*a* of PWB 522 of an eighteen layer PWB and all the active electronics, connectors, bypass capacitors and resistors are surface mounted to layer 542*b* (i.e. layer eighteen). The illustrative 128 T/R channel low power density panel array designed for operation in the X-Band frequency range is switched dual linear polarization (horizontal/vertical) on transmit and receive and uses "flip-chip" active electronics.

All publications and references cited herein are expressly incorporated herein by reference in their entirety.

In the figures of this application, in some instances, a plurality of elements may be shown as illustrative of a particular element, and a single element may be shown as illustrative of a plurality of a particular elements. Showing a plurality of a particular element is not intended to imply that a system or method implemented in accordance with the invention must comprise more than one of that element or step, nor is it intended by illustrating a single element that the invention is limited to embodiments having only a single one of that respective element. Those skilled in the art will recognize that the numbers of a particular element shown in a drawing can, in at least some instances, be selected to accommodate the particular user needs.

It is intended that the particular combinations of elements and features in the above-detailed embodiments be considered illustrative only; the interchanging and substitution of these teachings with other teachings in this and the incorporated-by-reference patents and applications are also expressly contemplated. As those of ordinary skill in the art will recognize, variations, modifications, and other implementations of what is described herein can occur to those of ordinary skill in the art without departing from the spirit and scope of the concepts as described and claimed herein. Thus, the foregoing description is by way of example only and is not intended to be and should not be construed in any way to be limiting.

Further, in describing the invention and in illustrating embodiments of the concepts in the figures, specific terminology, numbers, dimensions, materials, etc., are used for the sake of clarity. However the concepts are not limited to the specific terms, numbers, dimensions, materials, etc. so selected, and each specific term, number, dimension, material, etc., at least includes all technical and functional equivalents that operate in a similar manner to accomplish a similar purpose. Use of a given word, phrase, number, dimension, material, language terminology, product brand, etc. is intended to include all grammatical, literal, scientific, technical, and functional equivalents. The terminology used herein is for the purpose of description and not limitation.

Figure 10:
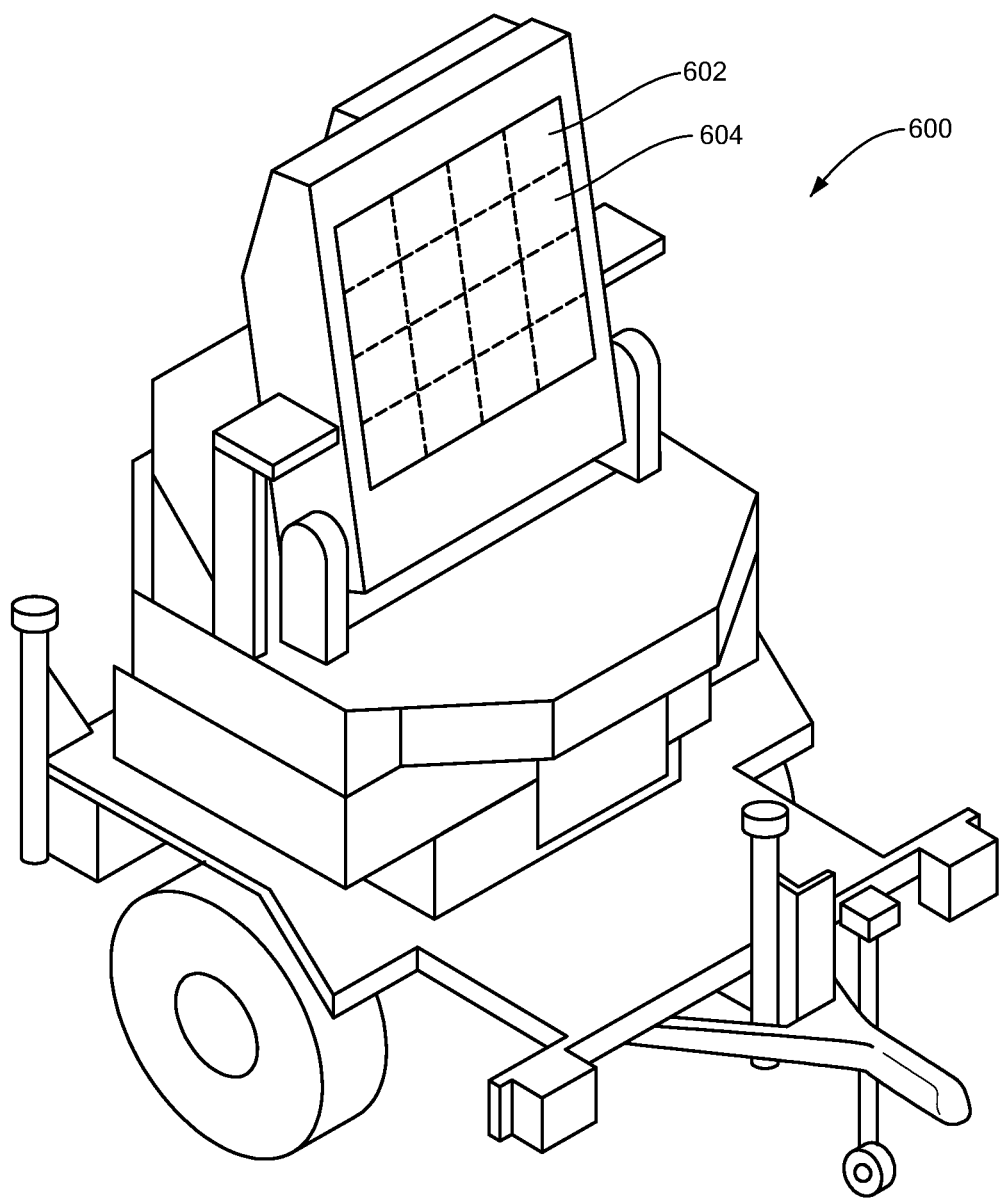
FIG. 10 is a diagram of an active electronically scanned array (AESA) with an array of active electronically scanned array (AESA) cards disposed on a mobile platform.
Figure 10A:
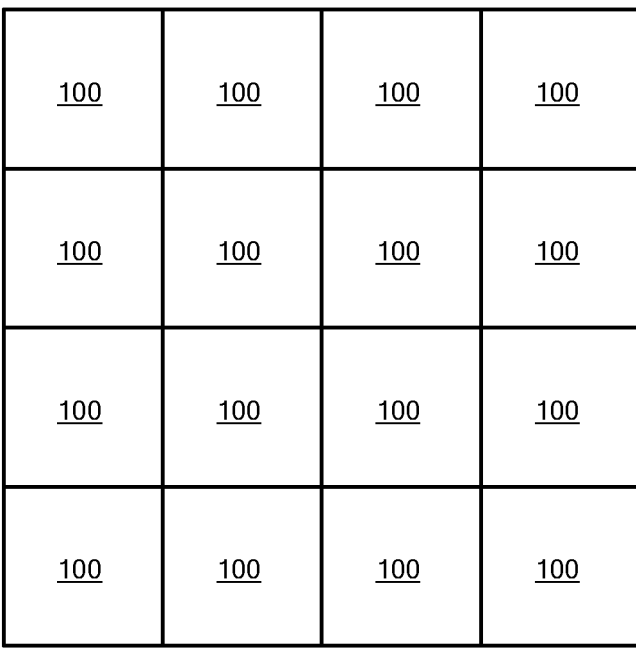
FIG. 10A is a diagram of the array of AESA cards in FIG. 1A.

Referring to FIGS. 10 and 10A, an AESA card may be used in a number of applications. For example, as shown in FIG. 10, an array 602 of AESA cards 604 may be used in a mobile environment such as in a mobile platform unit 600. In this example, the AESA cards 604 are arranged in a 4×4 array. Though FIGS. 10 and 10A depict AESA cards 604 that are in a shape of a rectangle, they may be constructed to be a circle, triangle or any polygon shape. Also, though the array 602 is in a shape of a square the array may be a rectangle, circle, triangle or any polygon arrangement. Further, the number of AESA cards 604 may be one to any number of AESA cards 604.

In other applications, one or more AESA cards 604 may be used on the side of naval vessels, on ground structures and so forth. As will be shown herein an AESA card 604 is a "building block" to building an AESA system.

Figure 11:
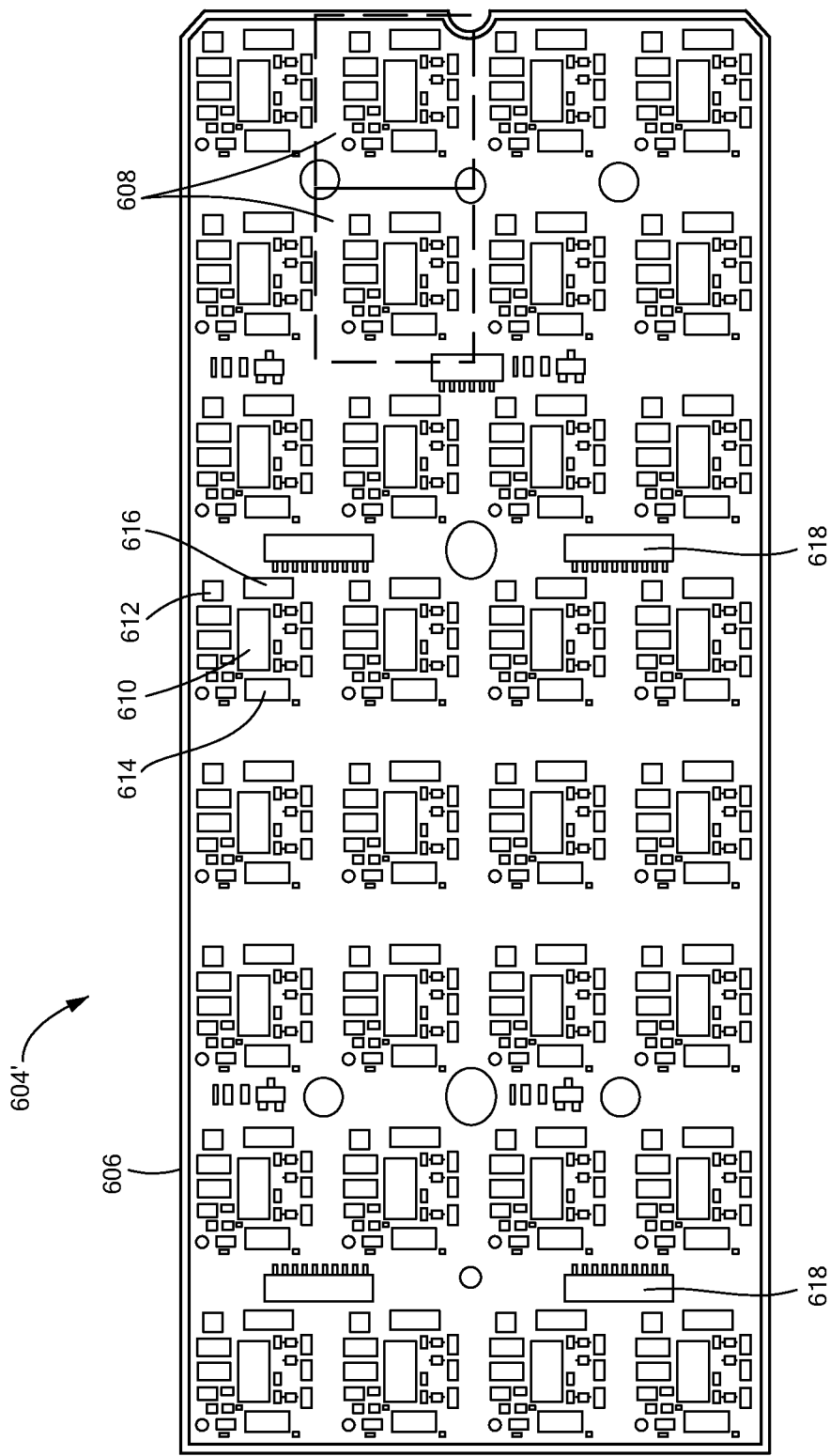
FIG. 11 is a diagram of an example of an AESA card with monolithic microwave integrated circuits (MMICs) disposed on the surface of the AESA card.

Referring to FIG. 11, an example of an AESA card 604 is an AESA card 604' that includes a printed wiring board (PWB) 606 and MMICs 610 (e.g., flip chips) on a surface of the PWB 606 (e.g., a surface 620 shown in FIG. 3). In this example, the AESA card 604' includes a 4×8 array of T/R channel cells 608 or thirty two (32) T/R channel cells 608. Each T/R channel cell 608 includes the MMICs 610, a drain modulator 612 (e.g., a drain modulator integrated circuit (IC)), a limiter and low noise amplifier (LNA) 614 (e.g., a gallium-arsenide (GaAs) LNA with limiter), a power amplifier 616 (e.g., a gallium-nitride (GaN) power amplifier). The AESA card 614' also includes one or more power and logic connectors 618. Though the T/R channel cells 608 are arranged in a rectangular array, the T/R channel cells 608 may be arranged in a circle, triangle or any type of arrangement.

Figure 12:
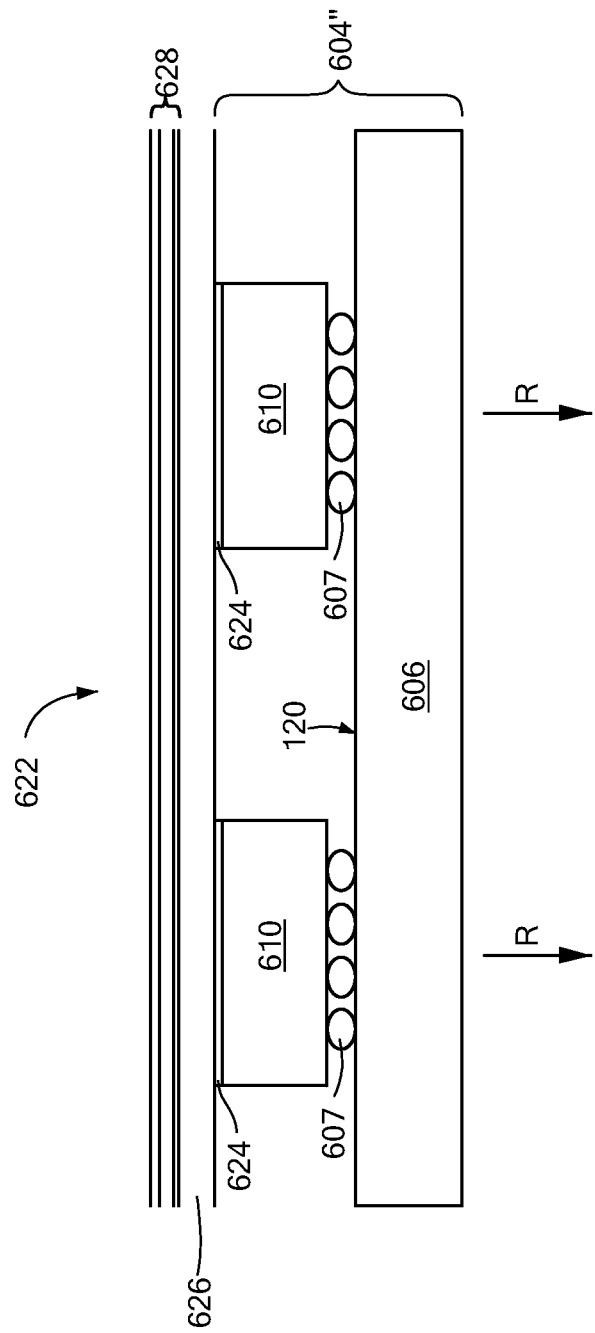
FIG. 12 is a cross-sectional view of an AESA assembly with an AESA card, MMICs and a cooling mechanism.

Referring to FIG. 12, an AESA assembly 622 includes an AESA card (e.g., an AESA card 604") with the PWB 606 and MMICs 610 disposed on the surface 620 of the PWB 606 and coupled thereto by solder balls 607. The AESA assembly 622 also includes a thermal spreader plate 626 coupled to each of the MMICs via thermal epoxy 624 and a cold plate 628. The cold plate 628 includes a channel 630 to receive a fluid such as a gas or a liquid to cool the MMICs 610. Thus, each MMIC 610 is heat sunk in parallel. That is, the thermal resistance from a heat source (e.g., MMICs 610) to the heat sink (cold plate 628) is substantially the same for all MMICs 610 and components (e.g., the drain modulator 612, the LNA 614, the power amplifier 616 and so forth) in each T/R channel cell 608 across the AESA card 604" thereby reducing the thermal gradient between T/R channel cells 608. The AESA card 604" radiates RF signals in the R direction.

Figure 13:
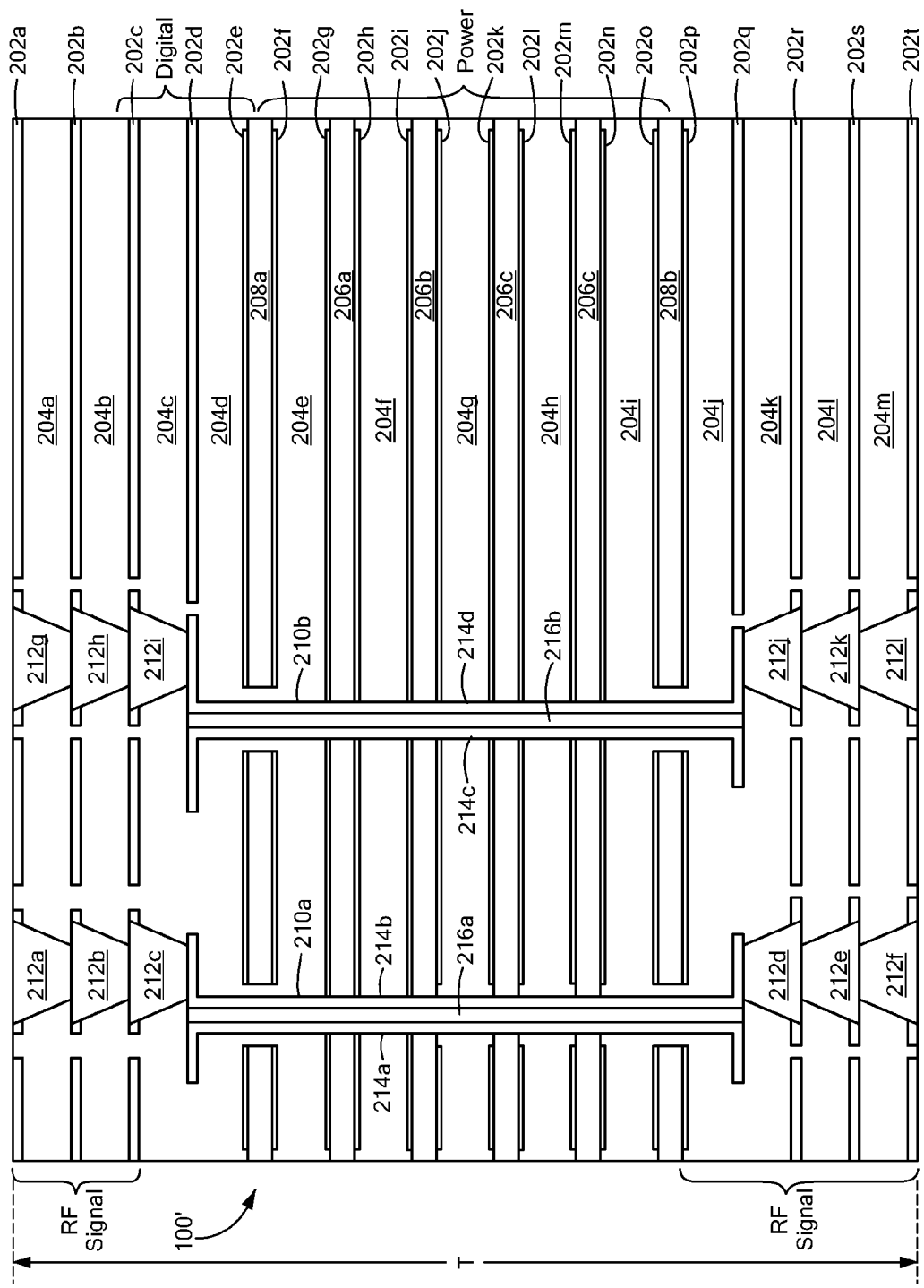
FIG. 13 is a cross-sectional view of a printed wiring board (PWB).

Referring to FIG. 13, an example of a printed wiring board (PWB) 606 is a PWB 606'. In one example, the thickness, t of the PWB 606' is about 64 mils.

The PWB 606' includes metal layers (e.g., metal layers 702a-702t) and one of an epoxy-resin layer (e.g., epoxy-resin layers 704a-704m), a polyimide dielectric layer (e.g., polyimide dielectric layers 706a-706d) or a composite layer (e.g., composite layers 708a, 708b) disposed between each of the metal layers (702a-702t). In particular, the composite layer 708a is disposed between the metal layers 710e, 710f and the composite layer 708b is disposed between the metal layers 710o, 710p. The polyimide dielectric layer 706a is disposed between the metal layers 702g, 702h, the polyimide dielectric layer 706b is disposed between the metal layers 702i, 702j, the polyimide dielectric layer 706c is disposed between the metal layers 702k, 702l and the polyimide dielectric layer 706d is disposed between the metal layers 702m, 702n. The remaining metals layers include an epoxy-resin layer (e.g., one of epoxy-resin layers 704a-704m) disposed between the metal layers as shown in FIG. 13.

The PWB 606' also includes RF vias (e.g., RF vias 710a, 710b) coupling the metal layer 702d to the metal layer 702q. Each of the RF vias 710a, 710b includes a pair of metal plates (e.g., the RF via 710a includes metal plates 714a, 714b and the RF via 710b includes metal plates 714c, 714d). The metal plates 714a, 714b are separated by an epoxy resin 716a and the metal plates 714c, 714d are separated by an epoxy resin 716b. Though not shown in FIG. 13, one of ordinary skill in the art would recognize that other type vias exist for the digital logic layers and the power layers to bring these signals to a surface of the AESA card 604" or to other metal layers.

The PWB 606' also includes electrically conductive conduits (e.g., metal conduits 712a-712l) to electrically couple the RF vias 710a, 710b to the electrically conductive layers 702a, 702t. For example, the conduits 712a-712c are stacked or otherwise disposed one on top of the other with the metal conduit 712a coupling the metal layer 702a to the metal layer 702b, the metal conduit 712b coupling the metal layer 702b to the metal layer 702c and the metal conduit 712c coupling the metal layer 702c to the metal layer 702d and to the RF via 710a. The metal conduits 712a-712l are formed by drilling holes (e.g., about 4 or 5 mils in diameter) into the PWB 606' and filling the holes with a metal or other electrically conductive material.

Further, the metal conduits 712d-712f are stacked one on top of the other with the metal conduit 712d coupling the metal layer 702r and the RF via 710a to the metal layer 702s, the metal conduit 712e coupling the metal layer 702s to the metal layer 702t and the metal conduit 712f coupling the metal layer 702t to the metal layer 702u.

The metal layers 702a-702c and the epoxy-resin layers 704a-704b are used to distribute RF signals. The metal layers 702p-702t, the epoxy-resin layers 704j-704m are also used to distribute RF signals. The metal layers 702c-702e and the epoxy-resin layers 704c-704d are used to distribute digital logic signals. The metal layers 702f-702o, the epoxy-resin layers 704e-704i and the polyimide dielectric layers 706a-706d are used to distribute power.

In one example, one or more of the metal layers 702a-702r includes copper. Each of metal layers 702a-702t may vary in thickness from about 0.53 mils to about 1.35 mils, for example. In one example the RF vias 710a, 710b are made of copper. In one example, the metal conduits 712a-712l are made of copper.

In one example, each of the epoxy-resin layers 704a-704m includes a high-speed/high performance epoxy-resin material compatible with conventional FR-4 processing and has mechanical properties that make it a lead-free assembly compatible to include: a glass transition temperature, Tg, of about 200° C. (Differential scanning calorimetry (DSC)), a coefficient of thermal expansion (CTE)<Tg 16, 16 & 55 ppm/° C. and CTE>Tg 18, 18 & 230 ppm/° C. The low CTE and a high Td (decomposition temperature) of 360° C. are also advantageous in the sequential processing of the stacked metal conduits 712a-712l. Each of the epoxy-resin layers 7024a-204m may vary in thickness from about 5.6 mils to about 13.8 mils, for example. In one particular example, the epoxy-resin material is manufactured by Isola Group SARL under the product name, FR408HR. In one example, the epoxy resin 716a, 716b is the same material used for the epoxy-resin layers 704a-704m.

In one example, each of the polyimide dielectric layers 706a-706d includes a polyimide dielectric designed to function as a power and ground plane in printed circuit boards for power bus decoupling and provides EMI and power plane impedance reduction at high frequencies. In one example, each of the polyimide dielectric layers is about 4 mils. In one particular example, the polyimide dielectric is manufactured by DUPONT® under the product name, HK042536E.

In one example, each of the composite layers 708a, 708b includes a composite of epoxy resin and carbon fibers to provide CTE control and thermal management. In one example, the composite layers may be function as a ground plane and also may function as a mechanical restraining layer. In one example, each of the composite layers is about 1.8 mils. In one particular example, the composite of epoxy resin and carbon fibers is manufactured by STABLCOR® Technology, Inc. under the product name, ST10-EP387.

In one example, the materials described above with respect to fabricating an AESA card are lead-free. Thus, the solution proposed herein meets environmental regulations requiring products that are lead-free.

Described below in conjunction with FIGS. 14-17 is a transmit/receive (T/R) RF circuit card assembly (CCA) comprising one or more T/R daughter card assemblies (or more simply "daughter card assemblies"). A T/R daughter card assembly includes one or more "daughter cards," with each daughter card having one or more circulators provided as an integral part thereof on a first surface and having one or more integrated circuits on a second opposite surface thereof. A daughter card is also sometimes referred to herein as a printed wiring board (PWB) or a printed circuit board (PCB).

Before describing a daughter card having an integral circulator, some introductory concepts are explained. It has been discovered that in some radar applications advantages can be gained by assembling T/R "chipsets" (i.e. a set of integrated circuits (or "chips") which perform transmit/receive functions) or monolithic microwave integrated circuits ("MMIC") within a region of a T/R CCA defined by the dimensions of a unit cell. The concept of a unit cell is described herein above in conjunction with FIG. 9, for example. In the context of an AESA provided from a panel array antenna and with reference to an X-Y Cartesian coordinate system, X and Y dimensions of a unit cell are typically on the order of one-half of a free space wavelength at a selected design and/or operating frequency, respectively. The selection of such unit cell dimensions is based upon a variety of factors including, but not limited to, physical, electrical and operating characteristics (e.g. scan volume requirements) of the radar system. After reading the disclosure herein, one of ordinary skill in the art will know how to select the design and/or operating frequency of a radar system (e.g., it may be the midpoint frequency within a defined operating frequency bandwidth) as well a unit cell dimensions to meet the needs of a particular application.

It has also been discovered that in some radar applications, it is also highly desirable to have a circulator as close as possible to a T/R chipset since this can improve system performance. For example: 1) RF losses between the T/R chipset and circulator are minimized which reduces overall front end loss; low front end loss produces a larger signal and lower front-end noise power generation resulting in greater radar sensitivity; 2) Reduced transmit power output variation due to reduced load pull between the power amplifier and circulator as the radar is scanned. Restrictions in unit cell area, however, may make it extremely difficult to place, dispose or otherwise insert a circulator within a unit cell. Thus, described herein is a CCA having a circulator integrated within a single unit cell.

In one embodiment, the circulator is disposed on one surface of a daughter card (i.e., within the boundaries of a single unit cell) and one or more monolithic microwave integrated circuits (MMICs) are disposed within the boundaries of the same single unit cell, but on a second opposite side of the daughter card. That is, one surface of the daughter card may have circulators disposed thereon within the boundaries of a unit cell and the opposite surface of the circuit card assembly may have one or more MMICs disposed thereon within the boundaries of the same unit cell within which the circulator is disposed. The one or more MMICs and/or circulator may be commercial off the shelf (COTS) components or custom components or a combination of COTS and custom components.

In one embodiment, a T/R daughter card is configured such that a circulator can be surface mounted to a surface of the T/R daughter card via low loss, high isolation RF transmission lines thereby avoiding the need to embed the circulator in the daughter card. Thus, in such an embodiment, it is not necessary to place the circulator in a cavity provided within the daughter card.

Furthermore, by utilizing a surface mount circulator, pick and place machines can be used to pick circulators disposed on tape and reel and place the circulators in desired locations on the surface of the daughter card utilizing conventional manufacturing tools (e.g. a surface mount assembly robot). In one embodiment, solder is applied to a solder mask defined unit cell prior to placement of the circulator.

Finally, since integrated circuits (e.g. MMICs) are disposed on one surface of the daughter card and a circulator is disposed on a second opposite surface of the daughter card, both surfaces of the daughter card may be easily masked and coated with urethane or an equivalent protective and/or environmental coating to protect the daughter card as well as the components mounted thereon from exposure to external environments.

The concepts, circuits and techniques described herein for providing a TR daughter card with an integral circulator address a variety of significant, and in some cases, critical design parameters associated with the design, manufacture and operation of an active electronically scanned array (AESA), including, but not limited to: (1) achieving wide conical scan volume; (2) providing a signal path having a relatively low RF insertion loss characteristic between integrated circuits (e.g. MMIC(s)) disposed on one surface of a PWB and circulator(s) disposed on a second opposite surface of the PWB; (3) reducing transmit output power variation with scan; (4) addressing power handling/thermal management characteristics; (5) supporting wet or dry line replaceable units (LRUs); and/or (6) providing a scalable system (e.g. a scalable AESA system).

With respect to providing an AESA having a wide conical scan volume, soldering or otherwise attaching the circulator to a surface of a daughter card opposite a surface having MMICs mounted thereon results in daughter card having unit cells which can be spaced more closely than in prior art systems. Close spacing of unit cells, in turn, results in close spacing of antenna elements which in turn allows a radar system to achieve up to ±70 degrees conical scan volume.

With respect to RF insertion loss characteristics, the T/R daughter card has a thickness which is less than $0.2\lambda$ thick (where $\lambda$ is the lowest operating free space wavelength). Such a relatively short electrical distance enables the coupling of an output of a power amplifier (PA) to a transmit (TX) port of a circulator using a first, wideband RF transmission line and coupling an input of a low noise amplifier (LNA) to a receive port of the circulator using a second wideband RF transmission line. The first and second transmission lines are provided having insertion loss characteristics of ≤ about 0.2 dB and return loss of greater than about 20 dB over a wide bandwidth.

With respect to reduced transmit output power variation with scan, the electrical distance between the circulator on the T/R daughter card and the PA is relatively small—e.g., a fraction of a wavelength; in one embodiment, the distance is less than $0.2\lambda$. Such a short electrical distance reduces PA load pull as the AESA is scanned to relatively wide angles (e.g. on the order of about ±70 degrees (relative to boresite) in any scan plane.

With respect to power handling/thermal management, a circulator integral on a surface of a T/R daughter card may use up to one-half the surface area of the unit cell. This provides the daughter card having a relatively high power handling capability. Such high power handling components generate significant heat. To remove the heat, the daughter card includes a relatively large thermal conductor which is thermally coupled to the circulators. In one embodiment, the thermal conductor is provided as a ground plane and the circulators are disposed over the ground plane. The thermal conductor leads to thermal vias which in turn may be thermally coupled to heat spreaders. In one example embodiment, a large area electrically and thermally conductive ground plane (e.g., a copper ground plane) on the daughter card spreads the heat through thermal vias disposed through the daughter card. The thermal vias transfer (or "sink") the heat to silicon (or, aluminum-nitride) heat spreaders mounted on a surface of the daughter card which is opposite the surface on which the circulators are mounted (i.e. the silicon heat spreaders are disposed on the MMIC side of the daughter card). Further, such silicon heat spreaders may be thermally coupled to an additional cooling mechanism (e.g. the silicon heat spreaders may additional be thermally coupled (or "heat sunk") to an array cooling manifold).

With respect to wet or dry line replaceable units (LRUs), the T/R daughter card having an integral circulator can be integrated into either a wet or dry LRU while still meeting desired RF and power handling requirements. This is due to the fact that the Silicon heat spreaders can be mounted against a liquid cooled cold plate or an air cooled cold plate; in general, the liquid cooled cold plate will allow higher average power operation.

With respect to antenna element lattice spacing (and hence unit cell spacing), the T/R daughter card having an integral circulator can accommodate any type of lattice spacing and/or shape including, but not limited to a rectangular lattice, a triangular lattice or any other lattice shape (e.g. any regular or irregular geometric pattern).

With respect to scalability, a T/R daughter card having an integral circulator is a common active T/R building-block that enables a wide range of AESA antenna aperture sizes to be assembled or otherwise provided.

Figure 14:
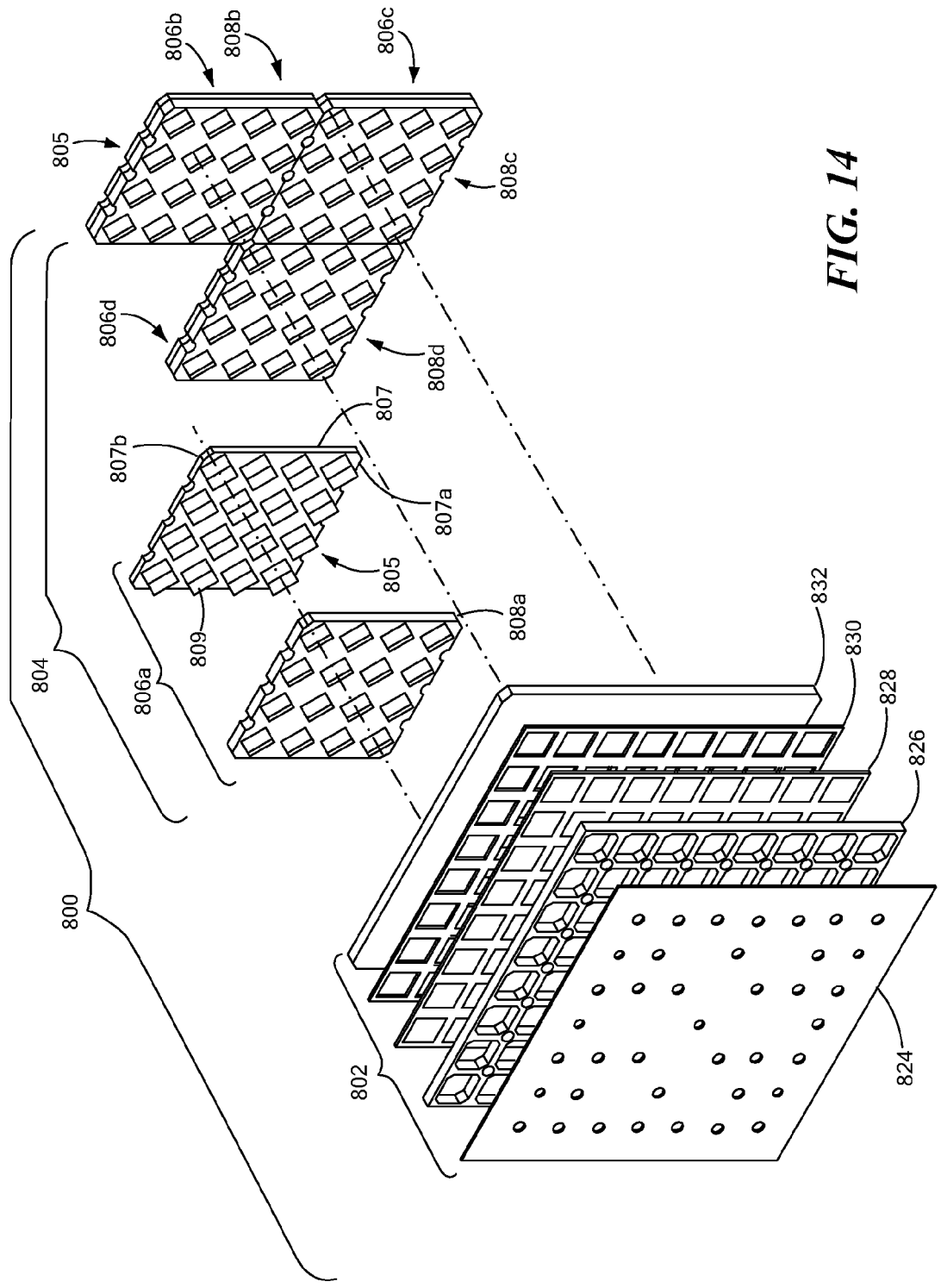
FIG. 14 is a partially exploded isometric view of a portion of an active electronically scanned array (AESA).

Turning now to FIG. 14, a radio frequency (RF) circuit card assembly (CCA) 800 includes an eggcrate/feed beamformer assembly 802 which is physically and electrically coupled to a transmit/receive (T/R) assembly 804.

Eggcrate/feed beamformer assembly 802 includes a first radiator substrate 824 also sometimes referred to herein as an "outer radiator PWB" (or "an outer patch PWB" in those embodiments in which the radiating element is provided as a patch antenna element). Assembly 802 further includes a first or outer "egg crate" substrate 826, a second or inner radiator substrate 828 and a second or inner egg crate substrate 830. Radiator substrate 824 includes a first plurality (or array) of radiating antenna elements (not visible in FIG. 14). The substrate 824 is disposed over the first so-called "egg-crate" substrate 826 with each of the radiating elements arranged such that they align with openings in the egg crate substrate 826. The walls of egg crate substrate 826 define in-part the boundaries of a unit cell. Thus, assembly 802 is provided have 64 unit cells.

The first or "outer" egg crate substrate 826 is disposed over a first surface of the second or inner radiator substrate 828. Radiator substrate 828 has a second plurality of radiating antenna elements disposed thereon (the second plurality of radiating elements are not visible in FIG. 14). The second substrate 828 is disposed over the second "egg-crate" substrate 830. The first and second egg crate substrates 826, 830 are aligned such that the openings in the second egg crate substrate 830 align with the openings in the first egg crate substrate 826. The set of antenna elements on the second substrate 828 are arranged to align with openings in the second egg crate substrate 830. Thus, the eggcrate substrates 826, 830 define boundaries of a plurality of unit cells and each unit cell includes a pair of antenna elements (one each on first and second radiator substrates 824, 826). In the case where the radiators are provided as patch antenna elements, such an arrangement is referred to as a "stacked patch" arrangement. Substrate 830 is disposed over a feed beamformer substrate 832 which couples RF energy between egg crate/feed beamformer assembly 802 and T/R assembly 804.

In this illustrative embodiment, T/R assembly 804 is provided from a plurality of, here four, daughter card assemblies 806a-806d and an eggcrate interposer assembly 808. In the illustrative embodiment of FIG. 14, T/R assembly 804 is provided from one or more daughter card assemblies and an eggcrate interposer. In the illustrative embodiment of FIG. 14, T/R assembly 804 is provided from a plurality of, here four (4) daughter card assemblies 806a-806d, (with only daughter card 806a being clearly visible in FIG. 14) and a plurality of, here four, eggcrate interposer sections 808a-808d (with only eggcrate interposer section 808a being clearly visible in FIG. 14). It should be note that the eggcrate interposer may be provided as a unitary structure or as a plurality of separate structures (as shown in the example of FIG. 14) configured to be disposed over the circulator surface of the daughter card assembly. At least some of the daughter card assemblies 806a-806d are provided having one or more circulators 809 disposed on a surface thereof. In some embodiments, each unit cell in the daughter card assemblies includes a circulator.

Taking daughter card assembly 806a as representative of daughter card assemblies 806b-806d, daughter card assembly 806a is provided from a daughter card 807 having first and second opposing surfaces 807a, 807b. A first one of the surfaces has one or more surface mount circulators 809 disposed thereon. Thus, surface 807a of daughter card 807 is sometimes referred to herein as a "circulator surface." In the illustrative embodiment of FIG. 14, sixteen (16) circulators are disposed on the circulator surface 807a.

A second opposite one of the daughter card surfaces (here surface 807b) has monolithic microwave integrated circuits (MMICs) disposed thereon (not visible in FIG. 14). Thus, daughter card surface 807b is sometimes referred to herein as a "MMIC surface." As will become apparent from the description herein below, MMIC surface 807b also has DC and logic connectors disposed thereon.

The daughter card 807 comprises a multilayer PWB which includes RF feed circuits which couple RF signals between the antenna elements of the eggcrate/beamformer assembly 802 and RF transmitter and receiver circuitry (e.g. the T/R chip sets) included in the T/R assembly 804. The beamformer assembly 802 is disposed over the T/R assembly 804 and may be mechanically coupled thereto using any of the techniques described herein above (e.g. via bonding and/or bonding and/or the inclusion of threaded bosses and screws or other necessary mechanical features within assemblies 802, 804).

In this particular example, daughter card assembly 806a includes sixteen (16) unit cells each of which are associated with an antenna element and which are uniformly distributed in a predetermined pattern (here a square lattice pattern) among four rows and four columns on the daughter board 807. In the illustrative design of FIG. 14, each daughter card assembly feeds a four by four (4×4) portion of an array of antenna elements disposed on radiator boards 824, 828. Thus, since there are eight (8) rows and (8) columns of antenna elements in the eggcrate/beamformer assembly 802 and each daughter card assembly feeds four rows, then four (4) daughter card assemblies 806a-806d are required to feed the entire assembly 802.

Figure 15A:
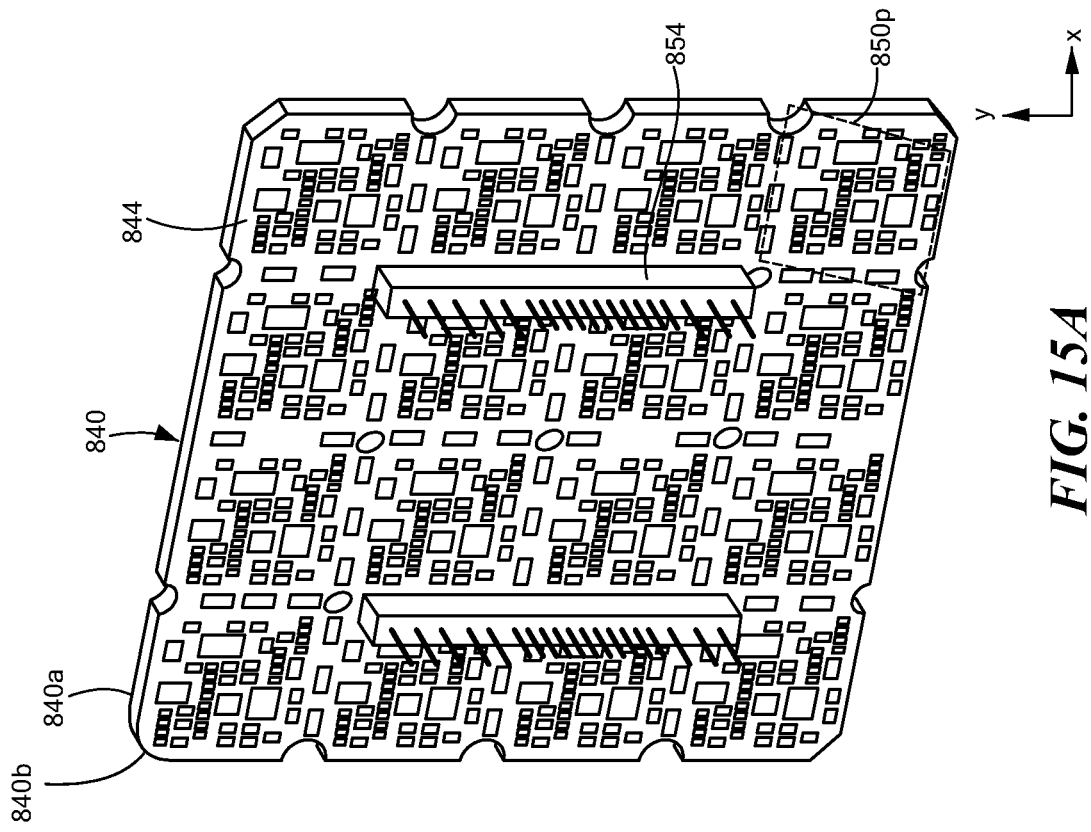
FIG. 15A is a bottom view of a daughter card assembly.
Figure 15:
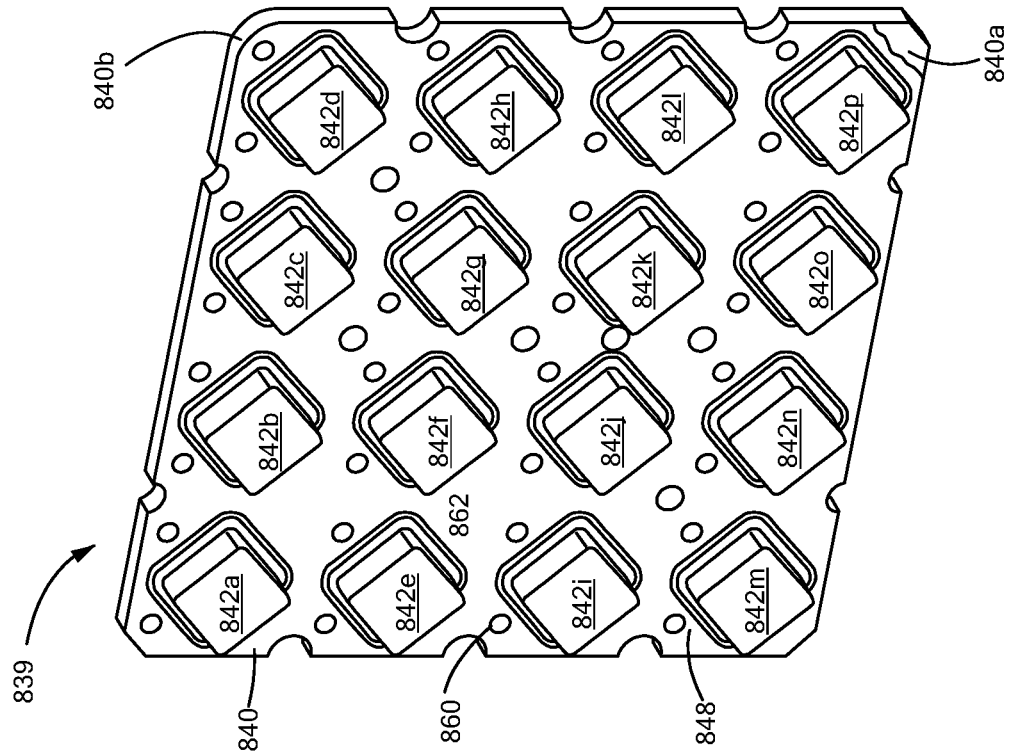
FIG. 15 is a top view of a daughter card assembly.
Figure 15B:
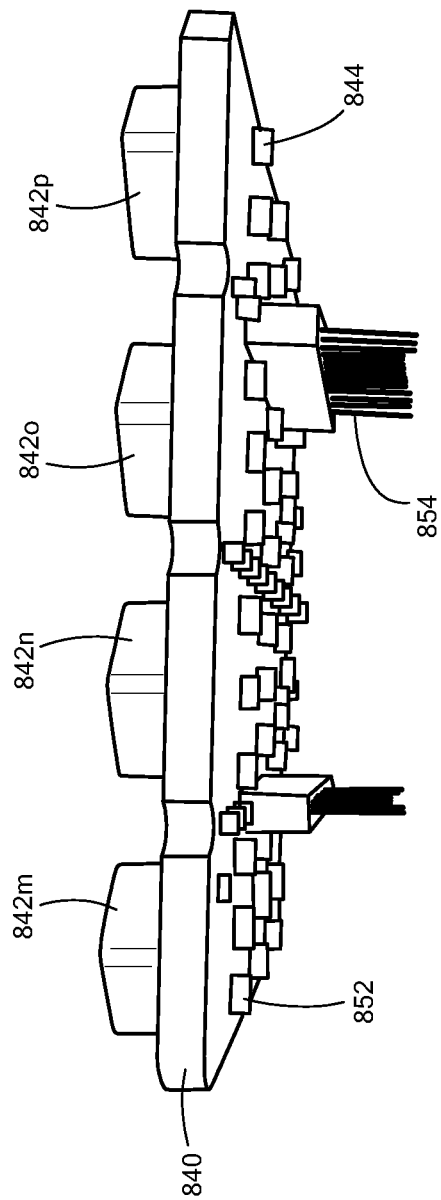
FIG. 15B is a side view of a daughter card assembly.

Referring now to FIGS. 15-15B, in which like elements are provided having like reference designations throughout the several views, a T/R daughter card assembly 839 which may be the same as or similar to daughter card assemblies 806a-806d described above in conjunction with FIG. 14, is provided from a daughter card 840 having first and second opposing surfaces 840a, 840b. Daughter card 840 is a multilayer PWB which comprises circuitry and signal paths for RF, DC and logic circuits. Daughter card 840 is thus sometimes referred to as a mixed signal PWB.

A plurality of circulators, here surface mount circulators 842a-842p generally denoted 842, are disposed over the first surface 840a and thus the first surface 840a of daughter card 840 is sometime referred to herein as a circulator surface 840a. As may be most clearly seen in FIG. 15, daughter card 839 is provided having a thermal and electrical conductor (e.g. a copper ground plane) 848 disposed over daughter card surface 840a and circulators 842a-842p are disposed over the conductor. The conductor 848 serves as an electrical ground plane and also transfers heat from circulators 842a-842p through thermal via holes to silicon heat spreaders 852 (FIG. 15B) disposed on daughter card surface 840b.

Similarly, a plurality of RF integrated circuits (e.g. monolithic microwave integrated circuits or "MMICs") generally denoted 844 (FIG. 15A) are disposed over the second surface 840b and thus the second surface 840b of daughter card 840 is sometime referred to herein as an IC surface 840b (or sometimes as "MMIC surface 840b").

In this illustrative embodiment, daughter card 840 has a plurality of unit cells, here sixteen unit cells 850a-850p, formed therein. Unit cells 850a-850p may be formed, for example, using conductive vias which extend from surface 840a through the circuit board to surface 840b. Such vias may be provided in a manner described hereinabove in conjunction with FIG. 13, for example. The conductive vias help define the boundaries of the unit cells and provide the unit cells having an RF isolation characteristic such that RF signals provided to one unit cell are isolated from other unit cells.

Daughter card 840 comprises "N" transmit/receive unit cells with at least one unit cell having a circulator integrated on a surface thereof. In some embodiments, each unit cell has a surface mount circulator 842 integrated therewith. In the illustrative embodiment of FIGS. 15-15B, each unit cell is provided having an RF beamformer port 860 and an RF antenna port 862 through which the unit cells on the daughter board are coupled to an antenna and a beamformer such as the antenna and beamformer described above in conjunction with FIG. 14. The beamformer port and antenna port are electrically connected to the eggcrate/beamformer assembly through the RF interposer (808a in FIG. 14).

The inclusion of surface mount circulators 842 within unit cells of the T/R daughter card 840 provides the daughter card 840 having one or more integral circulators. Thus, T/R daughter card assembly 839 is provided as a highly integrated, double-sided printed circuit board assembly having surface mount circulators disposed on one surface thereof and integrated circuits disposed on a second opposite surface thereof.

The example T/R daughter card assembly 839 includes sixteen (16) T/R unit cells each of which includes an integrated circulator. As noted above, in other applications, fewer than all T/R unit cells may include an integrated circulator.

Disposed on daughter card surface 840b are DC/logic connectors 854 a plurality of integrated circuits (e.g. MMICs) 844, a plurality of heat spreaders 852. In the illustrative embodiment, integrated circuits 844 are shown as flip-chip mounted MMICs.

Although a square lattice pattern is illustrated in the example embodiments of FIGS. 14 and 15, a printed wiring board (PWB) based unit cell design as described herein can be re-configured to different lattice patterns.

The circulators may be provided as commercial-off-the-shelf (COTS) circulators or custom circulators. The choice of using COTS or custom circulators enables design trade-offs. Trade-offs may be made, for example, between isolation levels between a PA and an LNA vs. operating bandwidth; or between low voltage standing wave ratio (VSWR) and low insertion loss vs. operating bandwidth. Trade-offs may also be made between area/volume of a circulator package vs. circulator power handling capability (e.g. the larger the circulator package, the larger the power handling capability, but the more area/volume occupied by the circulator.)

As noted above, integration of a circulator on one surface of a daughter card and integrated circuits on a second, opposite surface of the daughter card results in a highly integrated daughter card which combines RF, power and logic signal distribution.

Figure 17:
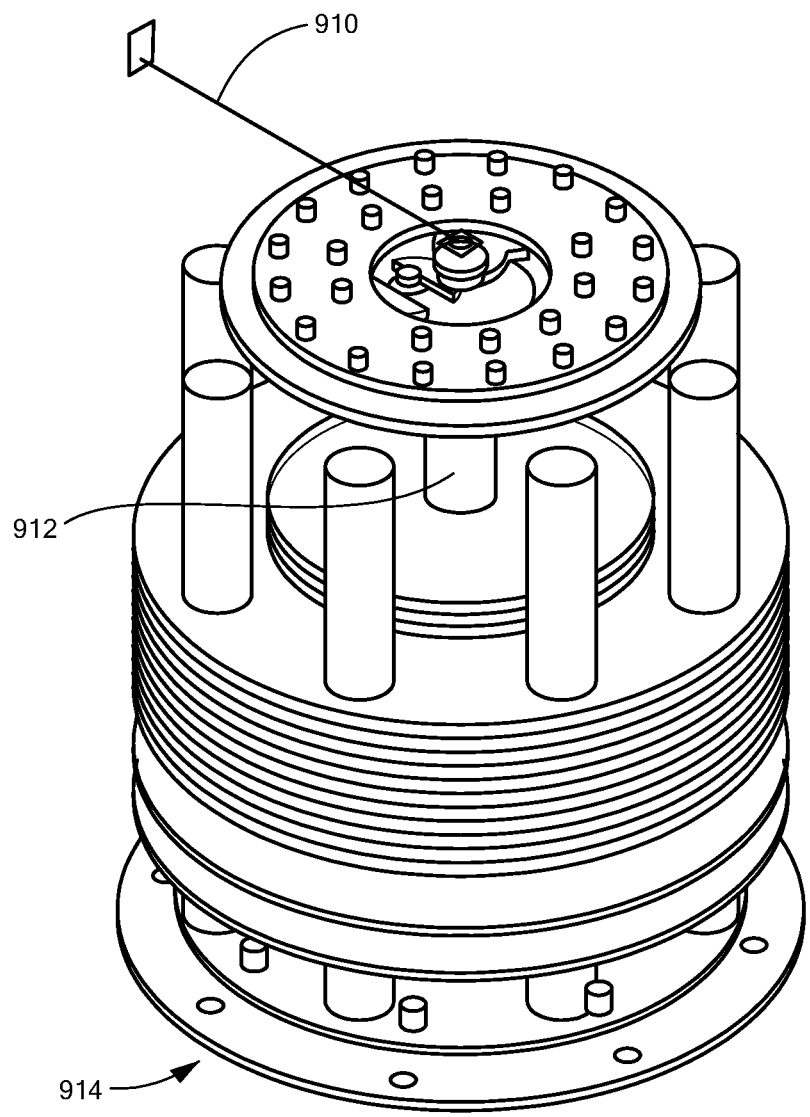
FIG. 17 is a view of a portion of an daughter card assembly illustrating an RF signal path between a MMIC and a circulator.

In one embodiment, an RF pseudo-coaxial line (see FIG. 17) couples (and in some cases directly connects) a PA output with a transmitter port of a circulator and an LNA input port with a receiver port of circulator (see FIG. 17). This reduces RF losses and helps provide high isolation (e.g. >90 dB) between transmit and receive RF pseudo-coaxial line ports connecting to the transmitter port of the circulator and from the receiver port of the circulator, respectively.

As can be seen in FIGS. 15-15B, the daughter card is provided as a double sided assembly. This enables a unit cell area (or "footprint") having x and y dimensions where $x \leq \lambda/2$ and $y \leq \lambda/2$. Having such a unit cell footprint enables a large array conical scan volume and also results in up to 50% of the unit cell surface area on one surface of the daughter card being available for circulator placement. This, in turn, enables the use of a wide range of COTS or custom circulators that meet specific RF requirements (e.g., bandwidth, isolation, power handling, etc.) for a particular application.

Furthermore, the daughter card is electrically thin. In particular, electrical distance between PA output port and circulator port may be less than $0.2\lambda$. This reduces, and in some cases ideally minimizes, power amplifier RF load pull as array is scanned.

Moreover, the daughter card is provided having high power density RF performance. Inclusion of the thermal and electrical conductor (e.g. a copper ground plane) beneath the circulators immediately spreads heat generated by the circulators. Also, thermal vias embedded in the daughter card transport heat from the thermal and electrical conductor through the daughter card (i.e. from the circulator surface of the daughter card to the MMIC surface of the daughter card) to silicon heat spreaders which, in turn, may be thermally coupled (heat sunk) to an array cooling manifold or other cooling mechanism. This approach allows circulator junction temperatures to be maintained at a desired level (e.g. below 125° C. at 50° C. ambient temperatures for some applications).

Figure 16:
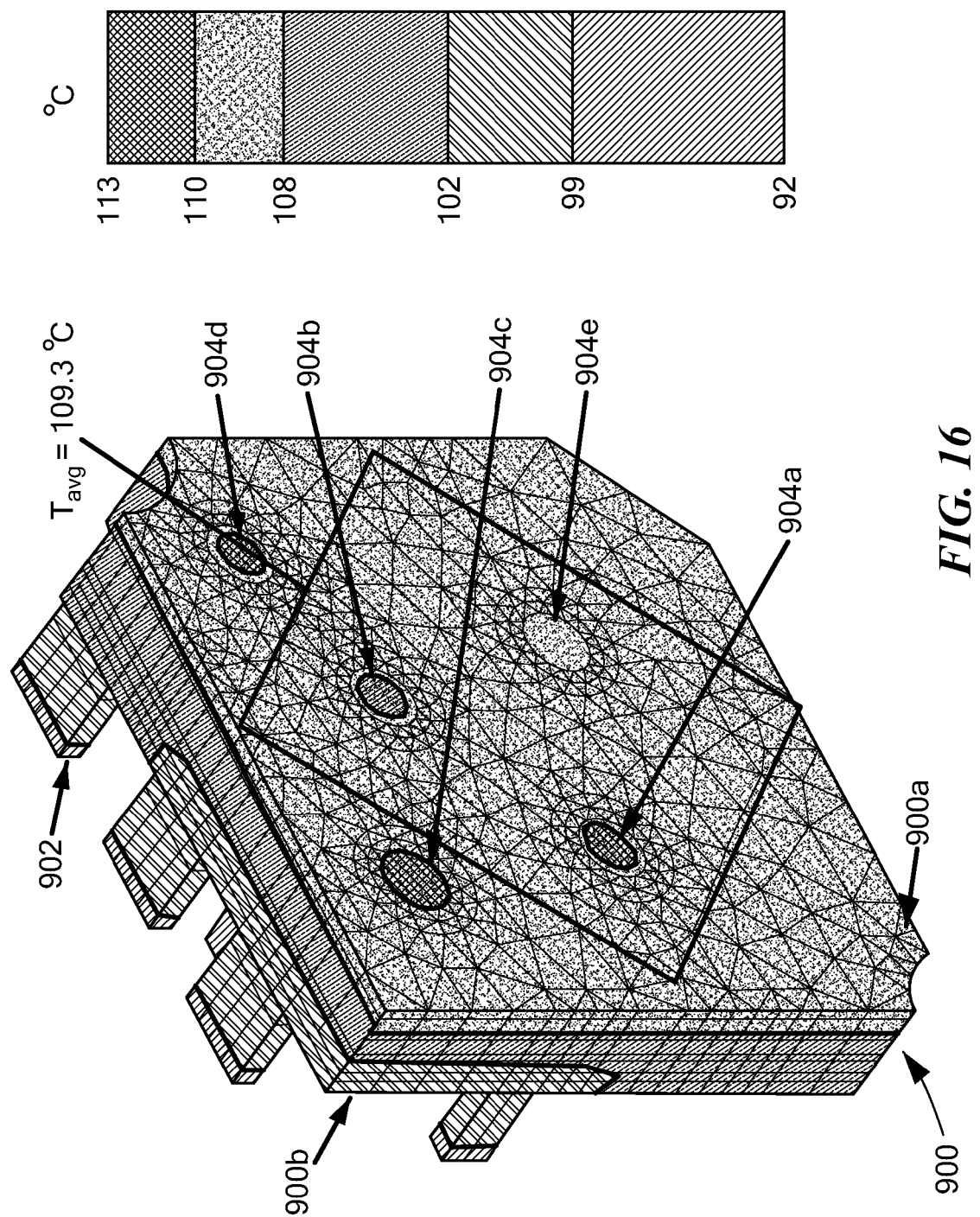
FIG. 16 is a thermal plot of an AESA card, circulators, MMICs and a cooling mechanism.

Referring now to FIG. 16 shown are the results of a thermal model of a daughter card 900 having an integral circulator and integrated circuits (e.g. MMICs) disposed on opposing surfaces thereof. It should be noted that to promote clarity in the drawing, the monolithic microwave circuits (MMIC) and circulators are not explicitly shown in FIG. 17. Daughter card 900 is shown having heat spreaders 902 disposed on daughter card surface 900b opposite circulator surface 902a. Also illustrated in FIG. 16 are locations of transmit and receive ports 904a, 904b, beamformer port 904c and a pair of antenna ports 904c, 904d.

The thermal analysis in FIG. 16 shows that under the worst case ambient conditions of 50° C. and a 10% transmit duty cycle, the circulator mounting surface maximum temperature is 109.3° C.; this temperature is well below the maximum surface mounting temperature of 150° C. which is typical for most COTS circulators. For this case of a dry LRU using heat pipes (not shown in FIG. 16), the LRU cold plate temperature is 92° C. when the ambient is 50° C.

Referring now to FIG. 17 a detailed HFSS model includes: (1) a MMIC RF transition 910; (2) a pseudo-coaxial transition 912 through a daughter card PWB; and (3) a circulator port RF transition 914. The RF pseudo-coaxial line may couple (and in some cases may directly connect) a PA output with a transmitter port of a circulator and an LNA input port with a receiver port of circulator. This reduces RF losses and helps provide high isolation (>90 dB) between transmit and receive ports of the circulator. The pseudo-coaxial line provides the lowest loss and highest isolation since, (1) it a direct interconnect between mmic and circulator (thus eliminating a stripline or microstrip transmission line section), (2) the outer ring of vias forming the outer conductor of the pseudo-coaxial line provides high isolation.

Having described the preferred embodiments of the concepts sought to be protected, it will now become apparent to one of ordinary skill in the art that other embodiments incorporating the concepts may be used. Moreover, those of ordinary skill in the art will appreciate that the embodiments of the invention described herein can be modified to accommodate and/or comply with changes and improvements in the applicable technology and standards referred to herein. For example, the technology can be implemented in many other, different, forms, and in many different environments, and the technology disclosed herein can be used in combination with other technologies. The circuits and techniques described herein are not limited to the specific embodiments described. Elements of different embodiments described herein may be combined to form other embodiments not specifically set forth above. Variations, modifications, and other implementations of what is described herein can occur to those of ordinary skill in the art without departing from the spirit and the scope of the concepts as described and claimed. It is felt, therefore, that the scope of protection should not be limited to or by the disclosed embodiments, but rather, should be limited only by the spirit and scope of the appended claims.

What is claimed is:

1. A transmit receive (T/R) daughter card assembly comprising:
   a printed circuit board (PCB) having first and second opposing surfaces and having a plurality unit cells with each unit cell having one or more electrical contacts on the first surface of said PCB and each unit cell having one or more electrical contacts on the second opposing surface of said PCB;
   a plurality of radio frequency (RF) circulators disposed on a first one of the first and second surfaces of said PCB, each of said circulators disposed within the boundaries of a respective one of said plurality of unit cells, and each of said circulators electrically coupled to at least some of the one or more electrical contacts within the respective unit cell;
   a thermally and electrically conductive layer disposed on the first one of the first and second surfaces of said PCB, said circulator thermally and electrically conductive layer in thermal and electrical contact with said plurality of circulators;
   one or more RF integrated circuits disposed on a second, opposite one of the first and second surfaces of said PCB, each of said RF integrated circuits disposed within the boundaries of a respective one of said plurality of unit cells and each of said RF integrated circuits electrically coupled to at least some of the one or more electrical contacts on the second surface of said PCB within the unit cell in which the one or more RF integrated circuit is disposed;
   one or more thermal vias disposed through said PCB to provide thermal paths from the said thermally and electrically conductive layer disposed on the first one of the first and second surfaces of said PCB to the second opposing surface of said PCB; and
   one or more heat spreaders disposed on the second one of the first and second surfaces of said PCB which is opposite the surface on which the circulators are mounted, said one or more heat spreaders thermally coupled to said thermally and electrically conductive layer disposed on the first one of the first and second surfaces of said PCB through at least one of the one or more thermal vias.

2. The T/R daughter card assembly of claim 1 wherein:
   each unit cell is provided having an RF circulator disposed within the boundaries thereof; and
   each unit cell is provided having an RF integrated circuit disposed within the boundaries thereof.

3. The T/R daughter card assembly of claim 2 wherein:
   each RF circulator corresponds to a surface mount component disposed within the boundaries of the unit cell; and
   each RF integrated circuit is provided as a monolithic microwave integrated circuit (MMIC) disposed within the boundaries of the unit cell.

4. The T/R daughter card assembly of claim 3 wherein each of said RF circulators is provided having a high power handling capability and covers up to one-half of the surface area of the unit cell on the first surface of said PCB.

5. The T/R daughter card assembly of claim 1 wherein each of said plurality of unit cells are electrically isolated from each other at RF wavelengths.

6. The T/R daughter card assembly of claim 5 wherein said thermally and electrically conductive layer is provided as a conductive ground plane disposed on the first surface of said PCB and wherein said conductive ground plane spreads the dissipated heat and said thermal vias disposed through said PCB transfer heat from said RF circulators to said heat spreaders mounted on the surface of the daughter card which is opposite the surface on which the circulators are mounted.

7. The T/R daughter card assembly of claim 6 further comprising one or more additional cooling mechanisms thermally coupled to said heat spreaders.

8. The T/R daughter card assembly of claim 6 wherein:
   said heat spreaders are provided as Silicon (Si) heat spreaders; and
   said one or more additional cooling mechanisms includes an array cooling manifold.

9. The T/R daughter card assembly of claim 6 wherein at least some of the one or more electrical contacts on the first surface of said PCB are provided as radio frequency (RF) signal ports.

10. The T/R daughter card assembly of claim 9 further comprising conductive via holes in each of the unit cells in said PCB, each of the conductive via holes provided to complete electrical interconnections between at least one of: RF; DC power; and/or logic circuits provided as part of the T/R daughter card.

11. The T/R daughter card assembly of claim 10 wherein said MMICs are flip-chip mounted and directly bonded to the second surface of said PCB.

12. The T/R daughter card assembly of claim 11 wherein said SiC heat spreaders are thermally coupled to said MMIC flip-chip circuits.

13. The T/R daughter card assembly of claim 11 comprising a heat sink thermally coupled to said the MMICs.

14. The T/R daughter card assembly of claim 13 wherein said heat sink is provided as a liquid cooled brazement thermally coupled to said MMICs.

15. A modular, scalable radio frequency (RF) circuit card array (CCA) assembly comprising:
(A) an eggcrate/feed beamformer assembly first and second opposing surfaces with a first surface corresponding to a radiator surface and the second surface corresponding to a feed beamformer surface, said eggcrate/feed beamformer assembly comprising:
  (1) an outer patch printed wring board (PWB), having a first radiating surface and a second opposing surface and comprising a plurality of antenna elements configured to radiate RF energy from the radiating surface of said outer patch PWB;
  (2) an outer PWB eggcrate having a first surface disposed over the second surface of said outer patch PWB and having a second opposing surface, wherein walls of said outer PWB eggcrate define a plurality of unit cells within at least some of the outer patch PWB antenna elements are disposed;
  (3) an inner patch PWB having a first surface disposed over the second surface of said outer PWB eggcrate and having a second opposing surface and comprising a plurality of antenna elements configured to radiate RF energy from the radiating surface of said outer patch PWB with at least some of the inner patch PWB antenna elements disposed within ones of the plurality of unit cells;
  (4) an inner PWB eggcrate having a first surface disposed over the second surface of said inner patch PWB and having a second opposing surface wherein walls of said inner PWB eggcrate are substantially aligned with wall of said outer PWB eggcrate to further define unit cell regions; and
  (5) a feed beamformer PWB circuit having a first surface disposed over the second surface of said inner PWB eggcrate and having a second opposing surface; and
(B) a T/R assembly having a first surface disposed over the second surface of said feed beamformer PWB circuit and having a second opposing surface, said daughter card assembly comprising:
  (1) an eggcrate interposer having a first surface corresponding to the first surface of said T/R daughter card assembly and a second opposing surface; and
  (2) one or more T/R daughter card assemblies, each of the one or more daughter card assemblies having first and second opposing surfaces with the first surface corresponding to a circulator surface and the second surface corresponding to a MMIC surface and wherein the circulator surface of said one or more daughter card assemblies is disposed over the second surface of said eggcrate interposer and each of said daughter card assemblies having one or more unit cells with the total number of unit cells from said one or more daughter card assemblies corresponding to the number of unit cells defined by the walls of said outer PWB eggcrate, and wherein each of said one or more daughter card assemblies comprising:
    (a) a multi-layer printed circuit board (PCB) having first and second opposing surface and having a plurality unit cells with each unit cell having one or more electrical contacts on the first surface of said PCB and having one or more electrical contacts on the second opposing surface of said PCB;
    (b) a plurality of circulators disposed on a first one of the first and second surfaces of said PCB, said of circulators disposed within the boundaries of a respective one of said plurality unit cells, and each of said of circulators electrically coupled to at least some of the one or more electrical contacts within the respective unit cell;
    (c) a thermally and electrically conductive layer disposed on the first one of the first and second surfaces of said PCB, said circulator thermally and electrically conductive layer in thermal and electrical contact with said circulator;
    (d) one or more monolithic microwave integrated circuits (MMICs) disposed on a second, opposite one of the first and second surfaces of said PCB, said MMICs electrically coupled to at least some of the one or more electrical contacts on the second surface of said PCB;
    (e) one or more thermal vias disposed through the PCB to provide thermal paths from the thermally and electrically conductive layer disposed on the first one of the first and second surfaces of said PCB to the second opposing surface of the PCB;
    (f) one or more heat spreaders disposed on a second one of the first and second surfaces of said PCB which is opposite the surface on which the circulators are mounted, said one or more heat spreaders thermally coupled to said thermally and electrically conductive layer disposed on the first one of the first and second surfaces of said PCB.

16. The modular, scalable RF CCA assembly of claim 15 wherein:
each unit cell is provided having an RF circulator disposed within the boundaries thereof; and
each unit cell is provided having an RF integrated circuit disposed within the boundaries thereof.

17. The modular, scalable RF CCA assembly of claim 16 wherein:
each RF circulator corresponds to a surface mount component disposed within the boundaries of the unit cell; and
each RF integrated circuit is provided as a monolithic microwave integrated circuit (MMIC) disposed within the boundaries of the unit cell.

18. A modular, scalable radio frequency (RF) circuit card array (CCA) assembly comprising:
an eggcrate/feed beamformer assembly first and second opposing surfaces with a first surface corresponding to a radiator surface and the second surface corresponding to a feed beamformer surface, said eggcrate/feed beamformer assembly comprising:
an outer patch printed wring board (PWB), having a first radiating surface and a second opposing surface and comprising a plurality of antenna elements configured to radiate RF energy from the radiating surface of said outer patch PWB;
an outer PWB eggcrate having a first surface disposed over the second surface of said outer patch PWB and having a second opposing surface;
an inner patch PWB having a first surface disposed over the second surface of said outer PWB eggcrate and having a second opposing surface and comprising a plurality of antenna elements configured to radiate RF energy from the radiating surface of said outer patch PWB;
an inner PWB eggcrate having a first surface disposed over the second surface of said inner patch PWB and having a second opposing surface; and a feed beamformer PWB circuit having a first surface disposed over the second surface of said inner PWB eggcrate and having a second opposing surface; and a T/R assembly having a first surface disposed over the second surface of said feed beamformer PWB circuit and having a second opposing surface, said daughter card assembly comprising:

an eggcrate interposer having a first surface corresponding to the first surface of said T/R assembly and a second opposing surface; and one or more daughter card assemblies, each of the one or more T/R daughter cards having a first surface with surface mounted circulators disposed thereon and a second, opposing surface with a plurality of RF integrated circuits disposed therein wherein the circulator surface of said one or more T/R daughter cards is disposed over the second surface of said eggcrate interposer and wherein each of said surface mount circulators are disposed within the boundary of a respective one of said plurality of unit cells of the modular, scalable RF CCA assembly and the plurality of RF integrated circuits are disposed within the boundary of a respective one of said plurality of unit cells of the modular, scalable RF CCA assembly on a surface of the T/R daughter card which is opposite the surface on which the plurality of circulators is disposed.

19. The modular, scalable RF CCA assembly of claim 18 wherein at least some of said one or more daughter card assemblies comprise:

a multilayer laminated circuit board assembly having first and second opposing surfaces, said multilayer laminated circuit board assembly comprising at least one layer having an RF feed circuit disposed thereon, at least one layer having logic circuits disposed thereon and at least one layer having a DC circuit disposed thereon and wherein the first surface of said multilayer laminated circuit board assembly corresponds to a top-most layer of said multilayer laminated circuit board assembly and the second surface of said multilayer laminated circuit board assembly corresponds to a bottom-most layer of said multilayer laminated circuit board assembly and wherein said multilayer laminated circuit board assembly further includes a plurality of plated through holes extending from the top-most layer to the bottom-most layer of said multilayer laminated circuit board assembly with the plurality of plated through holes forming a plurality of unit cells; and a plurality of circulators disposed on the top-most layer of said multilayer laminated circuit board assembly with each of said plurality of circulators disposed within the boundaries of a respective one of said plurality of unit cells; and a plurality of integrated circuits disposed on the bottom-most layer of said multilayer laminated circuit board assembly with each of said plurality of integrated circuits disposed within the boundaries of a respective one of said plurality of unit cells such that one surface of the multilayer laminated circuit board assembly has a plurality of circulators disposed thereon and the opposite surface of the multilayer laminated circuit board assembly has one or more integrated circuits disposed thereon and each of said circulators and integrated circuits are disposed within the boundaries of respective ones of unit cells provided in the multilayer laminated circuit board assembly.

20. The modular, scalable RF CCA assembly of claim 18 wherein each of said daughter card assemblies comprises a first plurality of waveguide cages, each of said first plurality of waveguide cages disposed about a perimeter of said first plurality of circulators wherein each of said first plurality of waveguide cages formed from plated-through holes extending from a first outermost layer of the daughter card assembly to a second outermost layer of the daughter card assembly.

\* \* \* \* \*